United States Patent
Carroll

(10) Patent No.: US 9,728,725 B2
(45) Date of Patent: Aug. 8, 2017

(54) LIGHT EMMITING DEVICE COMPRISING CONJUGATED TERPOLYMER/TEROLIGOMER CAPABLE OF WHITE LIGHT EMITTION

(75) Inventor: David L Carroll, Winston Salem, NC (US)

(73) Assignee: Wake Forest University, Winston-Salem, NC (US)

( * ) Notice: Subject to any disclaimer, the term of this patent is extended or adjusted under 35 U.S.C. 154(b) by 920 days.

(21) Appl. No.: 13/809,874

(22) PCT Filed: Jul. 12, 2011

(86) PCT No.: PCT/US2011/043690
§ 371 (c)(1),
(2), (4) Date: Dec. 19, 2013

(87) PCT Pub. No.: WO2012/009344
PCT Pub. Date: Jan. 19, 2012

(65) Prior Publication Data
US 2014/0103303 A1    Apr. 17, 2014

Related U.S. Application Data

(60) Provisional application No. 61/363,460, filed on Jul. 12, 2010, provisional application No. 61/444,967, filed on Feb. 21, 2011.

(51) Int. Cl.
*H01L 51/00* (2006.01)
*C08G 61/12* (2006.01)
(Continued)

(52) U.S. Cl.
CPC ........ *H01L 51/0036* (2013.01); *C08G 61/123* (2013.01); *C09K 11/06* (2013.01);
(Continued)

(58) Field of Classification Search
CPC ............... H01L 51/502; H01L 51/5016; H01L 51/5028; H01L 51/5234
See application file for complete search history.

(56) References Cited

U.S. PATENT DOCUMENTS 5,478,658 A * 12/1995 Dodabalapur ...... H01L 51/5265
313/504
6,210,817 B1    4/2001 Igarashi
(Continued)

FOREIGN PATENT DOCUMENTS

GB        2456788 A    7/2009
WO     03020790 A2    3/2003

OTHER PUBLICATIONS

PCT/US2011/043690 International Search Report and Written Opinion dated Nov. 3, 2011.
(Continued)

*Primary Examiner* — Francisco Tschen
(74) *Attorney, Agent, or Firm* — J. Clinton Wimbish; Smith Moore Leatherwood LLP

(57) ABSTRACT

In some embodiments, conjugated polymers and oligomers are described herein, which can demonstrate white light or substantially white light emission, thereby reducing or precluding reliance on layered or blended polymer constructions for organic white light emitting devices.

26 Claims, 10 Drawing Sheets

(51) Int. Cl.
*C09K 11/06* (2006.01)
*H05B 33/14* (2006.01)
*C08L 65/00* (2006.01)
*H01L 51/50* (2006.01)

(52) U.S. Cl.
CPC ...... *H01L 51/0035* (2013.01); *H01L 51/0039* (2013.01); *H01L 51/0043* (2013.01); *H05B 33/14* (2013.01); *C08G 2261/124* (2013.01); *C08G 2261/148* (2013.01); *C08G 2261/149* (2013.01); *C08G 2261/15* (2013.01); *C08G 2261/312* (2013.01); *C08G 2261/3142* (2013.01); *C08G 2261/3246* (2013.01); *C08G 2261/411* (2013.01); *C08G 2261/5222* (2013.01); *C08L 65/00* (2013.01); *C09K 2211/1416* (2013.01); *C09K 2211/1483* (2013.01); *H01L 51/502* (2013.01); *H01L 51/5036* (2013.01); *Y02B 20/181* (2013.01)

(56) References Cited

U.S. PATENT DOCUMENTS

| | | | |
|---|---|---|---|
| 2002/0185967 A1* | 12/2002 | Friend | H01L 27/3246 313/504 |
| 2004/0048100 A1* | 3/2004 | Ebisawa | C08F 12/26 428/690 |
| 2004/0227705 A1* | 11/2004 | Fujimoto | C09K 11/02 345/76 |
| 2005/0186106 A1 | 8/2005 | Li et al. | |
| 2006/0105200 A1* | 5/2006 | Poplavskyy | B82Y 10/00 428/690 |
| 2007/0216301 A1* | 9/2007 | Anderson | C09K 9/02 313/524 |

OTHER PUBLICATIONS

Egbe et al, Effect of Styryl Side Groups on the Photophysical Properties and Hole Mobility of PPE-PPV Systems, Macromolecules, vol. 40, No. 22, Oct. 4, 2007, pp. 7786-7794.

* cited by examiner

LIGHT EMMITING DEVICE COMPRISING CONJUGATED TERPOLYMER/TEROLIGOMER CAPABLE OF WHITE LIGHT EMITTION

RELATED APPLICATION DATA

The present application hereby claims priority under 35 U.S.C. §119(e) to U.S. Provisional Application Ser. No. 61/363,430, filed Jul. 12, 2010 and U.S. Provisional Patent Application Ser. No. 61/444,967, filed Feb. 21, 2011, each of which is hereby incorporated by reference in its entirety.

STATEMENT OF GOVERNMENT LICENSE RIGHTS

This invention was made through the support of the Department of Defense—United States Air Force Office of Scientific Research (AFOSR) Grant No. FA9550-04-1-0161. The Federal Government retains certain license rights in this invention.

FIELD

The present invention is related to conjugated polymeric systems and, in particular, to applications of conjugated polymeric systems in optoelectronic apparatus.

BACKGROUND

Organic thin films have been heavily investigated in recent years due to their application in optoelectronic devices such as organic light emitting devices (OLEDs), photovoltaic devices and organic photodetectors.

Optoelectronic devices based on organic materials, including organic thin films, are becoming increasingly desirable in a wide variety of applications for a number of reasons. Materials used to construct organic optoelectronic devices are relatively inexpensive in comparison to their inorganic counterparts, thereby providing cost advantages over optoelectronic devices produced with inorganic materials. Moreover, organic materials provide desirable physical properties, such as flexibility, permitting their use in applications unsuitable for rigid inorganic materials.

Light emitting polymeric species, for example, have found general acceptance in various lighting applications, such as consumer electronic devices. While finding general acceptance, however, current light emitting polymeric species have several disadvantages limiting their application in certain fields. Similar to inorganic light emitting diodes comprising crystalline semiconductors, light emitting polymeric species have relatively narrow emission bands, thereby precluding white light emission from single polymeric species. As a result, organic light emitting devices are often constructed of a series of polymeric species having the desired emission profiles that, when combined, provide white light emission from the device.

Various light emitting polymeric species can be physically combined in several ways to provide a source of white light emission. In one construction, individual light emitting polymeric species are provided in a layered format. In one embodiment, for example, a layer of red light emitting polymer is combined with a layer of green light emitting polymer and a layer of blue emitting polymer to provide white light emission. Layering individual polymeric species to achieve white light emission has the inherent disadvantage of creating multiple interfaces in the device, thereby increasing the likelihood of device failure due to interfacial instability between the layers.

An alternative construction using multiple light emitting polymeric species is to blend the polymeric species to provide white light emission. Red light emitting, green light emitting and blue light emitting polymeric species, for example, can be blended into a single layer for achieving white light emission. Blending polymeric species also has inherent disadvantages that can lead to premature device failure. Polymeric blends are susceptible to spinodal decomposition over time and various operating conditions resulting in lost device performance or device failure.

SUMMARY

In one aspect, conjugated polymers and oligomers are described herein which, in some embodiments, are suitable for use in optoelectronic devices, including organic light emitting devices and/or organic photovoltaic devices. In some embodiments, for example, a conjugated polymer or oligomer described herein can demonstrate white light or substantially white light emission, thereby reducing or precluding reliance on layered or blended polymer constructions for organic white light emitting devices.

In some embodiments, a conjugated polymer or oligomer described herein comprises at least two repeating units selected from the group consisting of repeating units A, B and C:

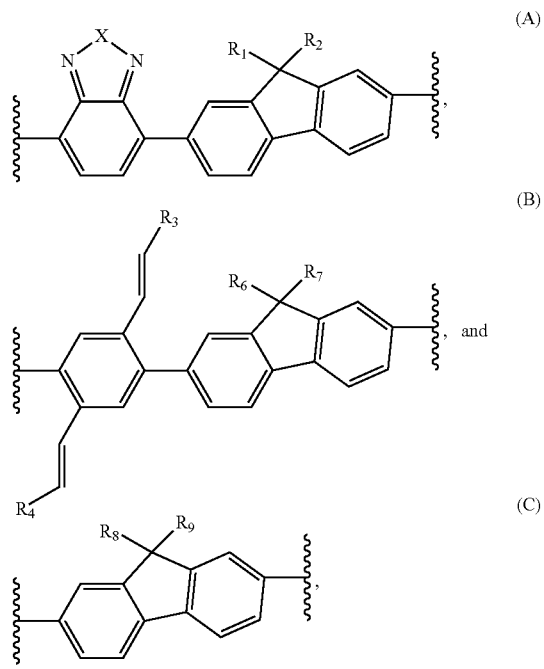

wherein ⁀ represents points of attachment in the polymer chain or oligomer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In some embodiments, a polymer or oligomer described herein comprising repeating units A and B is a conjugated polymer or oligomer of Formula (I):

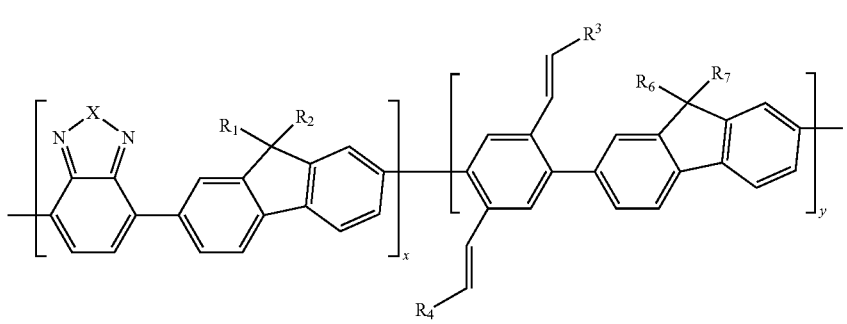

(I)

wherein X, $R_1$, $R_2$, $R_3$, $R_4$, $R_6$ and $R_7$ are defined above and x and y are integers independently ranging from 1 to 10,000. As described herein, in some embodiments, repeating units A and B of a conjugated polymer or oligomer of Formula (I) are arranged to provide an alternating copolymer, a block copolymer, statistical copolymer or a random copolymer.

In some embodiments, a conjugated polymer or oligomer of Formula (I) has a weight average molecular weight ($M_w$) ranging from about 1,000 to about 1,000,000. In some embodiments, a conjugated polymer or oligomer of Formula (I) has a number average molecular weight ($M_n$) ranging from about 500 to about 500,000.

In some embodiments, a polymer or oligomer described herein comprising repeating units A and C is a conjugated polymer or oligomer of Formula (II):

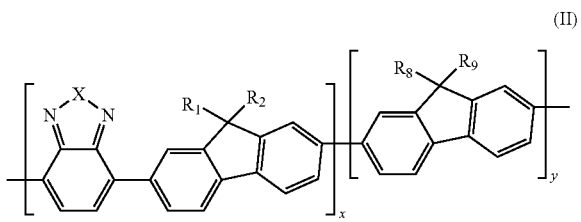

(II)

wherein X, $R_1$, $R_2$, $R_8$ and $R_9$ are defined above and x and y are integers independently ranging from 1 to 10,000. As described herein, in some embodiments, repeating units A and C of a conjugated polymer or oligomer of Formula (II) are arranged to provide an alternating copolymer, a block copolymer, statistical copolymer or a random copolymer.

In some embodiments, a conjugated polymer or oligomer of Formula (II) has a weight average molecular weight ($M_w$) ranging from about 1,000 to about 1,000,000. In some embodiments, a conjugated polymer or oligomer of Formula (II) has a number average molecular weight ($M_n$) ranging from about 500 to about 500,000.

In some embodiments, a polymer or oligomer described herein comprising repeating units B and C is a conjugated polymer or oligomer of Formula (III):

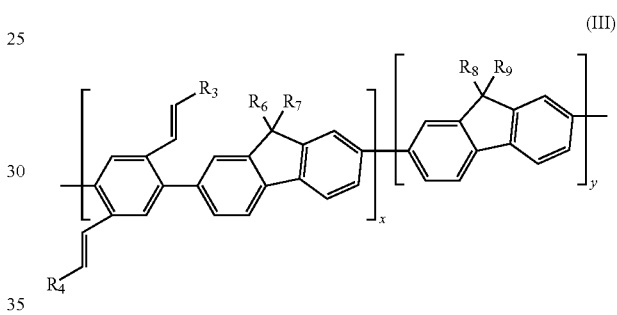

(III)

wherein $R_3$, $R_4$, $R_6$, $R_7$, $R_8$ and $R_9$ are defined above and x and y are integers independently ranging from 1 to 10,000. As described herein, in some embodiments, repeating units B and C of a conjugated polymer or oligomer of Formula (III) are arranged to provide an alternating copolymer, a block copolymer, statistical copolymer or a random copolymer.

In some embodiments, a conjugated polymer or oligomer of Formula (III) has a weight average molecular weight ($M_w$) ranging from about 1,000 to about 1,000,000. In some embodiments, a conjugated polymer or oligomer of Formula (III) has a number average molecular weight ($M_n$) ranging from about 500 to about 500,000.

In some embodiments, a polymer or oligomer described herein comprising repeating units A, B and C is a conjugated polymer or oligomer of Formula (IV):

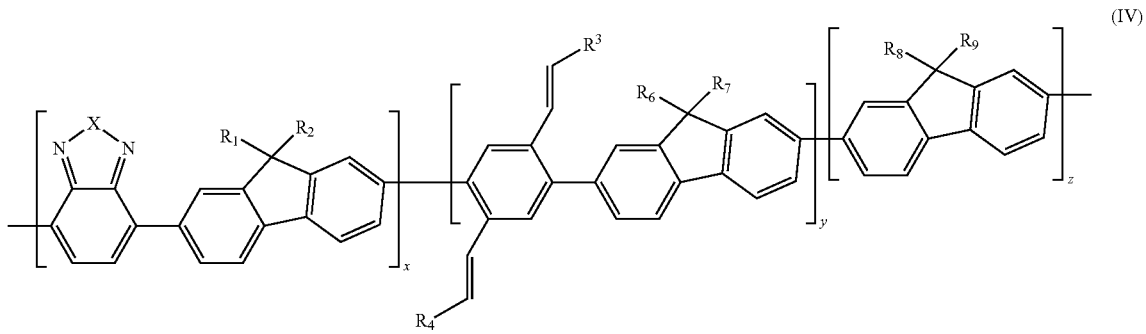

(IV)

wherein X, $R_1$, $R_2$, $R_3$, $R_4$, $R_6$, $R_7$, $R_8$ and $R_9$ are defined above and x, y and z are integers independently ranging from 1 to 10,000. As described herein, in some embodiments, repeating units A, B and C of a conjugated polymer or oligomer of Formula (IV) are arranged to provide an alternating copolymer, a block copolymer, statistical copolymer or a random copolymer.

In some embodiments, a conjugated polymer or oligomer of Formula (IV) has a weight average molecular weight ($M_w$) ranging from about 1,000 to about 1,000,000. In some embodiments, a conjugated polymer or oligomer of Formula (IV) has a number average molecular weight ($M_n$) ranging from about 500 to about 500,000.

In some embodiments, a conjugated polymer or oligomer of Formula (I), Formula (II), Formula (III) and/or Formula (IV) has an electroluminescent (EL) emission having coordinates in the white light region or substantially in the white light region of the 1931 International Commission on Illumination (CIE) Chromaticity Diagram.

In some embodiments, a conjugated polymer or oligomer of Formula (I), Formula (II), Formula (III) and/or Formula (IV) is terminated with one or more aryl or heteroaryl moieties.

In another aspect, light emitting devices comprising conjugated polymers or oligomers are described herein. In some embodiments, a light emitting device described herein comprises a radiation transmissive first electrode, a second electrode and a light emitting layer disposed between the first electrode and the second electrode, the light emitting layer comprising a conjugated polymer or oligomer comprising at least two repeating units selected from the group consisting of repeating units A, B and C:

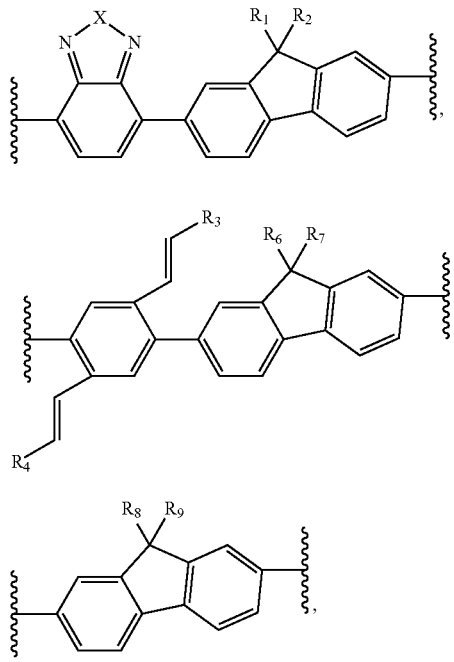

wherein $\{$ represents points of attachment in the polymer chain or oligomer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In some embodiments, a polymer or oligomer of a light emitting layer comprising at least two repeating units selected from the group consisting of repeating units A, B and C is a polymer or oligomer of Formula (I), Formula (II), Formula (III) or Formula (IV) described hereinabove. In some embodiments, a light emitting layer of a light emitting device comprises a mixture of at least two polymers or oligomers selected from the group consisting of polymers or oligomers of Formula (I), Formula (II), Formula (III) and Formula (IV) described herein.

In some embodiments, a light emitting device described herein comprising a light emitting layer comprising a conjugated polymer or oligomer has an electroluminescent emission having coordinates in the white light region or substantially in the white light region of the 1931 CIE Chromaticity Diagram.

In another aspect, composite organic layers are described herein. In some embodiments, a composite organic layer comprises a nanoparticle phase disposed in a polymeric phase or oligomeric phase, the polymeric or oligomeric phase comprising a polymer or oligomer comprising at least two repeating units selected from the group consisting of repeating units A, B and C:

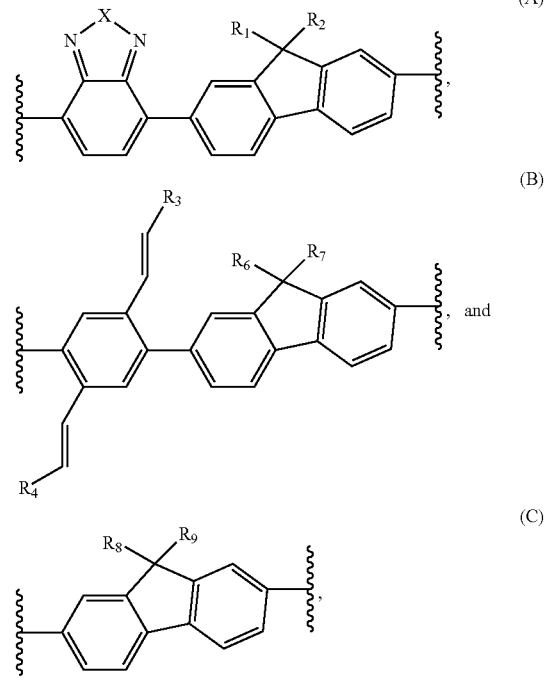

wherein ⁁ represents points of attachment in the polymer chain or oligomer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In some embodiments, a polymer or oligomer of a composite organic layer comprising at least two repeating units selected from the group consisting of repeating units A, B and C is a polymer or oligomer of Formula (I), Formula (II), Formula (III) or Formula (IV) described hereinabove. In some embodiments, the polymeric or oligomeric phase of a composite organic layer comprises a mixture of at least two polymers or oligomers selected from the group consisting of polymers or oligomers of Formula (I), Formula (II), Formula (III) and Formula (IV) described herein.

In some embodiments, a polymeric phase or oligomeric phase further comprises one or more conjugated or semiconducting polymers in addition to at least one polymer or oligomer selected from Formula (I), Formula (II), Formula (III) and Formula (IV) described herein.

As provided herein, composite organic layers comprise a nanoparticle phase disposed in the polymeric phase. In some embodiments, the nanoparticle phase is dispersed in the polymeric phase. The nanoparticle phase can comprise any type of nanoparticle not inconsistent with the objectives of the present invention.

In another aspect, methods of making conjugated polymers or oligomers are described herein. In some embodiments, a method of making a conjugated polymer or oligomer comprises reacting at least three types of monomer selected from the group consisting of monomer types $A_1$, $B_1$, $C_1$, $D_1$ and $E_1$:

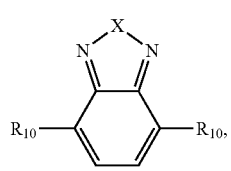

$A_1$

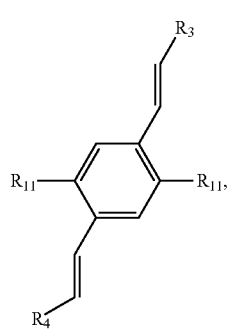

$B_1$

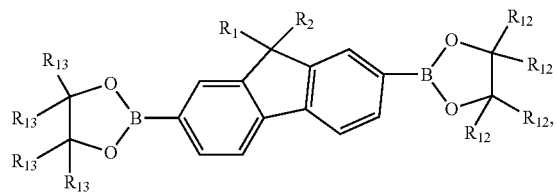

$C_1$

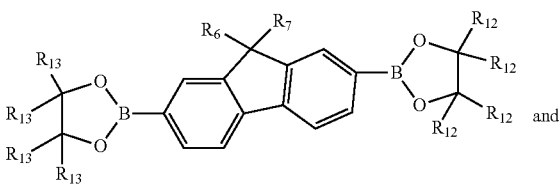

$D_1$ and

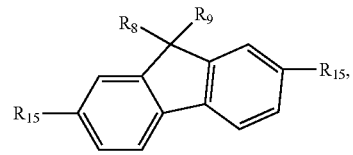

$E_1$ wherein X is selected from the group consisting of S, O, Se and $NR_5$ and $R_1$, $R_2$, $R_5$, $R_6$, $R_7$, $R_8$, and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl and $R_{12}$ and $R_{13}$ are independently selected from the group consisting of hydrogen and $C_{1-6}$ alkyl and wherein the alkyl and alkenyl of $R_1$, $R_2$, $R_5$, $R_6$, $R_7$, $R_8$, $R_9$, $R_{12}$ and $R_{13}$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl and $R_{10}$, $R_{11}$ and $R_{15}$ are leaving groups.

As used herein, the term "leaving group" refers to a chemical species that can be displaced from a carbon atom. In some embodiments, leaving groups of $R_{10}$, $R_{11}$ and $R_{15}$ are independently selected from the group consisting of halogen, tosyl, azide, thiocyanate and nitro.

In some embodiments, $R_1$ and $R_6$ are selected to be the same and $R_2$ and $R_7$ are selected to be the same, thereby rendering monomers $C_1$ and $D_1$ identical.

In some embodiments of methods described herein, a conjugated polymer or oligomer comprising at least two repeating units selected from the group consisting of repeating units A, B and C:

(A)

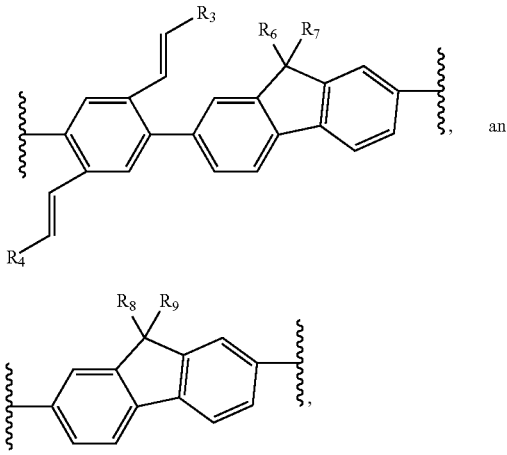

is provided by reacting at least three types of monomer selected from the group consisting of monomer types $A_1$, $B_1$, $C_1$, $D_1$ and $E_1$ defined above, wherein ⌇ represents points of attachment in the polymer or oligomer and X, $R_1$, $R_2$, $R_3$, $R_4$, $R_6$, $R_7$, $R_8$ and $R_9$ are defined above.

In some embodiments, for example, polymers or oligomers of Formulas (I)-(IV) can be provided by reacting monomer types $A_1$, $B_1$, $C_1$, $D_1$ and $E_1$ according to Table I.

TABLE I

| Monomer Reaction Scheme | |
|---|---|
| Polymer/Oligomer | Monomers Reacted |
| Formula (I) | $A_1$, $B_1$, $C_1$, $D_1$ |
| Formula (II) | $A_1$, $C_1$, $E_1$ |
| Formula (III) | $B_1$, $D_1$, $E_1$ |
| Formula (IV) | $A_1$, $B_1$, $C_1$, $D_1$, $E_1$ |

In some embodiments wherein monomers $C_1$ and $D_1$ have the same structure, polymers or oligomers of Formulas (I)-(IV) can be provided by reacting monomer types $A_1$, $B_1$, $C_1$, $E_1$ according to Table I(A).

TABLE I(A)

| Monomer Reaction Scheme | |
|---|---|
| Polymer/Oligomer | Monomers Reacted |
| Formula (I) | $A_1$, $B_1$, $C_1$ |
| Formula (II) | $A_1$, $C_1$, $E_1$ |
| Formula (III) | $B_1$, $C_1$, $E_1$ |
| Formula (IV) | $A_1$, $B_1$, $C_1$, $E_1$ |

In some embodiments of methods of making a conjugated polymer or oligomer, combinations of monomers $A_1$, $B_1$, $C_1$, $D_1$ and $E_1$ as provided in Table I are polymerized according to palladium catalyzed cross-coupling of organic halides with organoboron derivatives. In some embodiments, combinations of monomers of $A_1$, $B_1$, $C_1$, $D_1$ and $E_1$ are polymerized by Suzuki coupling reactions. Moreover, in some embodiments, monomers $A_1$, $B_1$, $C_1$, $D_1$ and $E_1$ can be provided in any desired ratio to provide a conjugated polymer or oligomer described herein. In some embodiments, for example, monomers $A_1$, $B_1$, $C_1$, $D_1$ and $E_1$ can be provided according to the ratios disclosed in Table II for polymers or oligomers of Formulas (I)-(IV).

TABLE II

| Monomer Ratios | |
|---|---|
| Polymer/Oligomer | Monomer Ratio |
| Formula (I) | $0.05 \leq A_1 \leq 0.9$ |
| | $0.05 \leq B_1 \leq 0.9$ |
| | $0.05 \leq C_1 \leq 0.9$ |
| | $0.05 \leq D_1 \leq 0.9$ |
| | wherein $A_1 + B_1 + C_1 + D_1 = 1$ |
| Formula (II) | $0.05 \leq A_1 \leq 0.9$ |
| | $0.05 \leq C_1 \leq 0.9$ |
| | $0.05 \leq E_1 \leq 0.9$ |
| | wherein $A_1 + C_1 + E_1 = 1$ |
| Formula (III) | $0.05 \leq B_1 \leq 0.9$ |
| | $0.05 \leq D_1 \leq 0.9$ |
| | $0.05 \leq E_1 \leq 0.9$ |
| | wherein $B_1 + D_1 + E_1 = 1$ |
| Formula (IV) | $0.05 \leq A_1 \leq 0.9$ |
| | $0.05 \leq B_1 \leq 0.9$ |
| | $0.05 \leq C_1 \leq 0.9$ |
| | $0.05 \leq D_1 \leq 0.9$ |
| | $0.05 \leq E_1 \leq 0.9$ |
| | wherein $A_1 + B_1 + C_1 + D_1 + E_1 = 1$ |

In some embodiments wherein monomers $C_1$ and $D_1$ have the same structure, monomers $A_1$, $B_1$, $C_1$, and $E_1$ can be provided according to the ratios disclosed in Table II(A) for polymers or oligomers of Formulas (I)-(IV).

TABLE II(A)

| Monomer Ratios | |
|---|---|
| Polymer/Oligomer | Monomer Ratio |
| Formula (I) | $0.05 \leq A_1 \leq 0.9$ |
| | $0.05 \leq B_1 \leq 0.9$ |
| | $0.05 \leq C_1 \leq 0.9$ |
| | wherein $A_1 + B_1 + C_1 = 1$ |
| Formula (II) | $0.05 \leq A_1 \leq 0.9$ |
| | $0.05 \leq C_1 \leq 0.9$ |
| | $0.05 \leq E_1 \leq 0.9$ |
| | wherein $A_1 + C_1 + E_1 = 1$ |
| Formula (III) | $0.05 \leq B_1 \leq 0.9$ |
| | $0.05 \leq C_1 \leq 0.9$ |
| | $0.05 \leq E_1 \leq 0.9$ |
| | wherein $B_1 + C_1 + E_1 = 1$ |
| Formula (IV) | $0.05 \leq A_1 \leq 0.9$ |
| | $0.05 \leq B_1 \leq 0.9$ |
| | $0.05 \leq C_1 \leq 0.9$ |
| | $0.05 \leq E_1 \leq 0.9$ |
| | wherein $A_1 + B_1 + C_1 + E_1 = 1$ |

In another aspect, methods of making a light emitting device are described herein. In some embodiments, a method of making a light emitting device comprises providing a radiation transmissive first electrode, providing a second electrode and disposing a light emitting layer comprising a conjugated polymer or oligomer between the first electrode and the second electrode, the conjugated polymer comprising at least two repeating units selected from the group consisting of repeating units A, B and C:

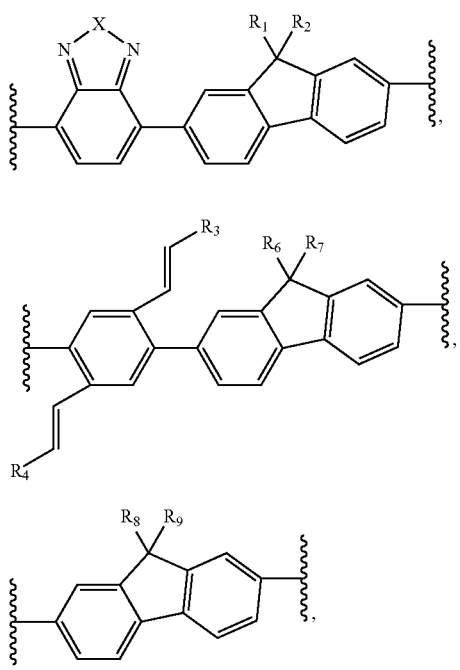

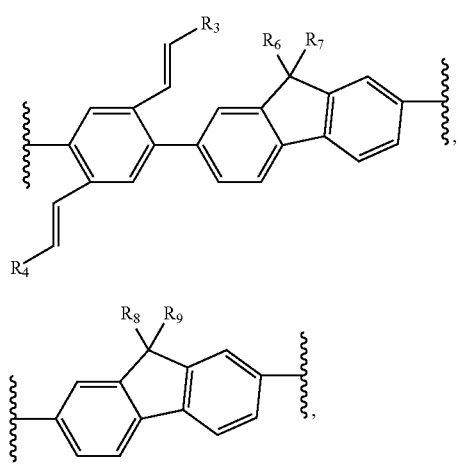

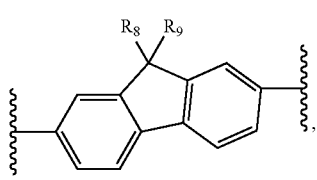

wherein ⸺ represents points of attachment in the polymer chain or oligomer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In some embodiments, a polymer or oligomer of a light emitting layer comprising at least two repeating units selected from the group consisting of repeating units A, B and C is a polymer or oligomer of Formula (I), Formula (II), Formula (III) or Formula (IV) described hereinabove. In some embodiments, a light emitting layer of a light emitting device comprises a mixture of at least two polymers or oligomers selected from the group consisting of polymers or oligomers of Formula (I), Formula (II), Formula (III) and Formula (IV) described herein. In some embodiments, a conjugated polymer or oligomer of a light emitting device has an electroluminescent emission having coordinates in the white light region or substantially in the white light region of the 1931 CIE Chromaticity Diagram.

In another aspect, methods of altering the electroluminescent emission spectra of conjugated polymers and oligomers are described herein. In some embodiments, a method of altering the electroluminescent emission spectrum of a conjugated polymer or oligomer comprises varying the ratio of repeating units forming the conjugated polymer or oligomer, wherein at least two repeating units of the conjugated polymer or oligomer are selected from the group consisting of repeating units A, B and C:

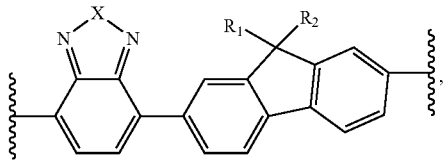

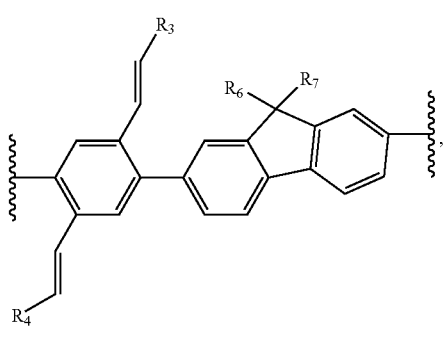

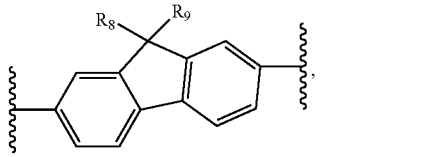

wherein ⸺ represents points of attachment in the polymer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In another aspect, methods of producing a composite organic layer are described herein. In some embodiments, a method of producing a composite organic layer comprises providing a nanoparticle phase comprising a plurality of nanoparticles, providing a polymeric phase or an oligomeric phase and disposing the nanoparticle phase in the polymeric phase or the oligomeric phase, the polymeric phase or oligomeric phase comprising a polymer or oligomer comprising at least two repeating units selected from the group consisting of repeating units A, B and C:

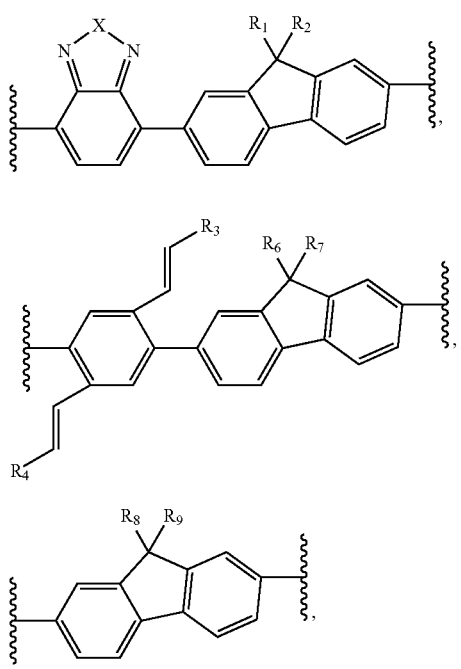

wherein ⸹ represents points of attachment in the polymer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In some embodiments, a polymer or oligomer of a composite layer comprising at least two repeating units selected from the group consisting of repeating units A, B and C is a polymer or oligomer of Formula (I), Formula (II), Formula (III) or Formula (IV) described hereinabove. In some embodiments, a composite organic layer comprises a mixture of at least two polymers or oligomers selected from the group consisting of polymers or oligomers of Formula (I), Formula (II), Formula (III) and Formula (IV) described herein. In some embodiments, a conjugated polymer or oligomer of a composite layer has an electroluminescent emission having coordinates in the white light region or substantially in the white light region of the 1931 CIE Chromaticity Diagram. These and other embodiments are described in greater detail in the detailed description which follows.

DETAILED DESCRIPTION

Figure 1:
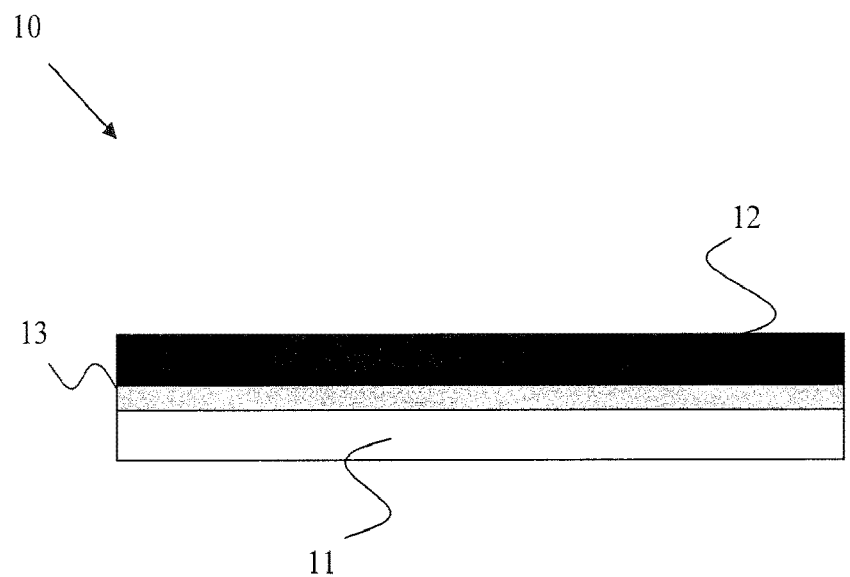
FIG. 1 illustrates a light emitting device according to one embodiment described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

The term "alkyl" as used herein, alone or in combination, refers to a straight or branched chain saturated hydrocarbon radical having from 1-20 carbon atoms. In some embodiments, for example, alkyl is $C_{8-12}$ alkyl.

The term "alkenyl" as used herein, alone or in combination, refers to a straight or branched chain hydrocarbon radical containing from 2-20 carbon atoms and at least one carbon-carbon double bond. In some embodiments, for example, alkenyl comprises $C_{8-12}$ alkenyl.

The term "aryl" as used herein, alone or in combination, refers to an aromatic ring system radical. Aryl is also intended to include partially hydrogenated derivatives of carbocyclic systems.

The term "heteroaryl" as used herein, alone or in combination, refers to an aromatic ring radical with for instance 5 to 7 member atoms, or to a aromatic ring system radical with for instance from 7 to 18 member atoms, containing one or more heteroatoms selected from nitrogen, oxygen, or sulfur heteroatoms, wherein N-oxides and sulfur monoxides and sulfur dioxides are permissible heteroaromatic substitutions; such as e.g. furanyl, thienyl, thiophenyl, pyrrolyl, imidazolyl, pyrazolyl, triazolyl, tetrazolyl, thiazolyl, oxazolyl, isoxazolyl, oxadiazolyl, thiadiazolyl, isothiazolyl, pyridinyl, pyridazinyl, pyrazinyl, pyrimidinyl, quinolinyl, isoquinolinyl, benzofuranyl, benzothiophenyl, indolyl, and indazolyl, and the like. Heteroaryl is also intended to include the partially hydrogenated derivatives of the heterocyclic systems.

In one aspect, conjugated polymers and oligomers are described herein which, in some embodiments, are suitable for use in optoelectronic devices, including organic light emitting devices and/or organic photovoltaic devices. In some embodiments, for example, a conjugated polymer or oligomer described herein can demonstrate white light or substantially white light emission, thereby reducing or precluding reliance on layered or blended polymer constructions for organic white light emitting devices.

In some embodiments, a conjugated polymer or oligomer described herein comprises at least two repeating units selected from the group consisting of repeating units A, B and C:

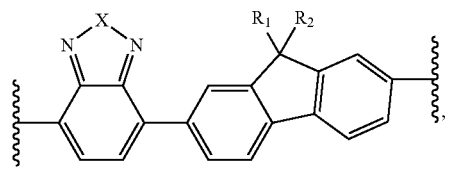

(A)

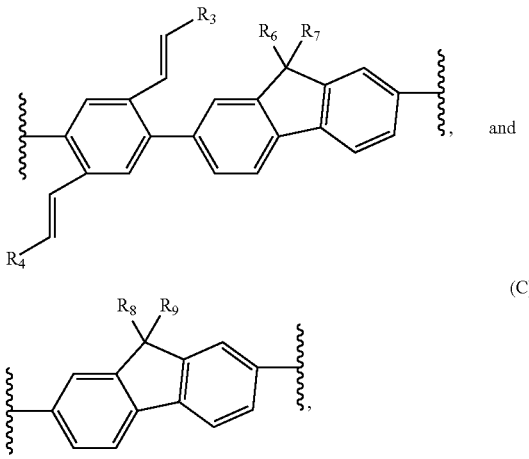

(B)

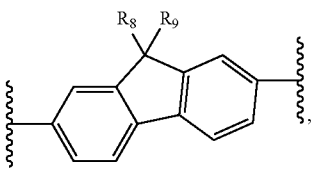

(C)

wherein ⸹ represents points of attachment in the polymer chain or oligomer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In some embodiments, repeating unit A of a conjugated polymer or oligomer described herein is selected from the group consisting of:

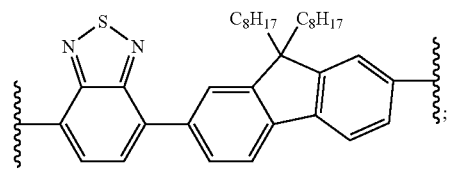

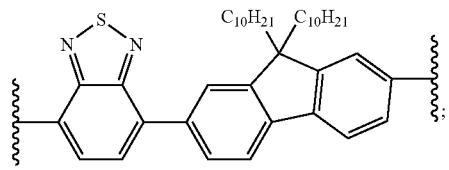

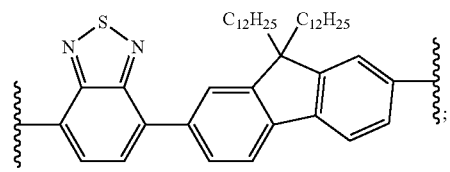

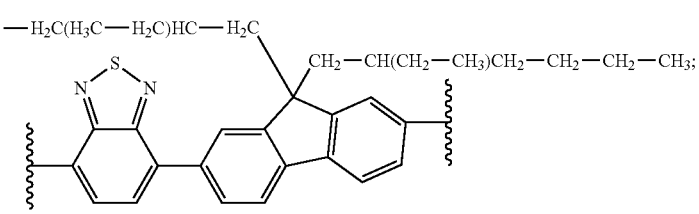

-continued
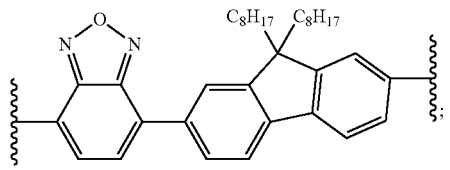
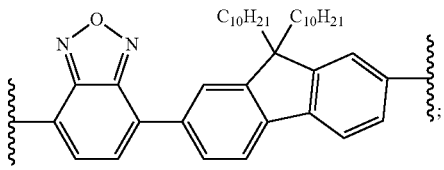
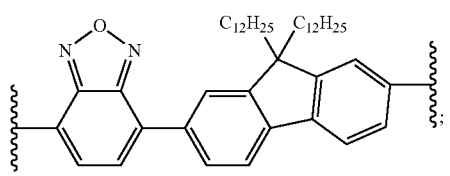
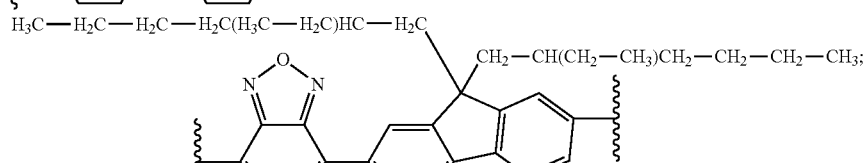
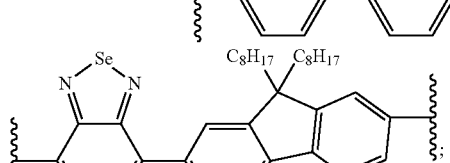
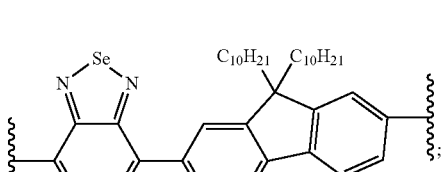
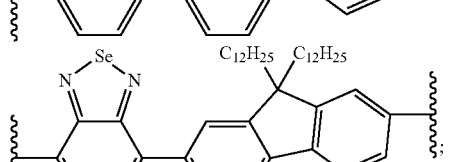
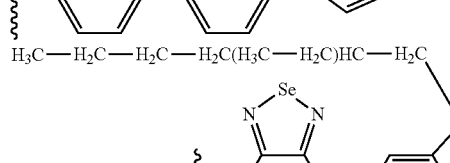
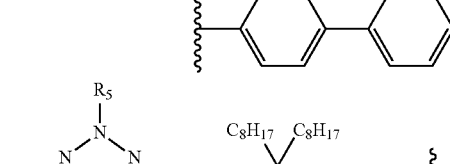
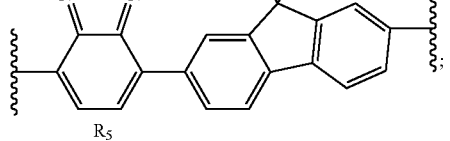
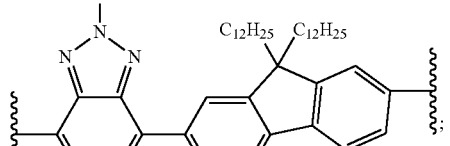
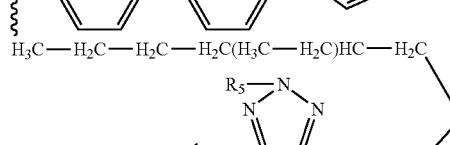
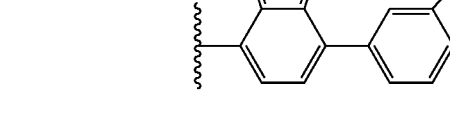 and
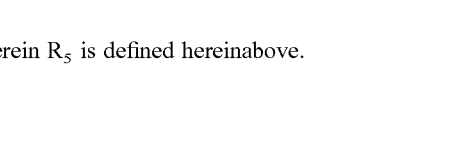
wherein $R_5$ is defined hereinabove.

In some embodiments, repeating unit B of a conjugated polymer or oligomer described herein is selected from the group consisting of:
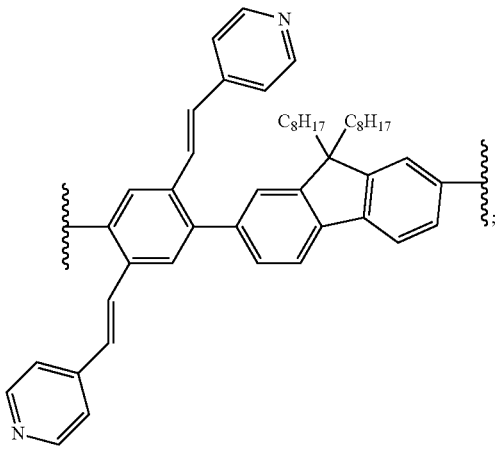
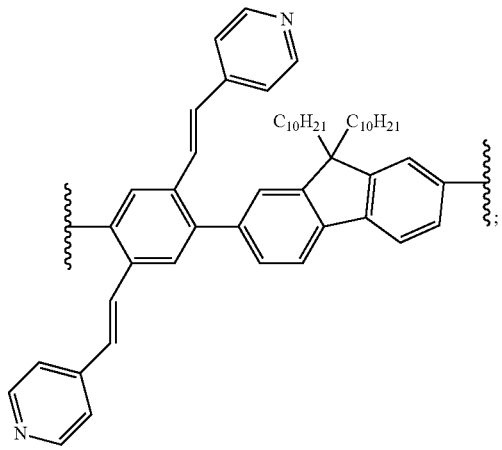
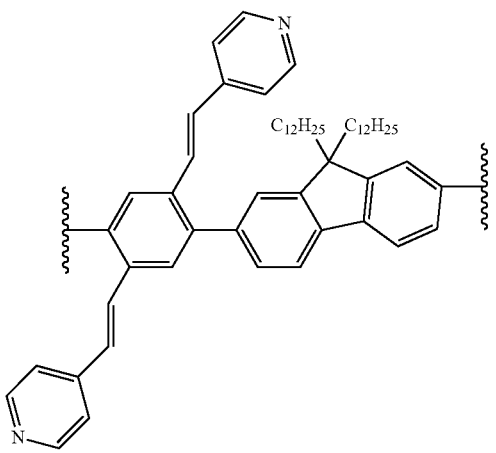
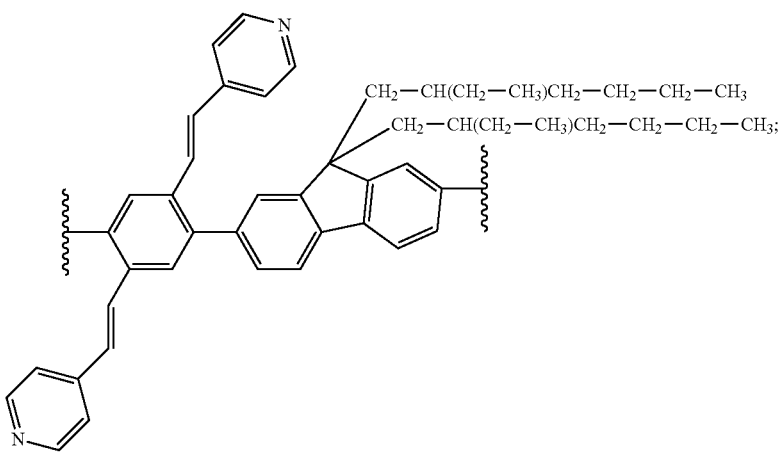

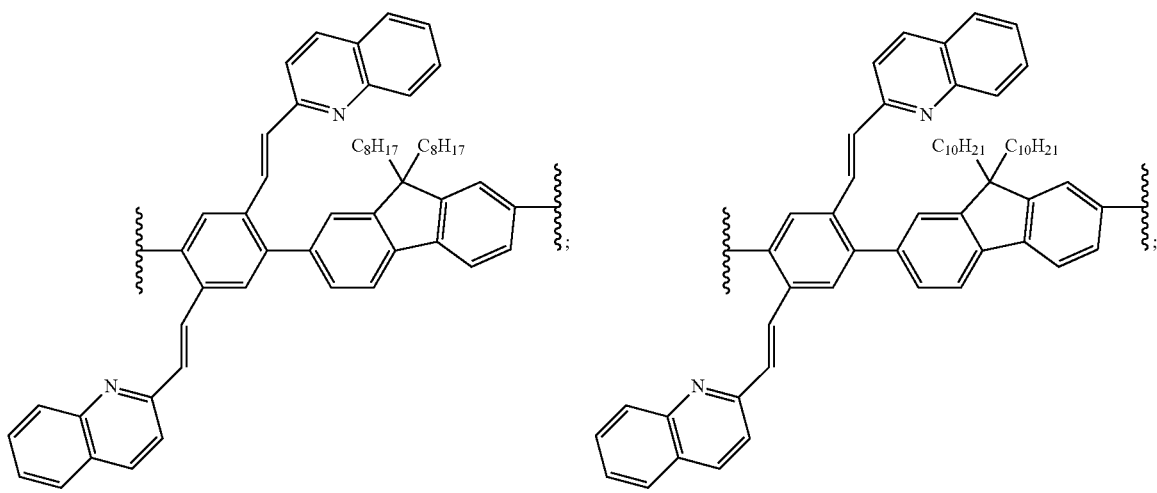
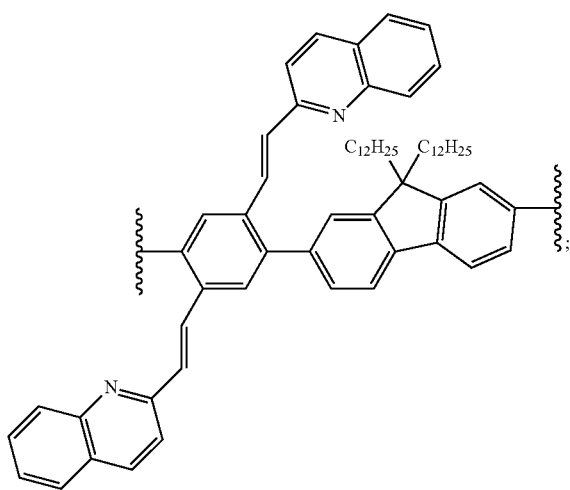
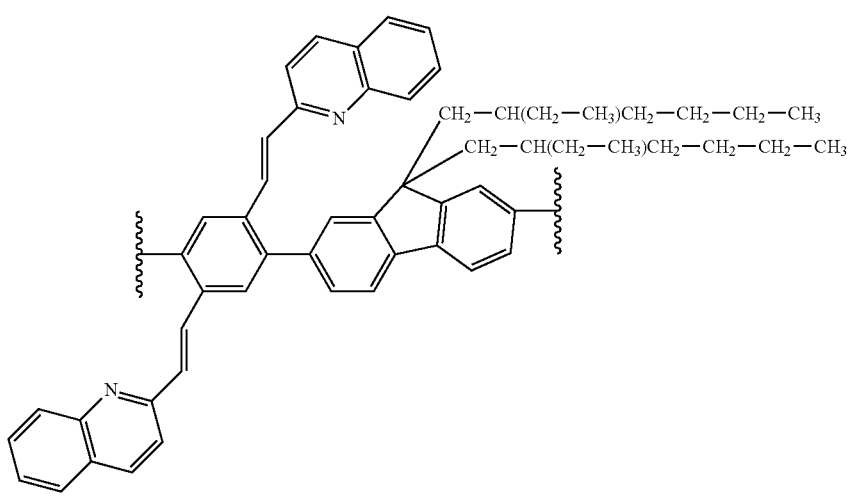

-continued
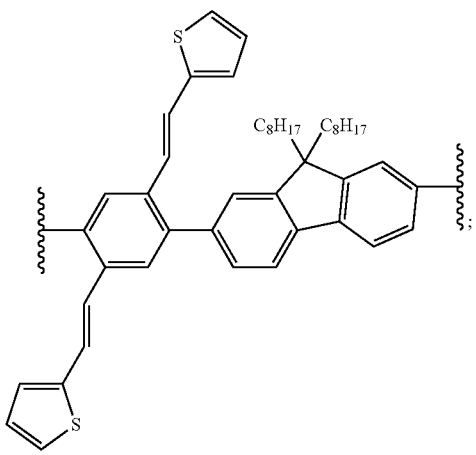;
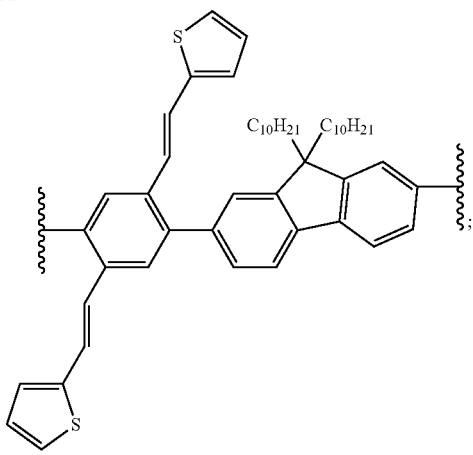;
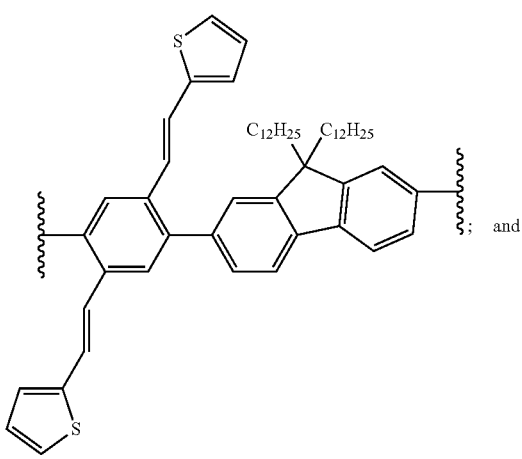; and
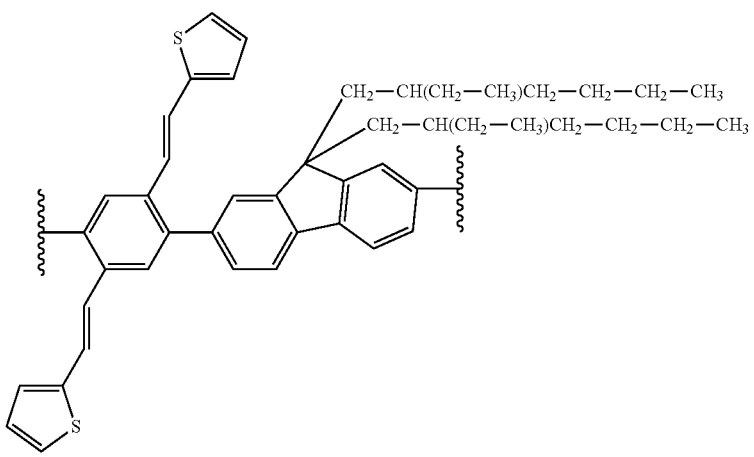

In some embodiments, repeating unit C of a conjugated polymer or oligomer described herein is selected from the group consisting of:

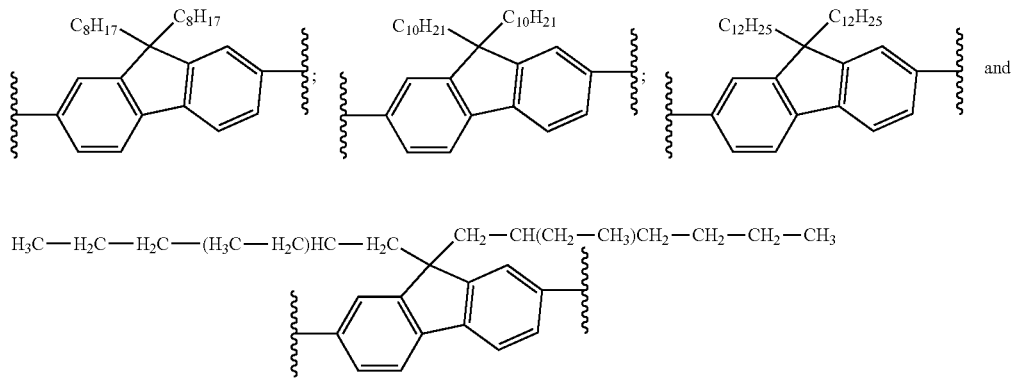

In some embodiments, a polymer or oligomer described herein comprising repeating units A and B is a conjugated polymer of Formula (I):

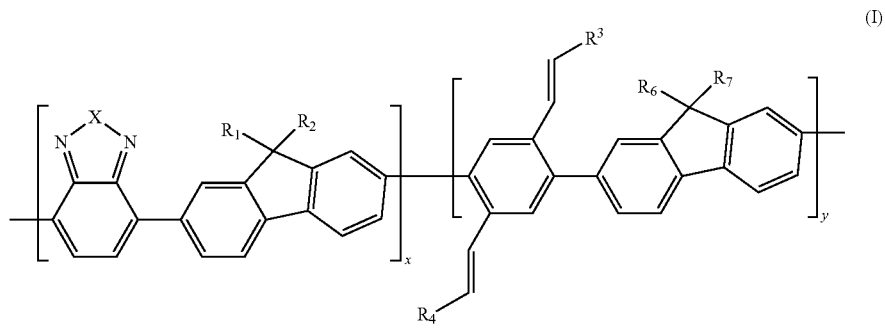

(I)

wherein X, $R_1$, $R_2$, $R_3$, $R_4$, $R_6$ and $R_7$ are defined above and x and y are integers independently ranging from 1 to 10,000. As described herein, in some embodiments, repeating units A and B of a conjugated polymer or oligomer of Formula (I) are arranged to provide an alternating copolymer, a block copolymer, statistical copolymer or a random copolymer.

In some embodiments, a conjugated polymer or oligomer of Formula (I) has a weight average molecular weight ($M_w$) ranging from about 1,000 to about 1,000,000. In some embodiments, a conjugated polymer or oligomer of Formula (I) has a number average molecular weight ($M_n$) ranging from about 500 to about 500,000.

In some embodiments, a conjugated polymer or oligomer of Formula (I) described herein is selected from the group consisting of:

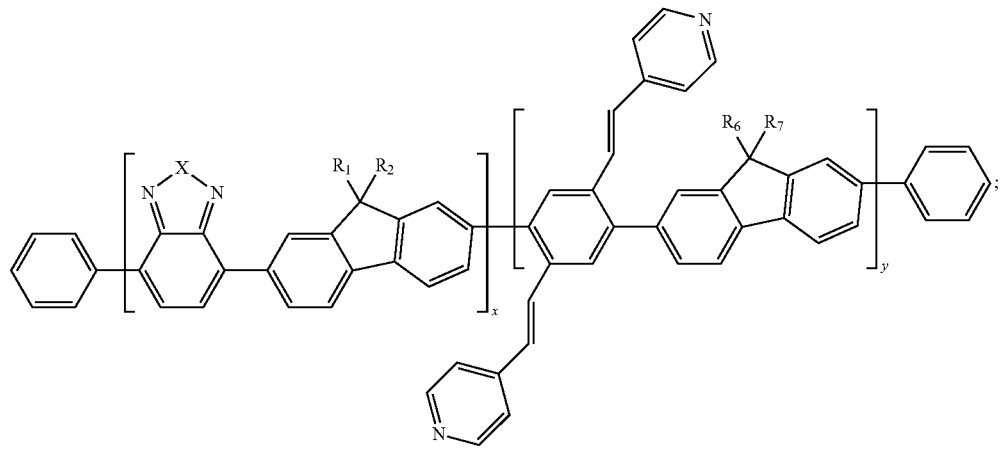

-continued
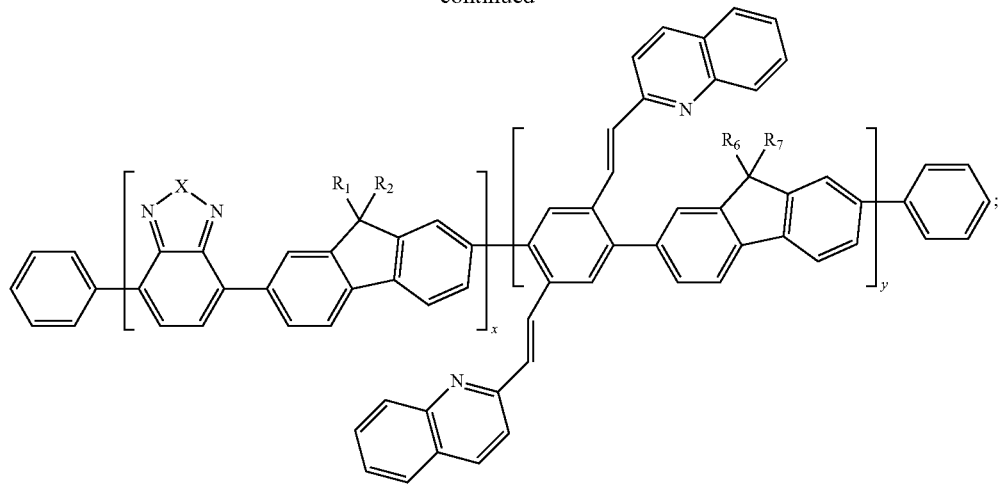
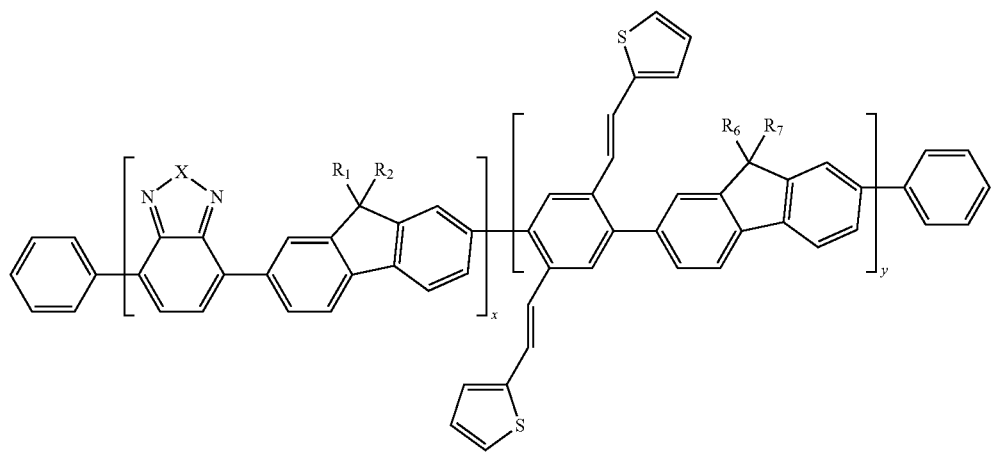
wherein X, $R_1$, $R_2$, $R_6$ and $R_7$ are defined above and x and y are integers independently ranging from 1 to 10,000.
In some embodiments, a conjugated polymer or oligomer of Formula (I) described herein is selected from the group consisting of:
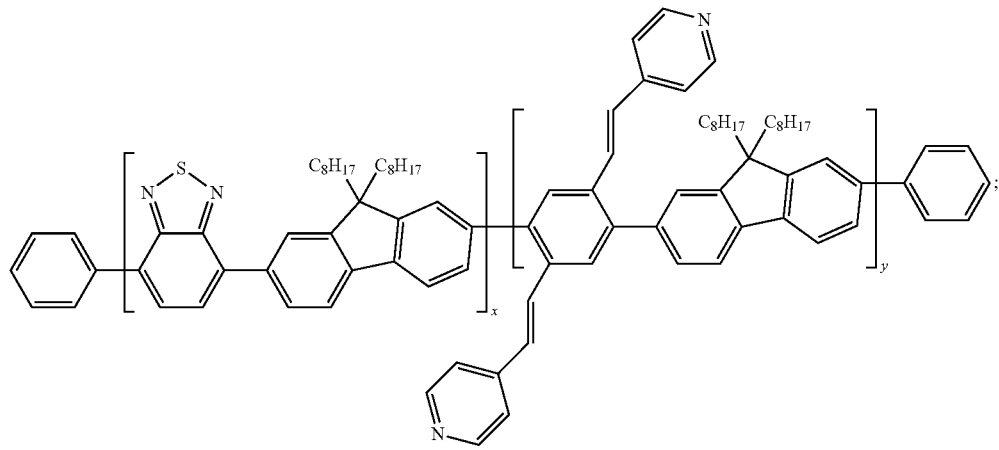

-continued
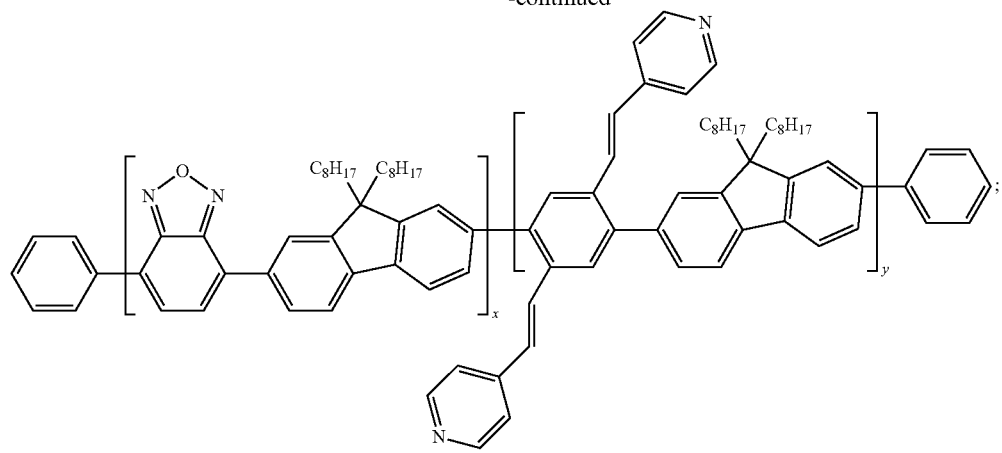
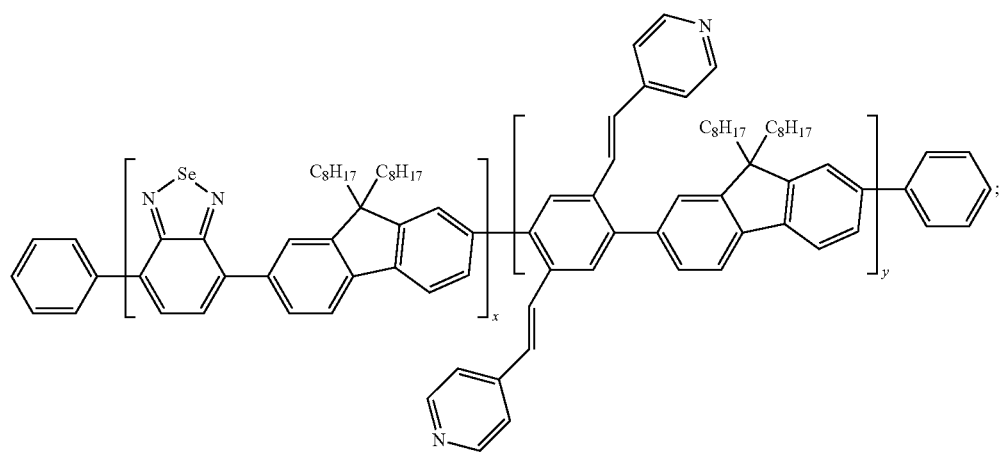
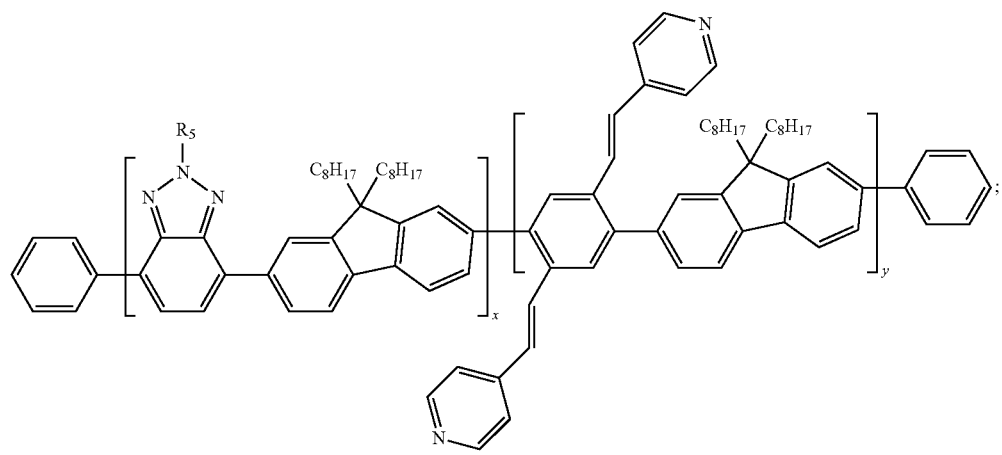

-continued
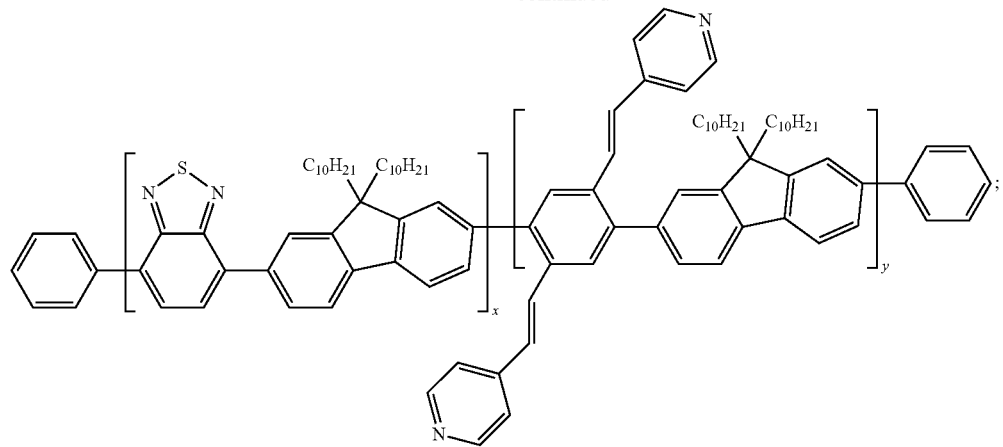
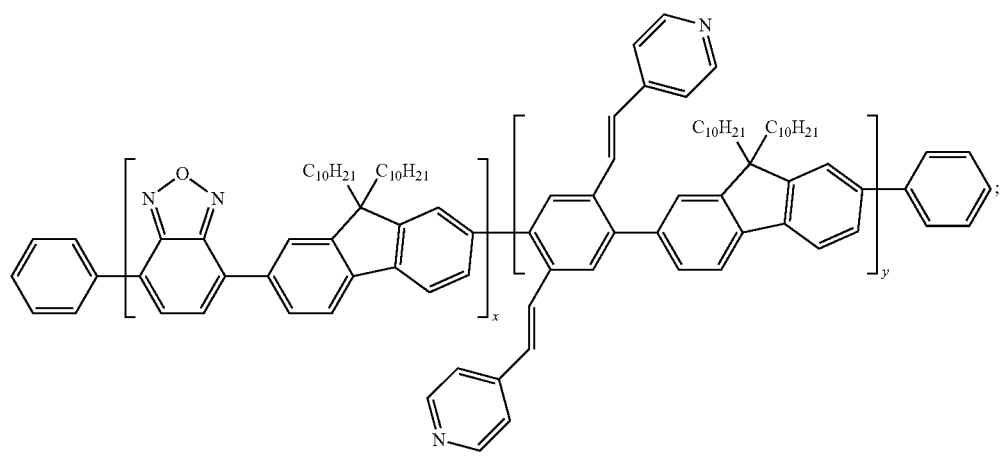
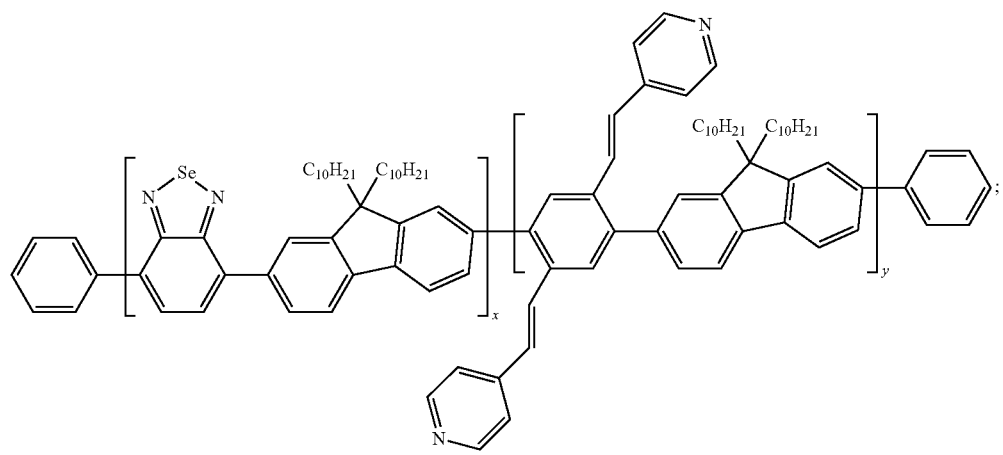

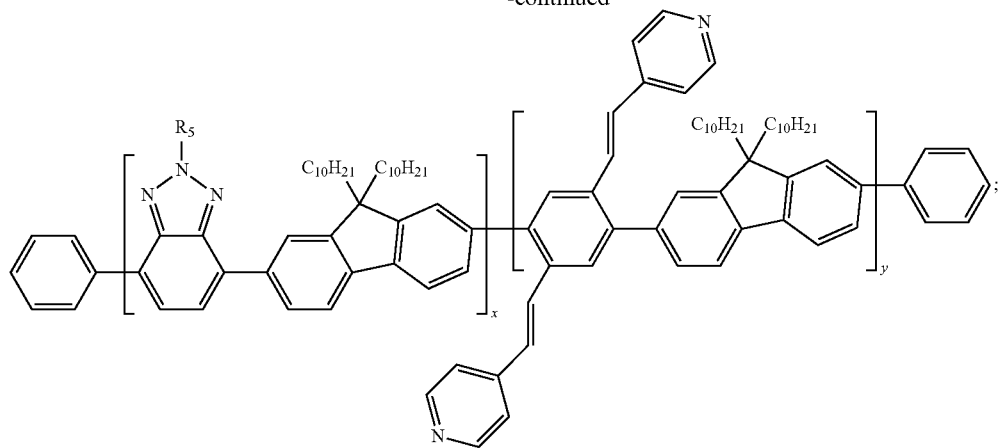
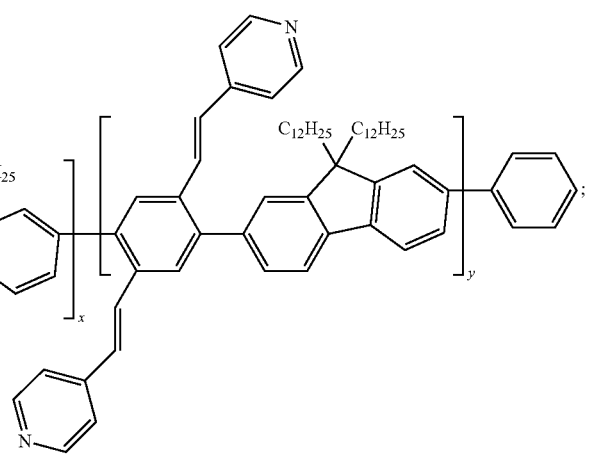
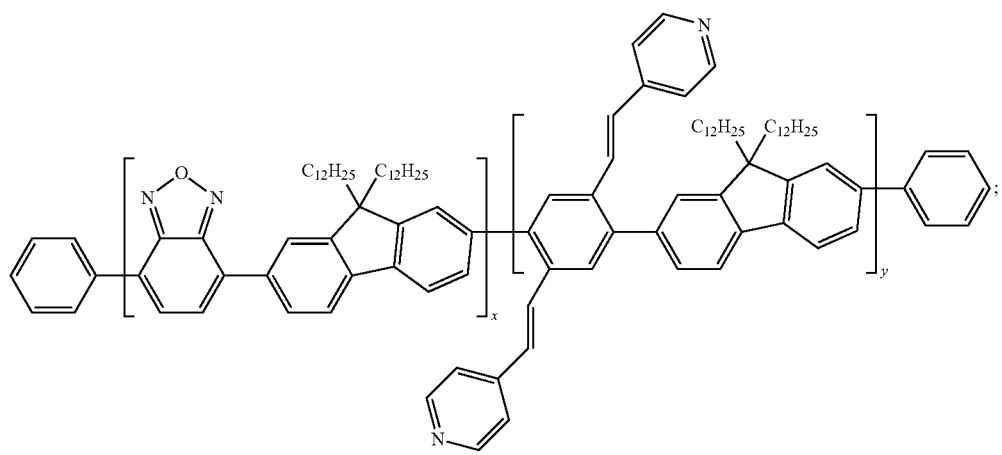

-continued
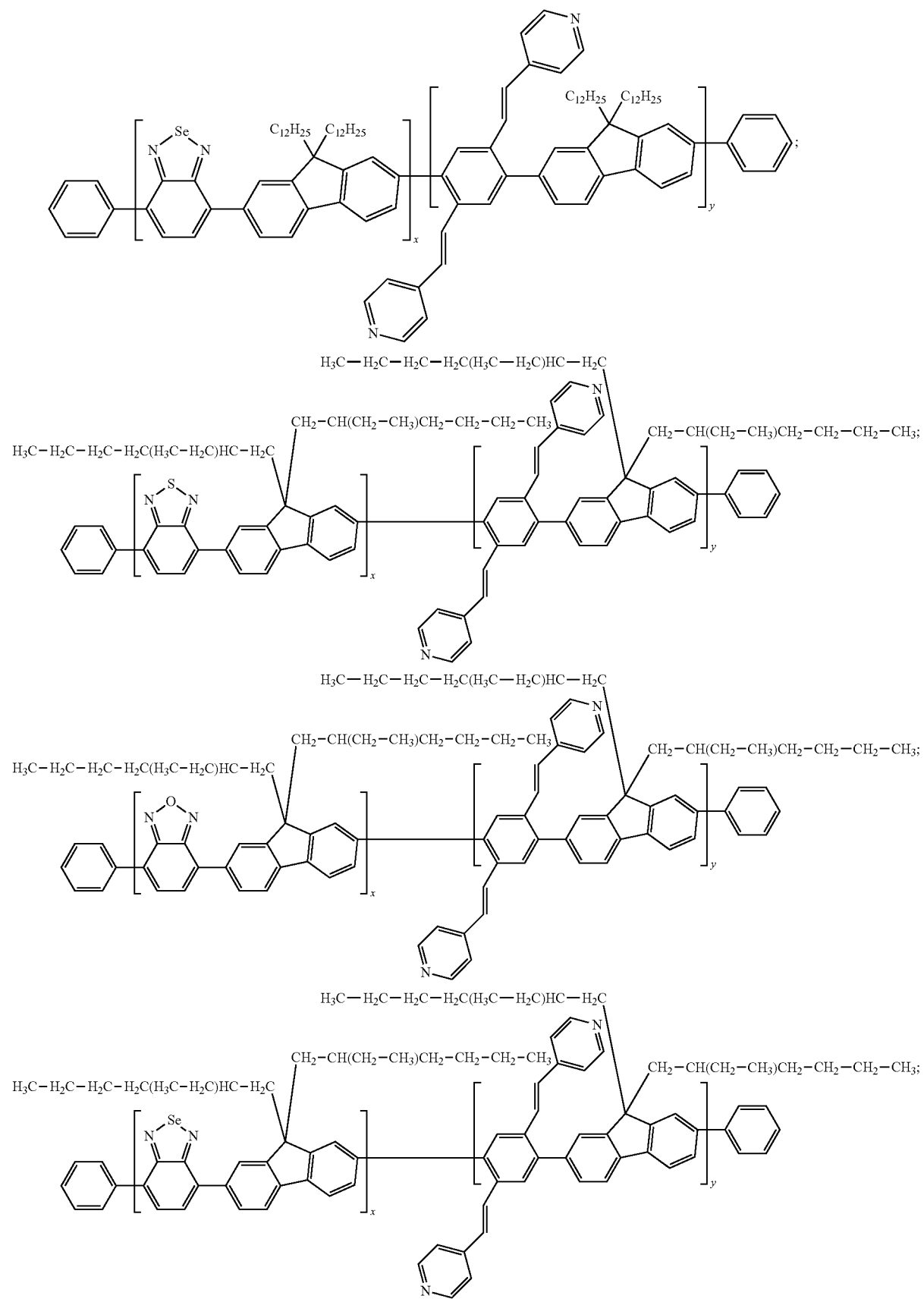

-continued
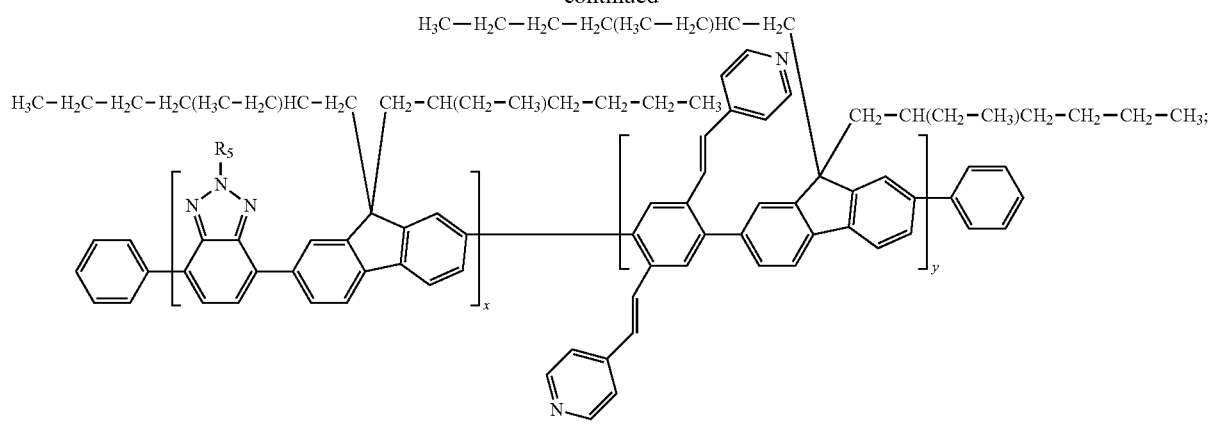
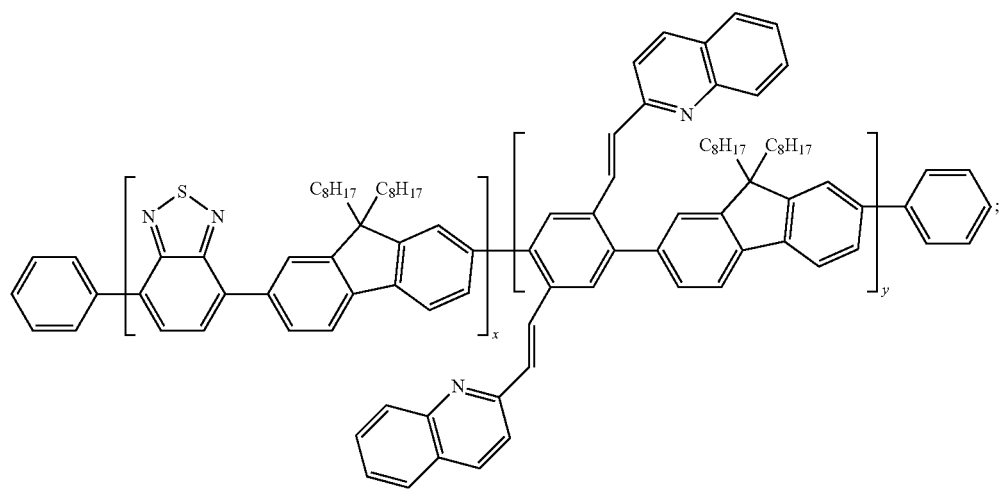
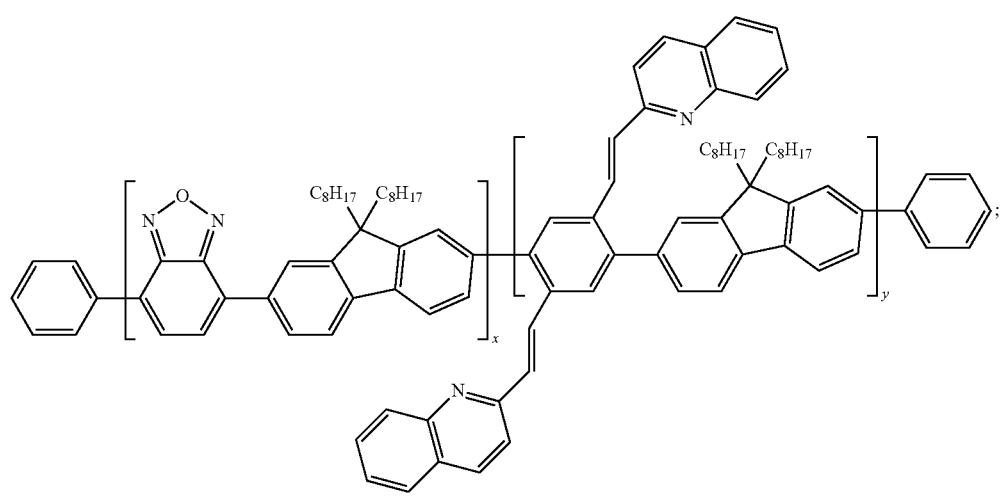

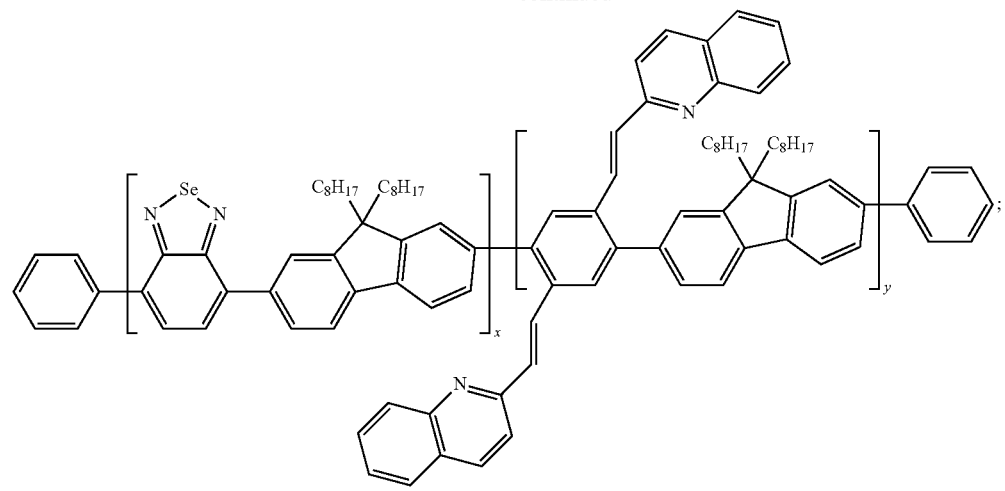
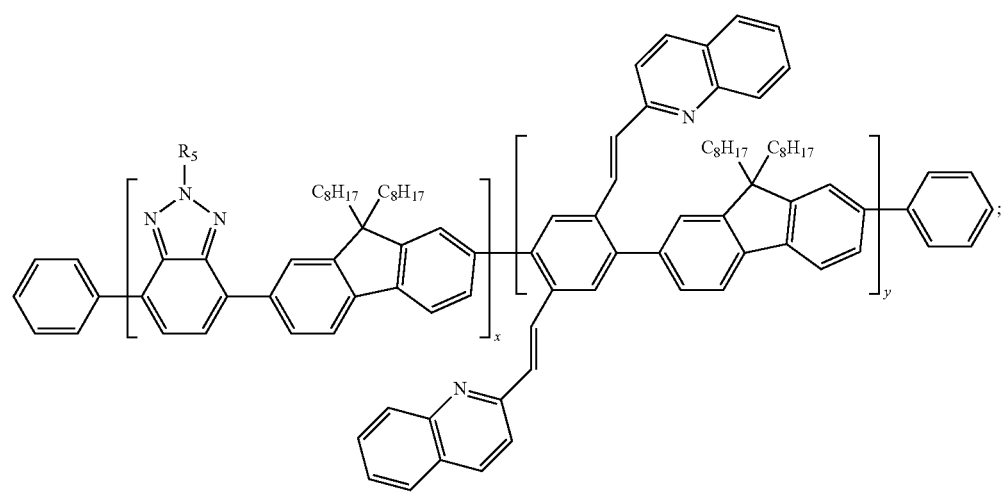
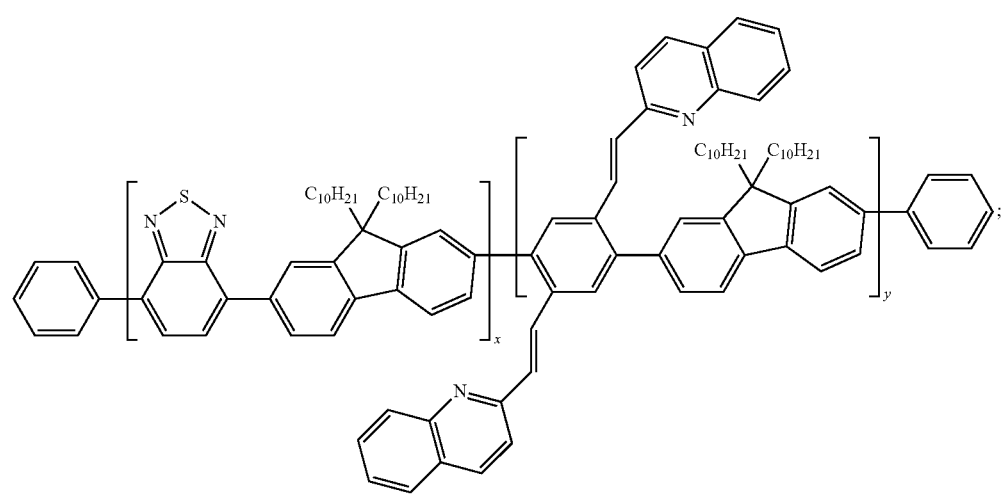

-continued
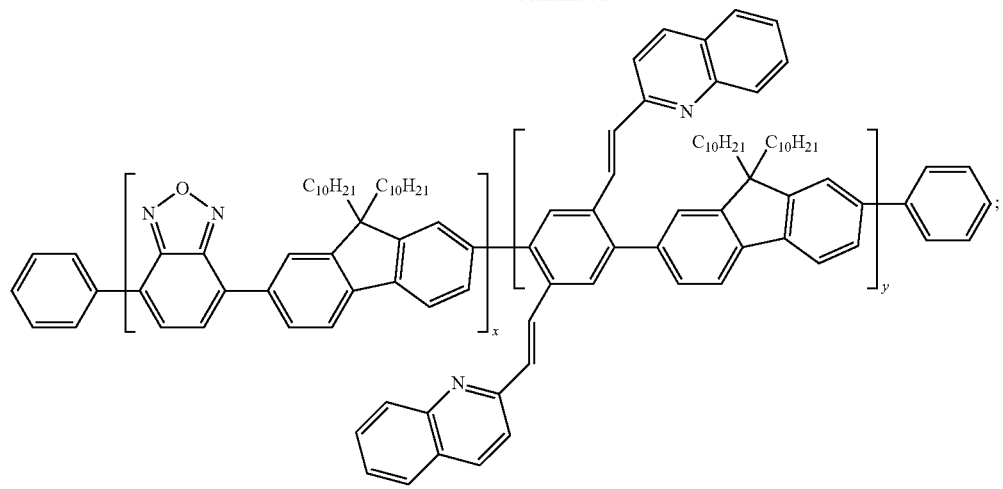
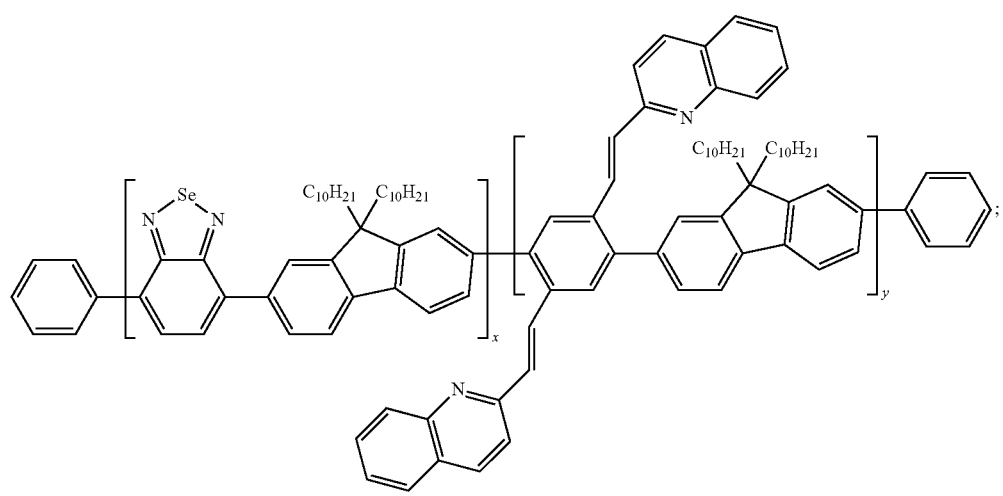
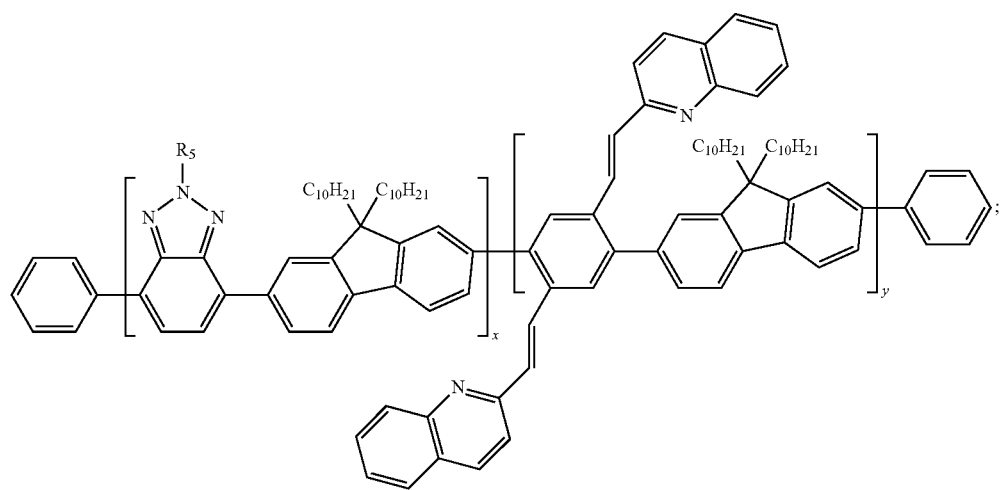

-continued
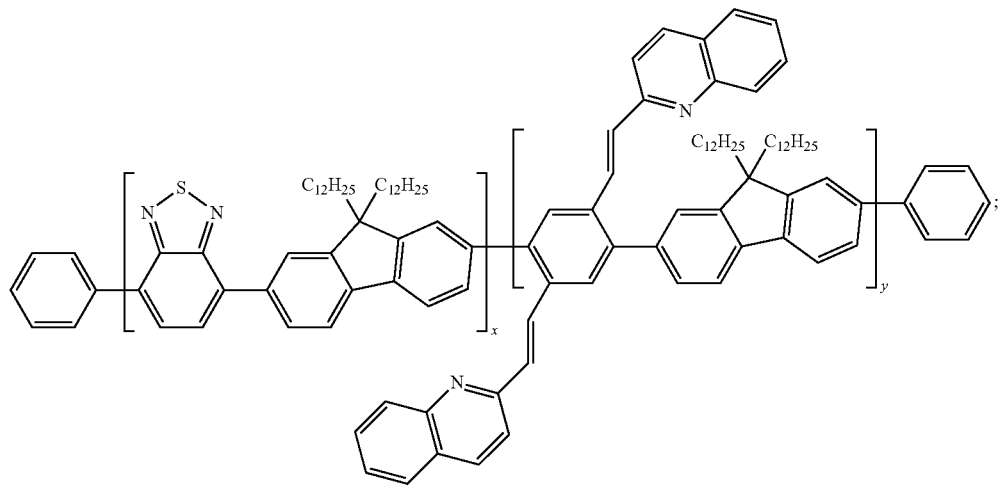
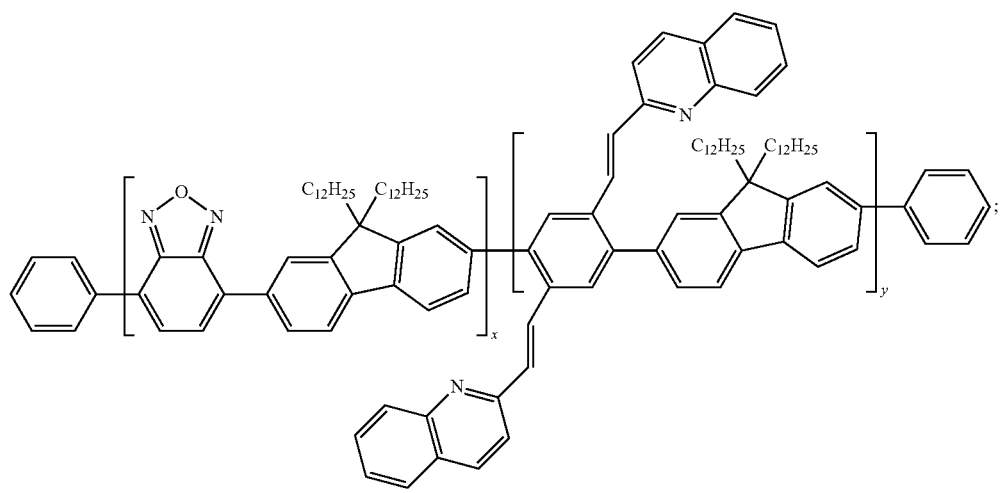
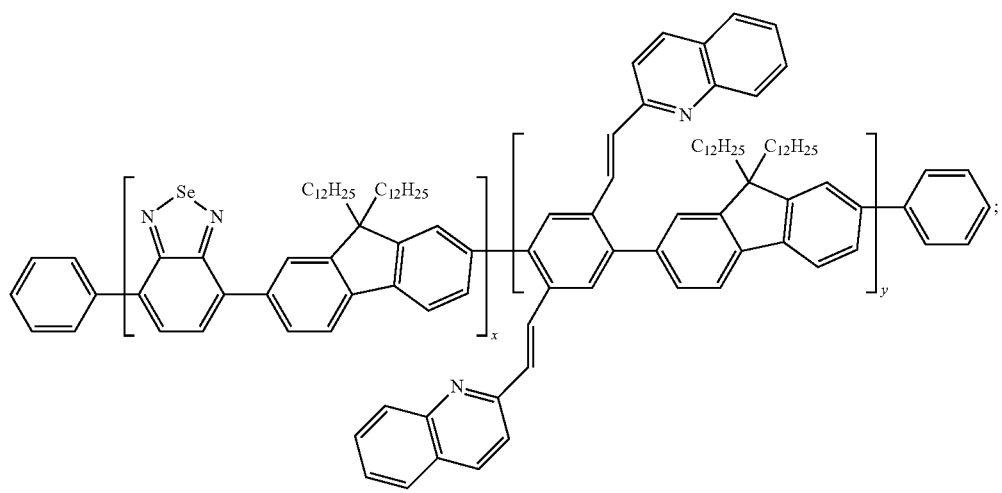

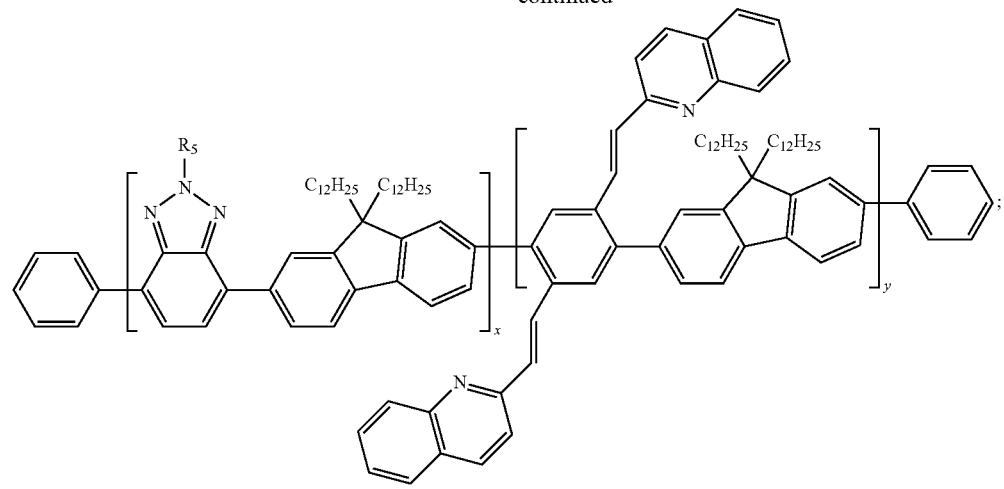
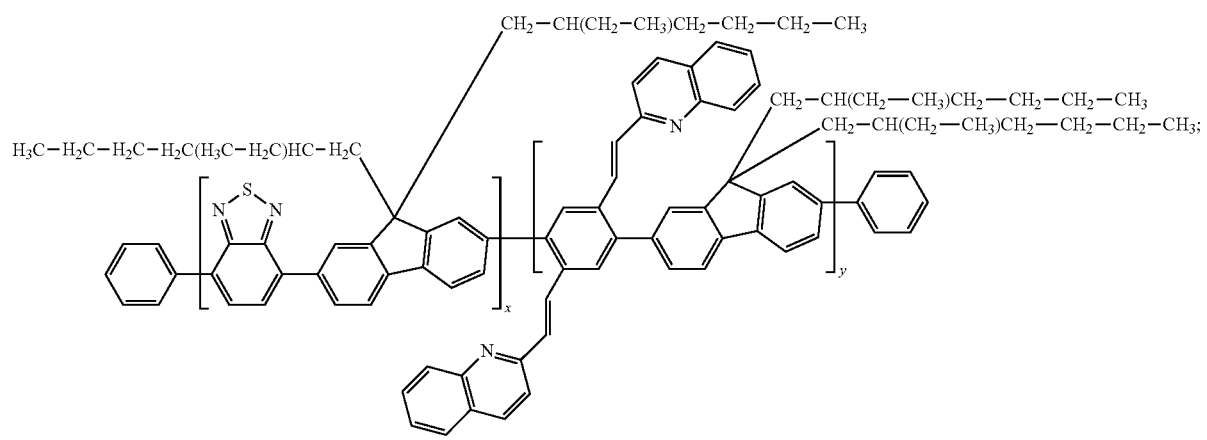
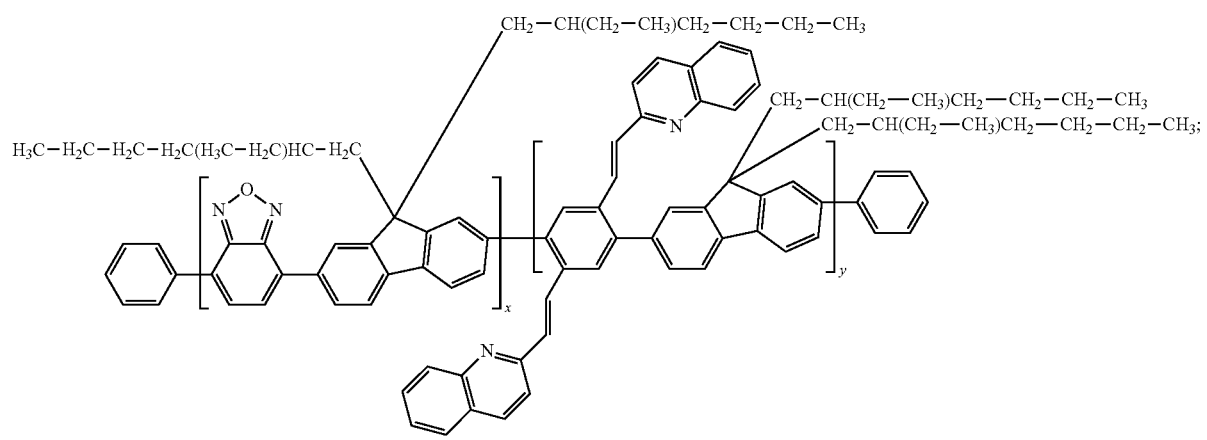

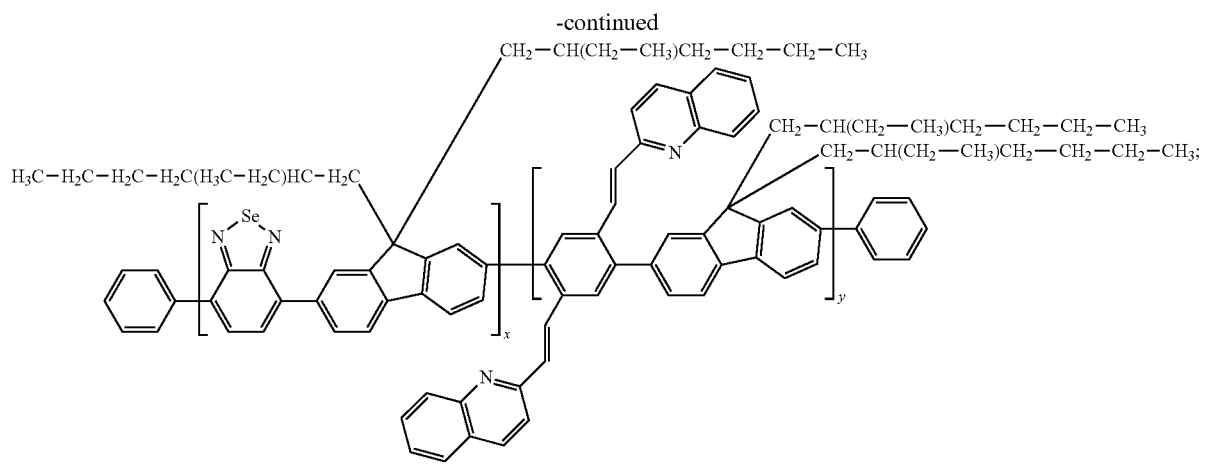
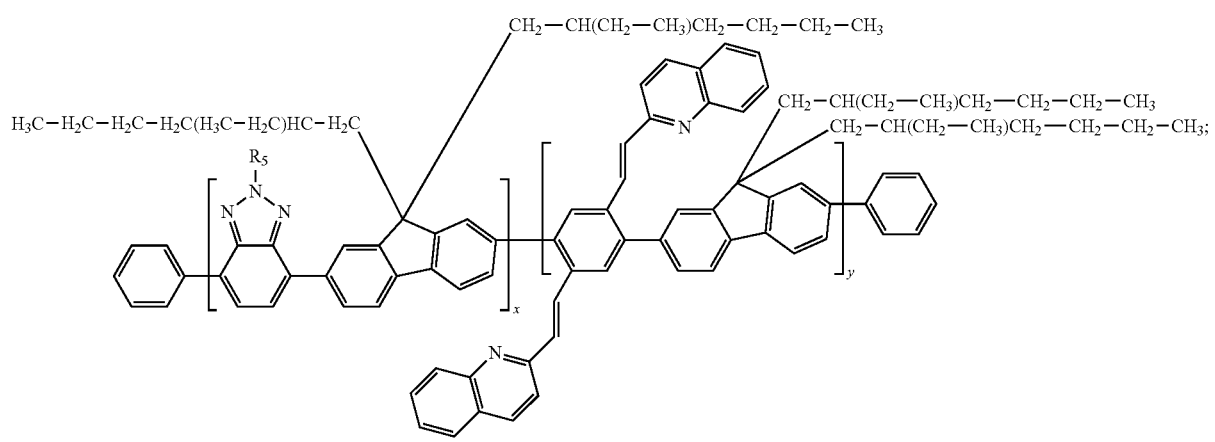
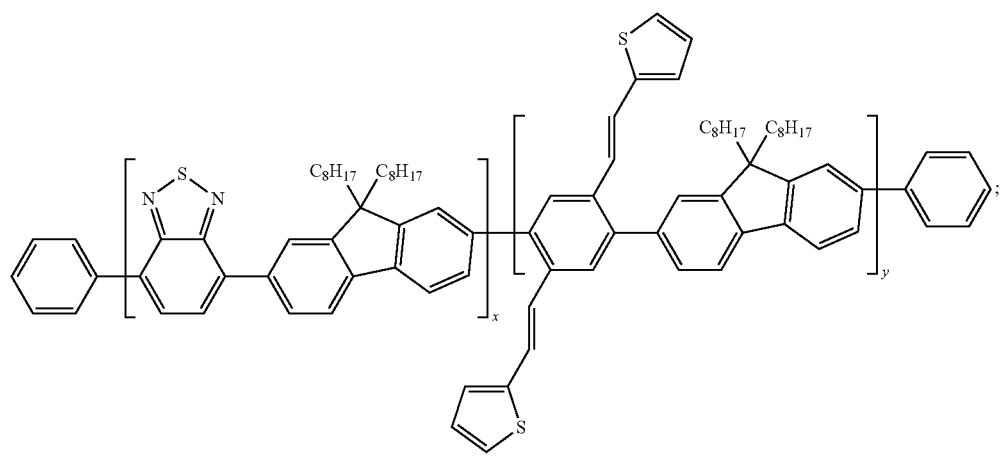

-continued
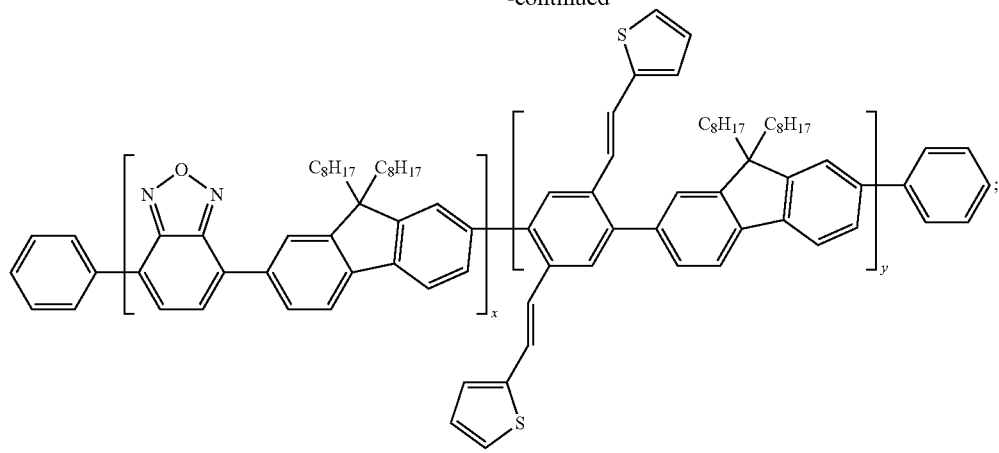
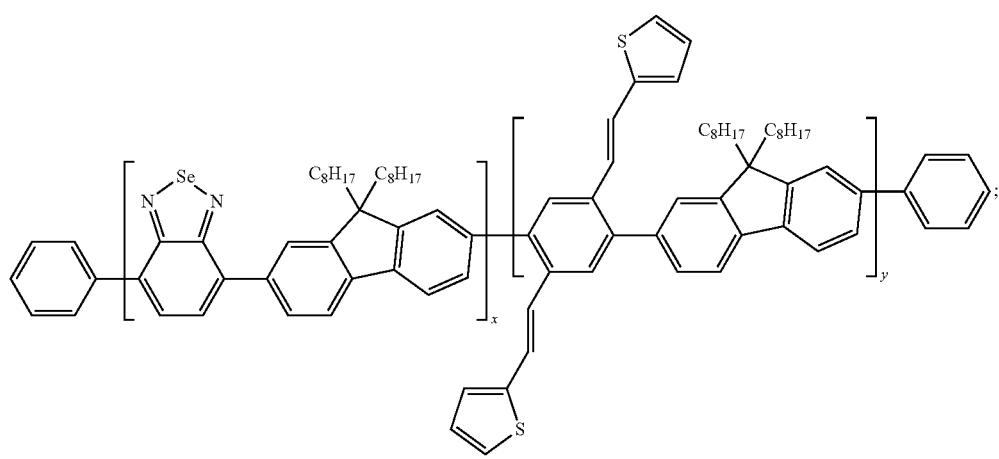
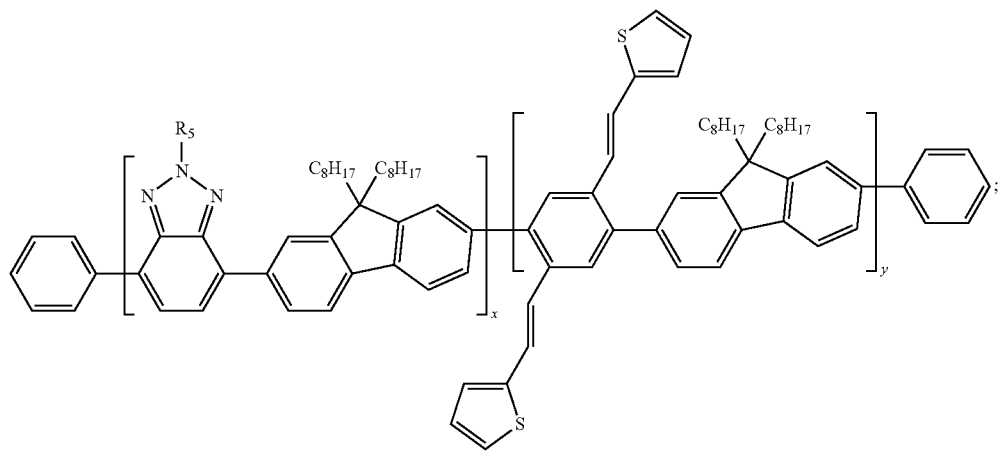

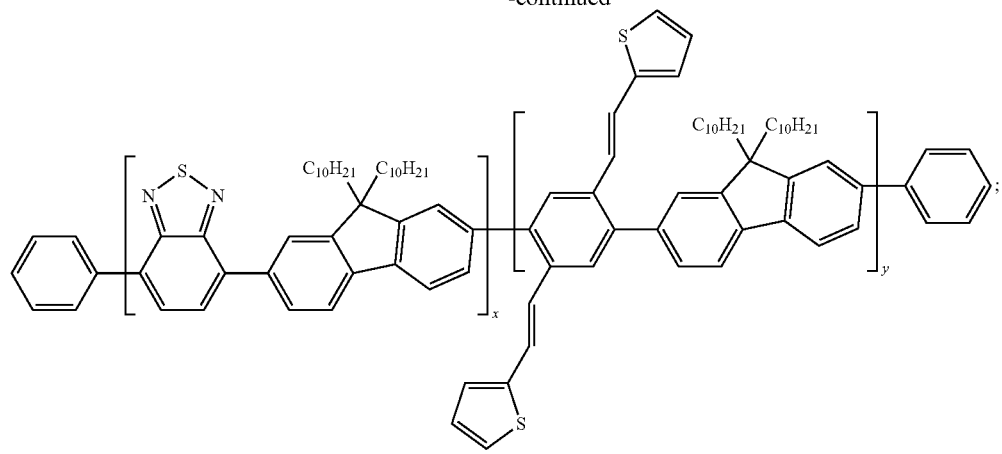
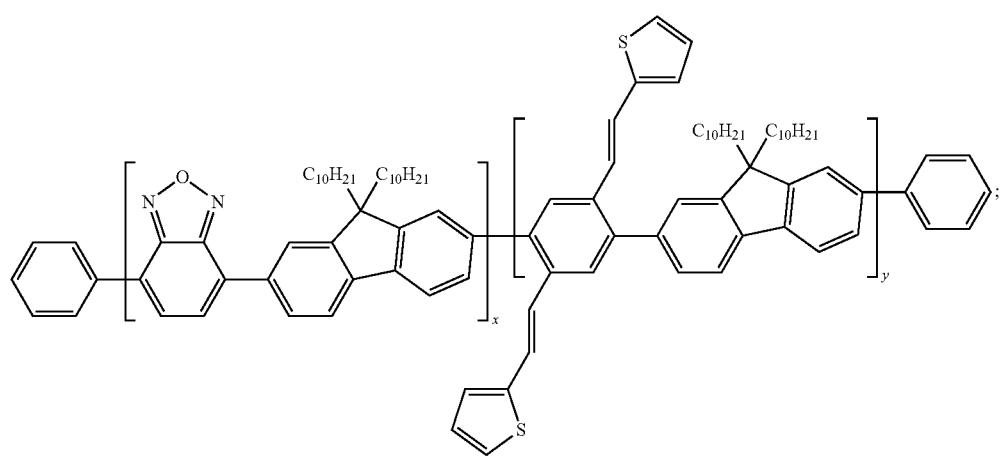
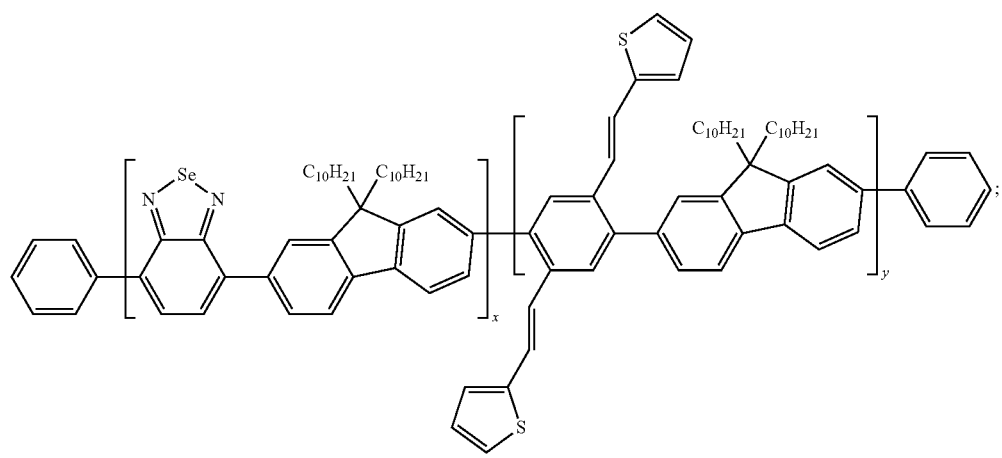

-continued
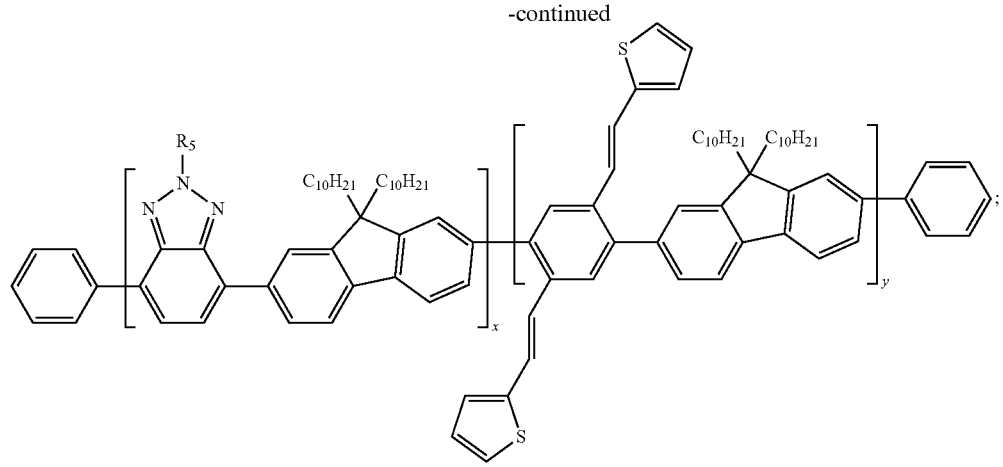
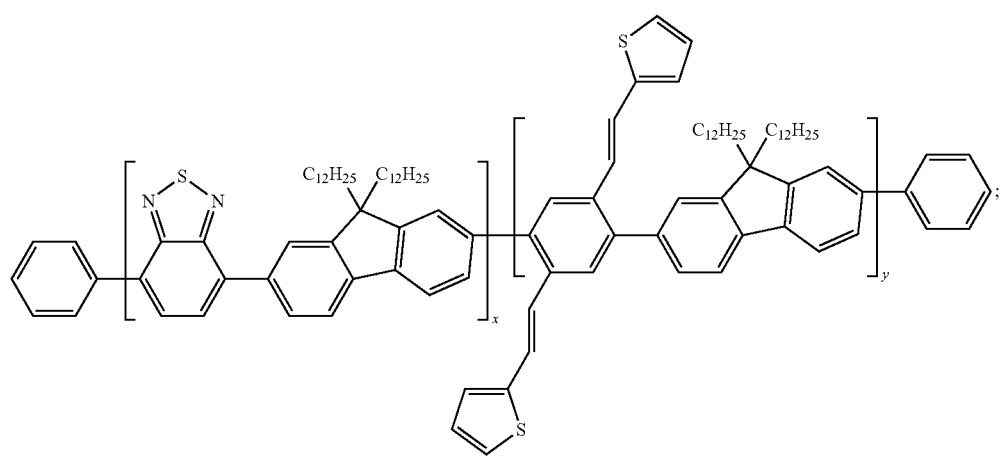
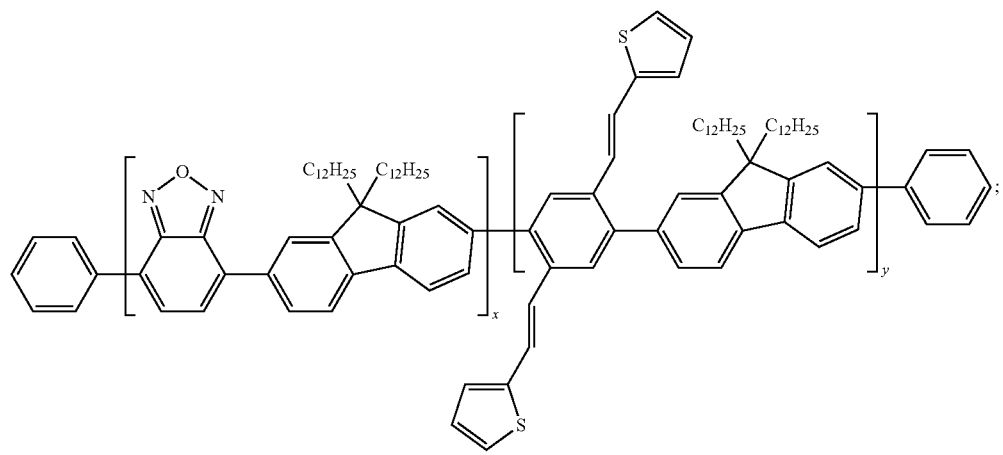

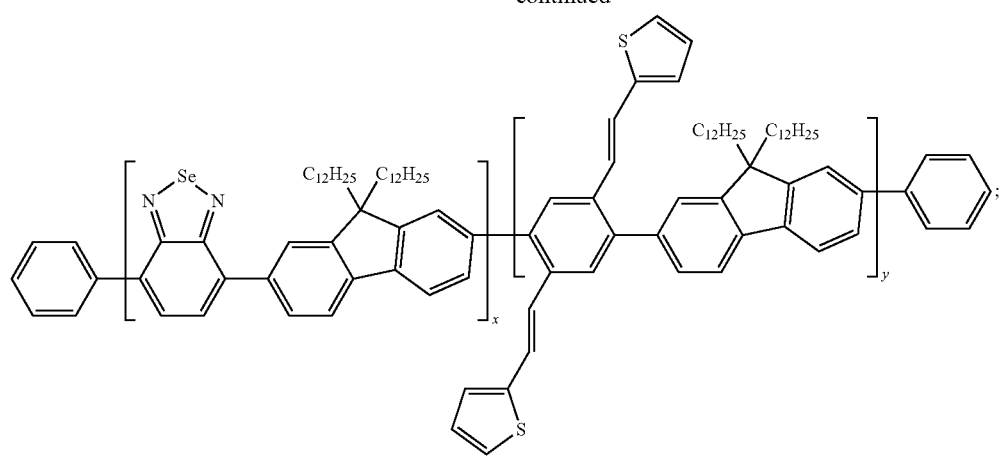
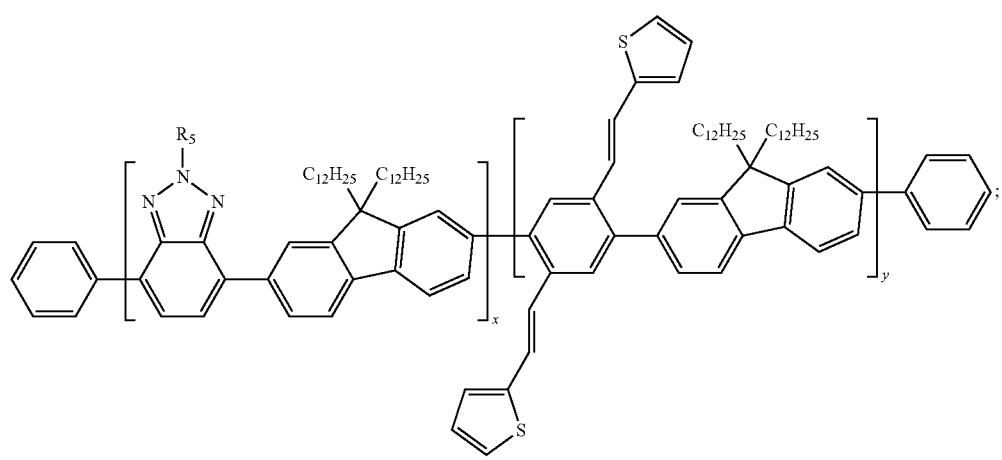
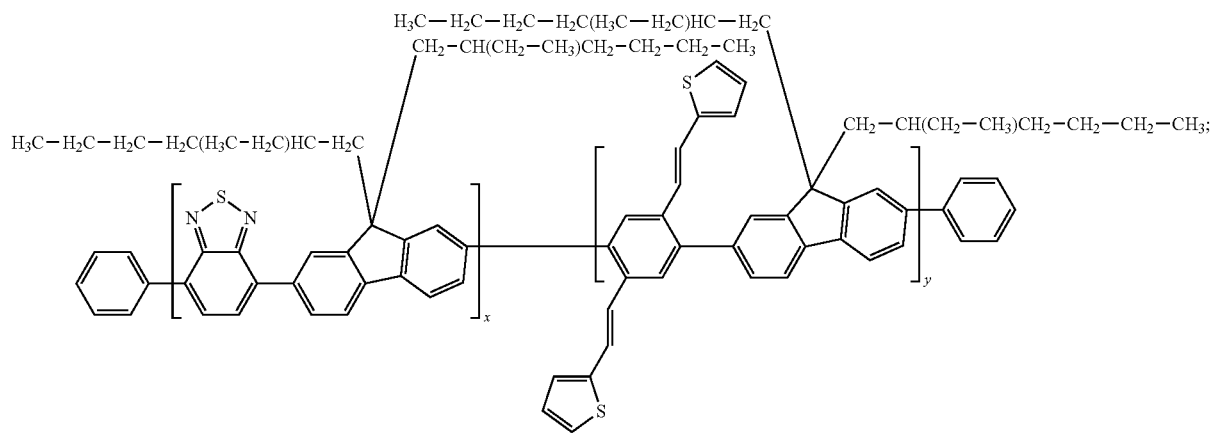

-continued
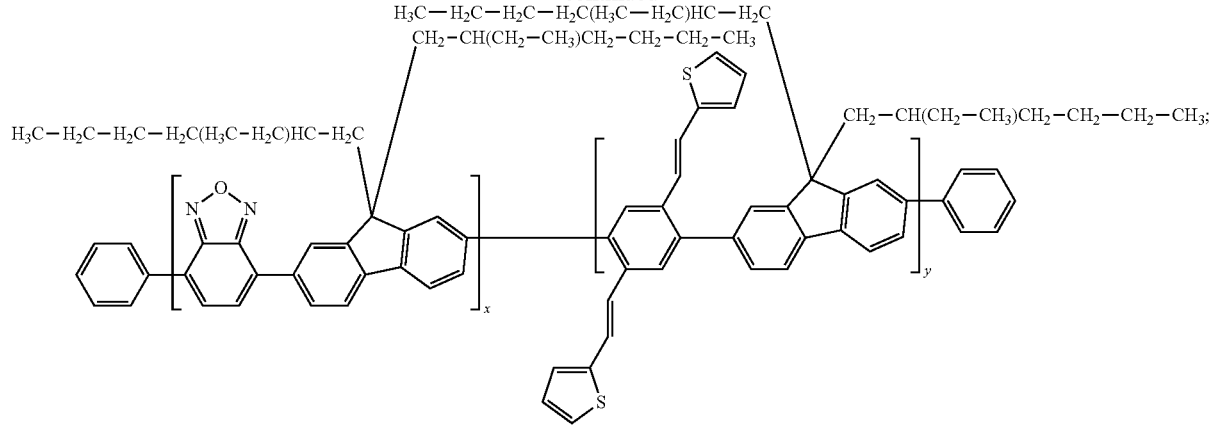
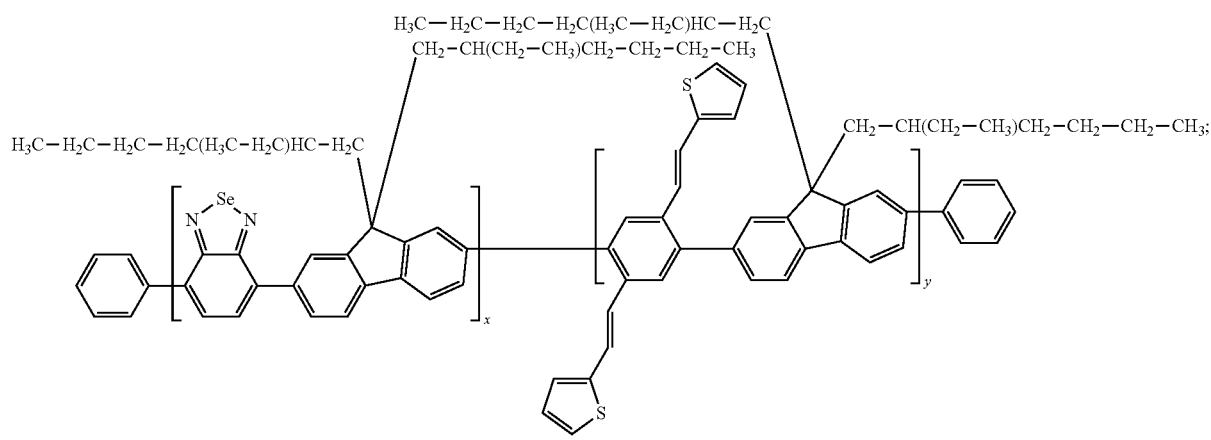
and
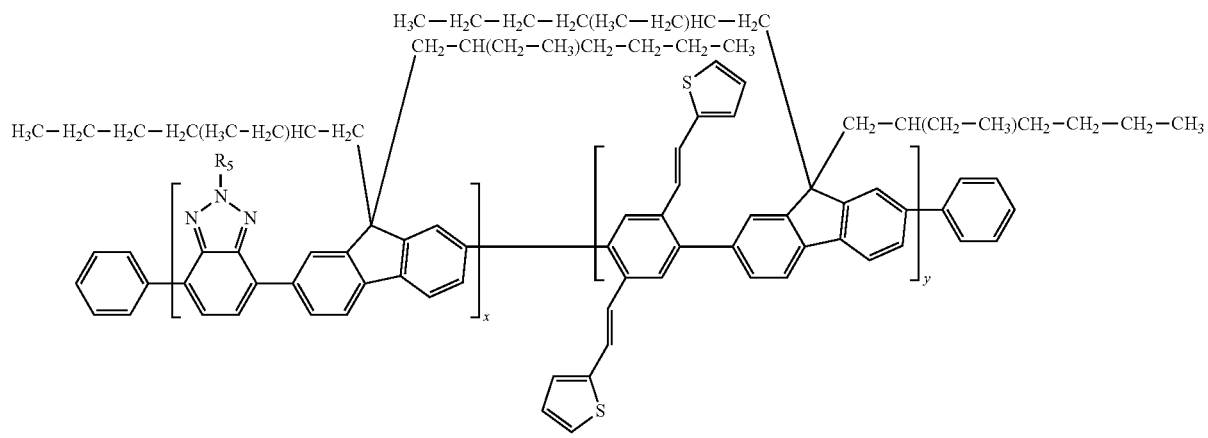

wherein $R_5$ is defined hereinabove and x and y are integers independently ranging from 1 to 10,000.

In some embodiments, a polymer or oligomer described herein comprising repeating units A and C is a conjugated polymer or oligomer of Formula (II):

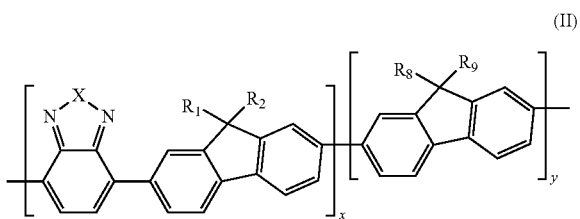

(II)

wherein X, $R_1$, $R_2$, $R_8$ and $R_9$ are defined above and x and y are integers independently ranging from 1 to 10,000. As described herein, in some embodiments, repeating units A and C of a conjugated polymer or oligomer of Formula (II) are arranged to provide an alternating copolymer, a block copolymer, statistical copolymer or a random copolymer.

In some embodiments, a conjugated polymer or oligomer of Formula (II) has a weight average molecular weight ($M_w$) ranging from about 1,000 to about 1,000,000. In some embodiments, a conjugated polymer or oligomer of Formula (II) has a number average molecular weight ($M_n$) ranging from about 500 to about 500,000.

In some embodiments, a conjugated polymer or oligomer of Formula (II) described herein is selected from the group consisting of:

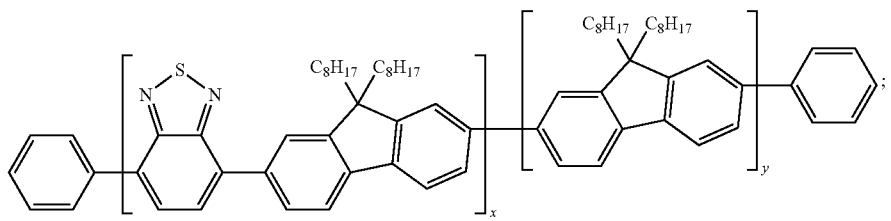;

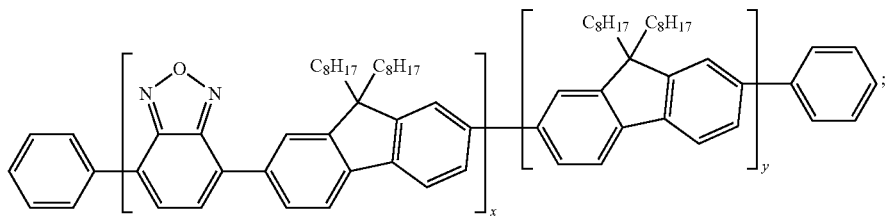;

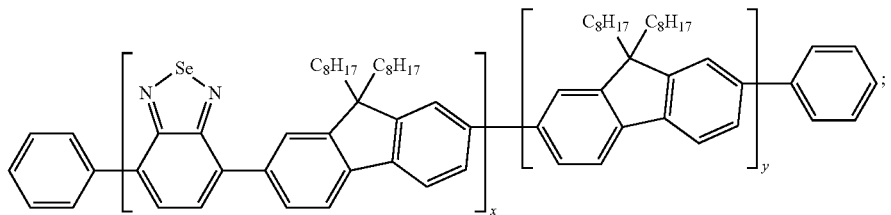;

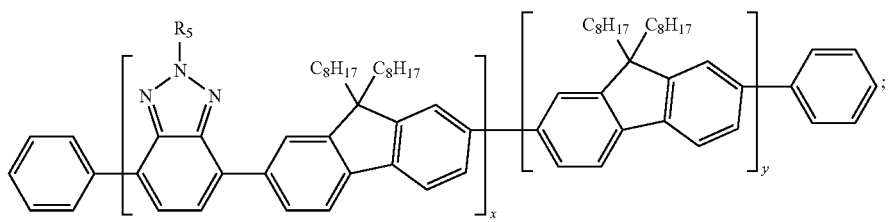;

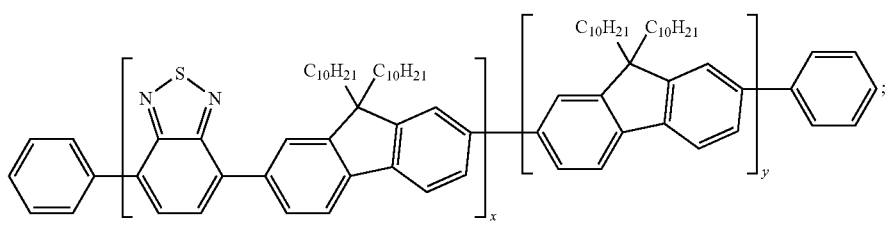;

-continued
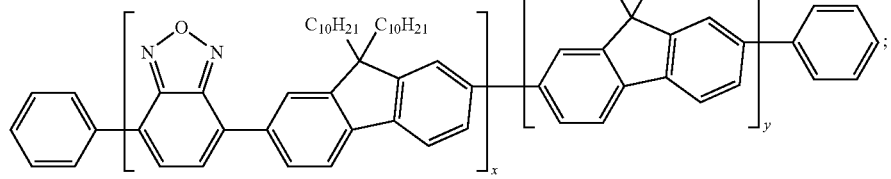
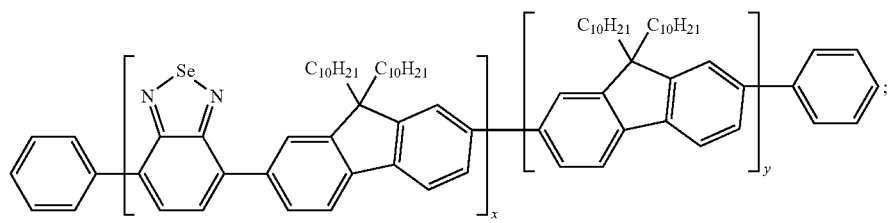
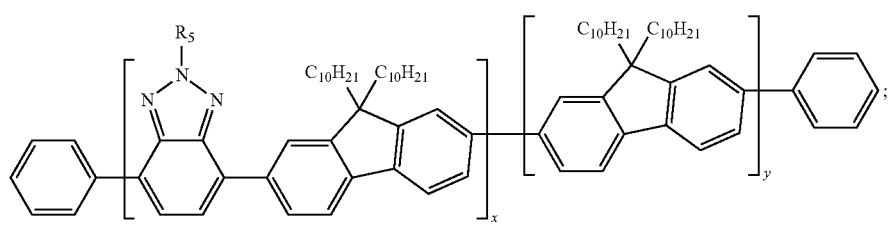
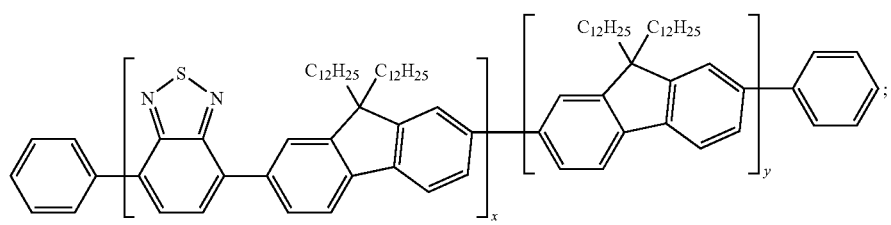
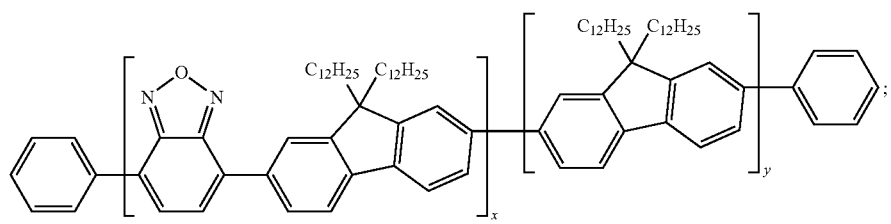
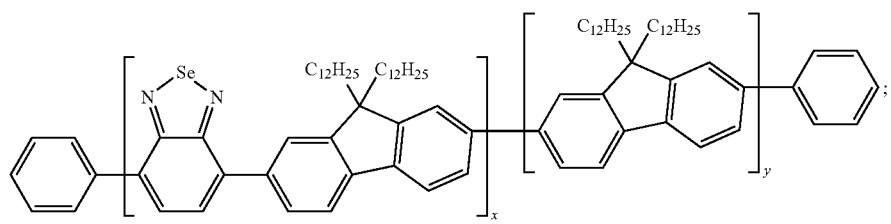
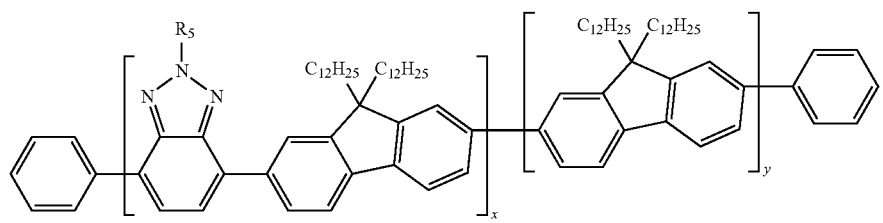

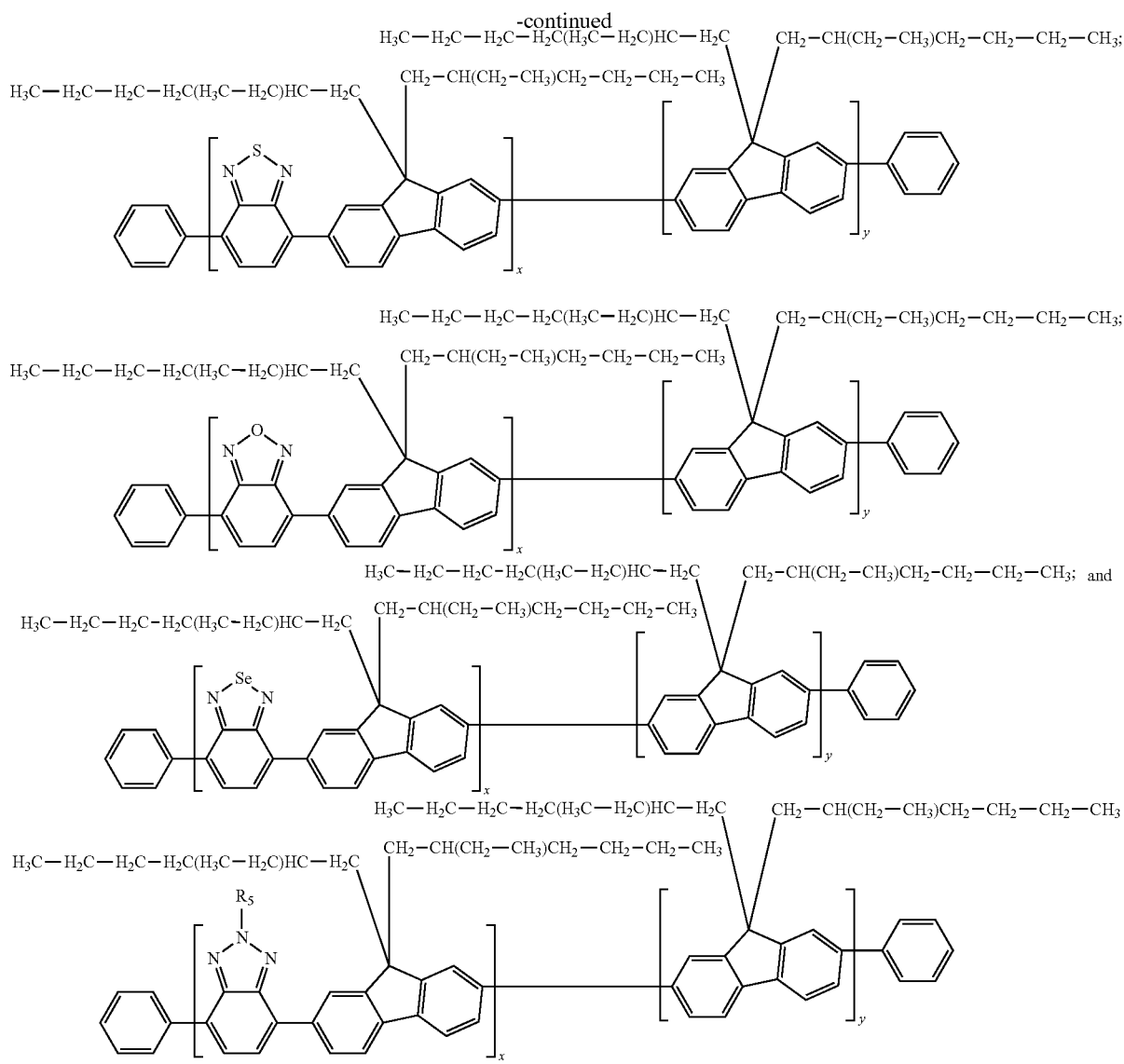

wherein $R_5$ is defined hereinabove and x and y are integers independently ranging from 1 to 10,000.

In some embodiments, a polymer or oligomer described herein comprising repeating units B and C is a conjugated polymer or oligomer of Formula (III):

wherein $R_3$, $R_4$, $R_6$, $R_7$, $R_8$ and $R_9$ are defined above and x and y are integers independently ranging from 1 to 10,000.

As described herein, in some embodiments, repeating units B and C of a conjugated polymer or oligomer of Formula

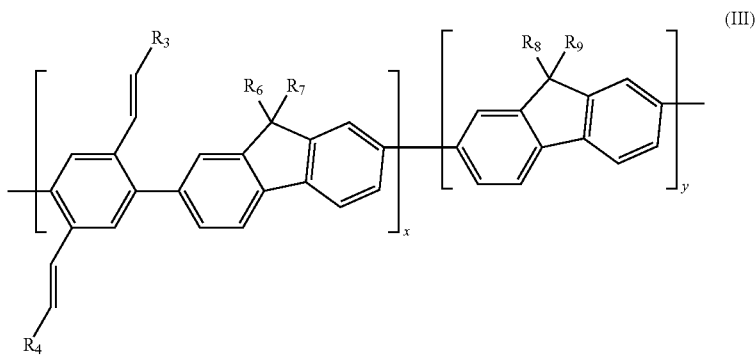

(III) are arranged to provide an alternating copolymer, a block copolymer, statistical copolymer or a random copolymer.

In some embodiments, a conjugated polymer or oligomer of Formula (III) has a weight average molecular weight ($M_w$) ranging from about 1,000 to about 1,000,000. In some embodiments, a conjugated polymer or oligomer of Formula (III) has a number average molecular weight ($M_n$) ranging from about 500 to about 500,000.

In some embodiments, a conjugated polymer or oligomer of Formula (III) described herein is selected from the group consisting of:

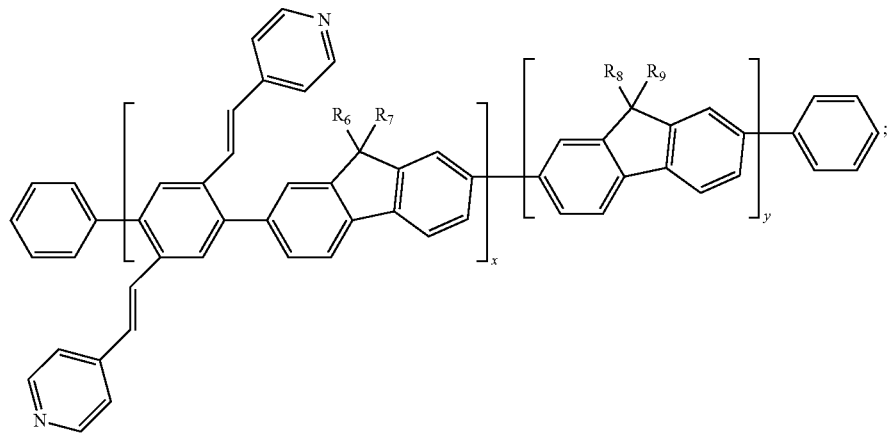

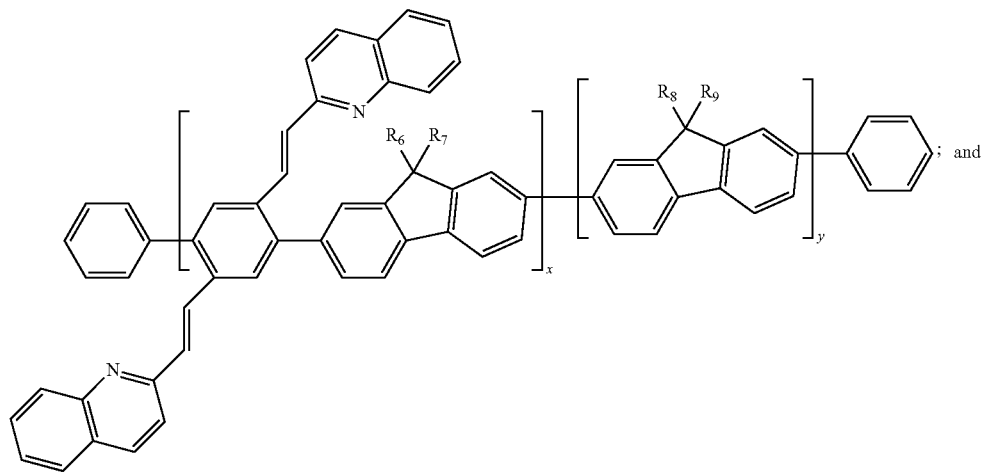

; and

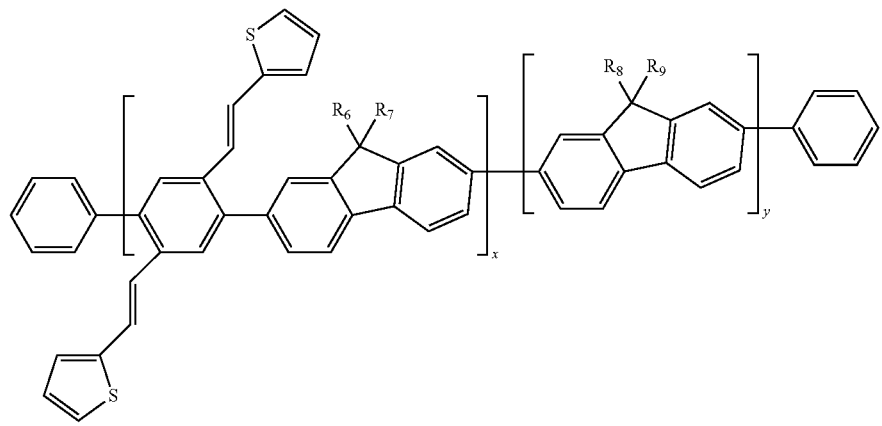

wherein $R_6$, $R_7$, $R_8$ and $R_9$ are defined above and x and y are integers independently ranging from 1 to 10,000,
In some embodiments, a conjugated polymer or oligomer of Formula (III) described herein is selected from the group consisting of:
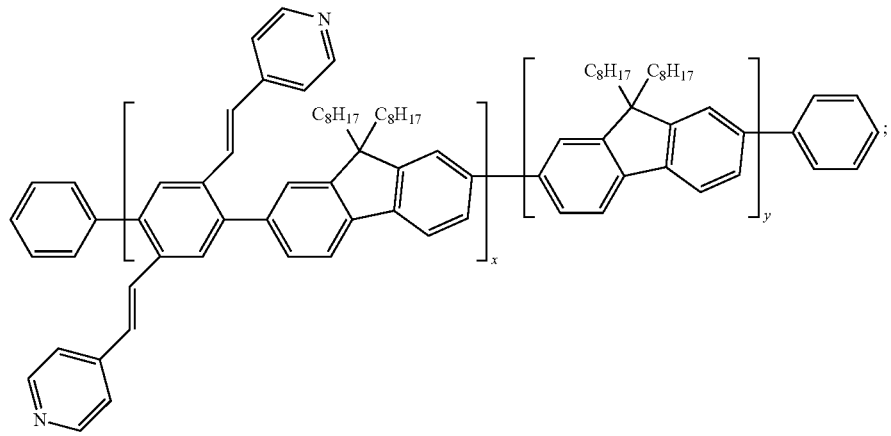
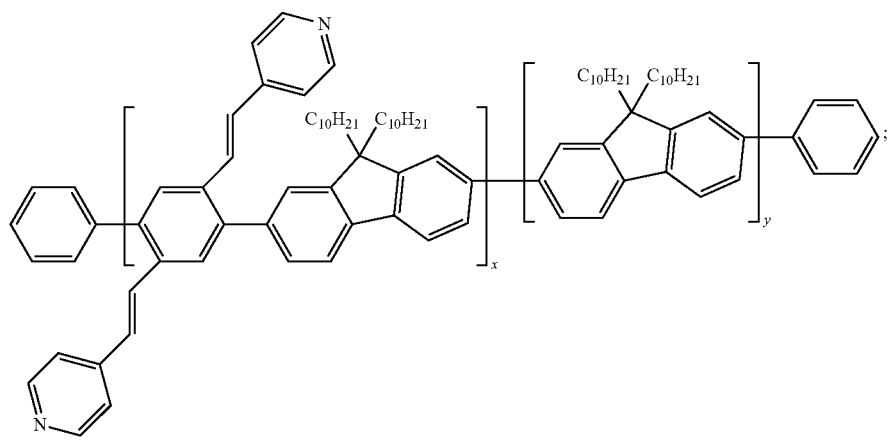
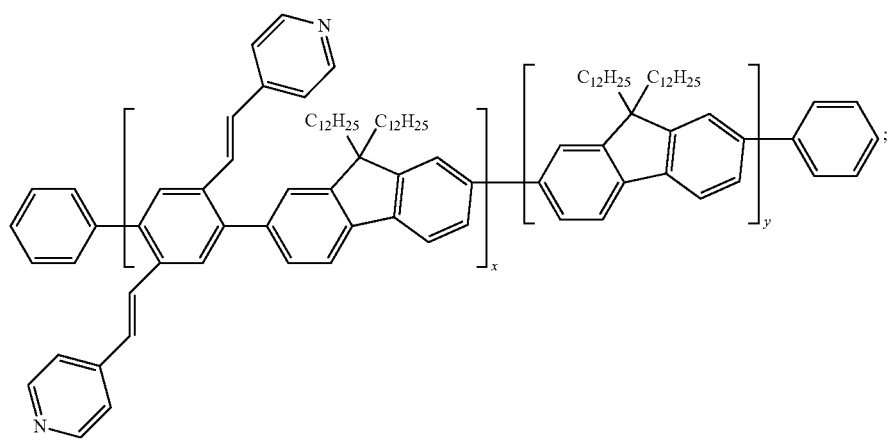

-continued
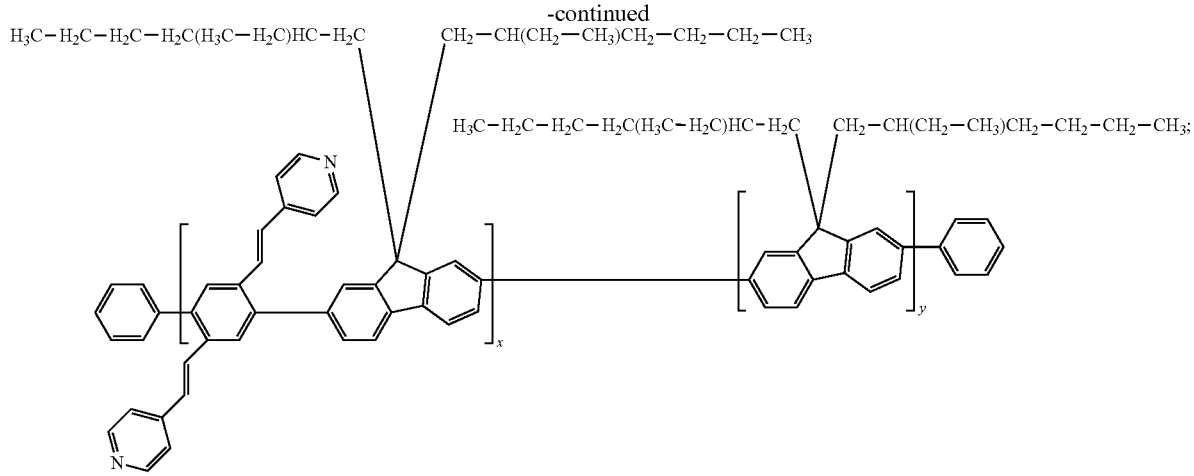
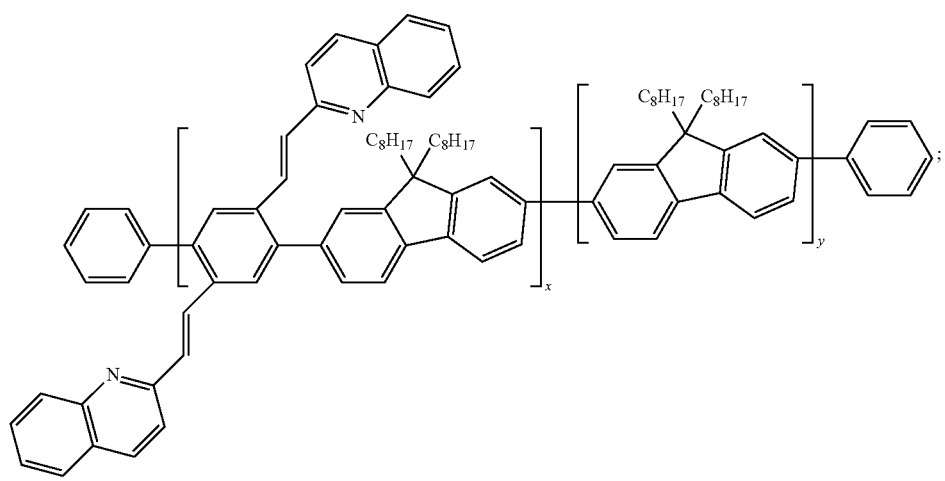
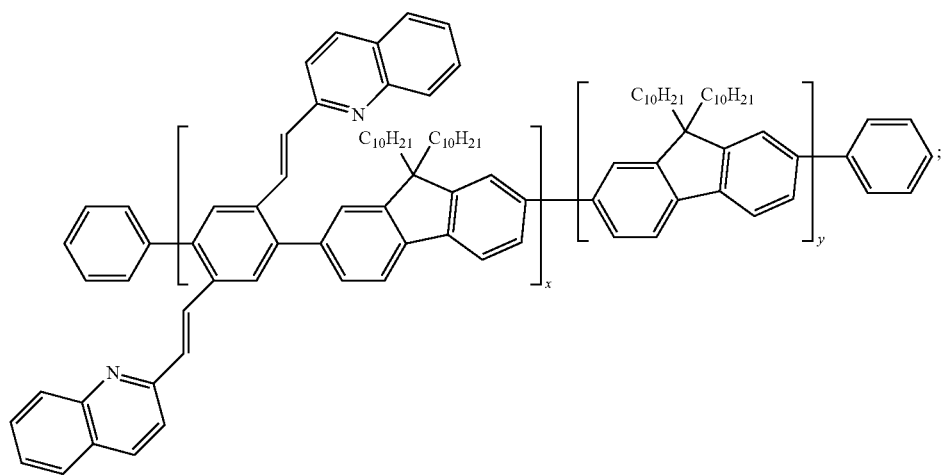

-continued
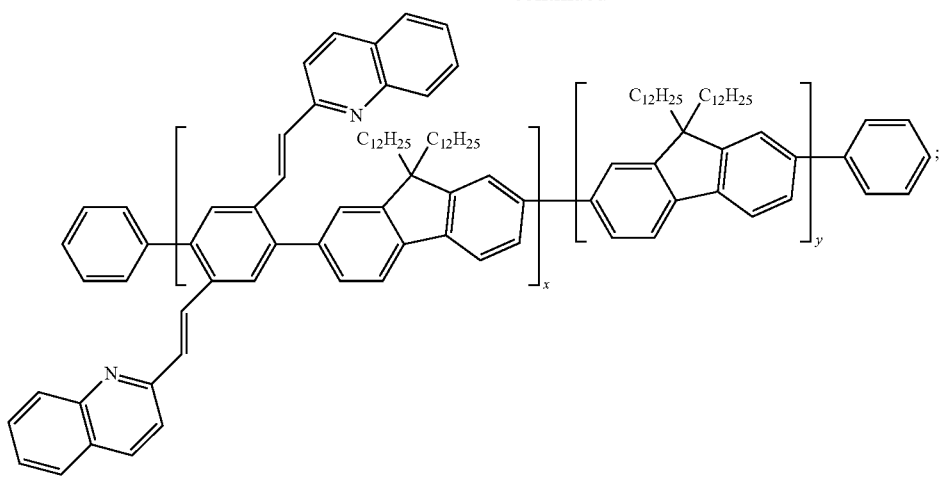
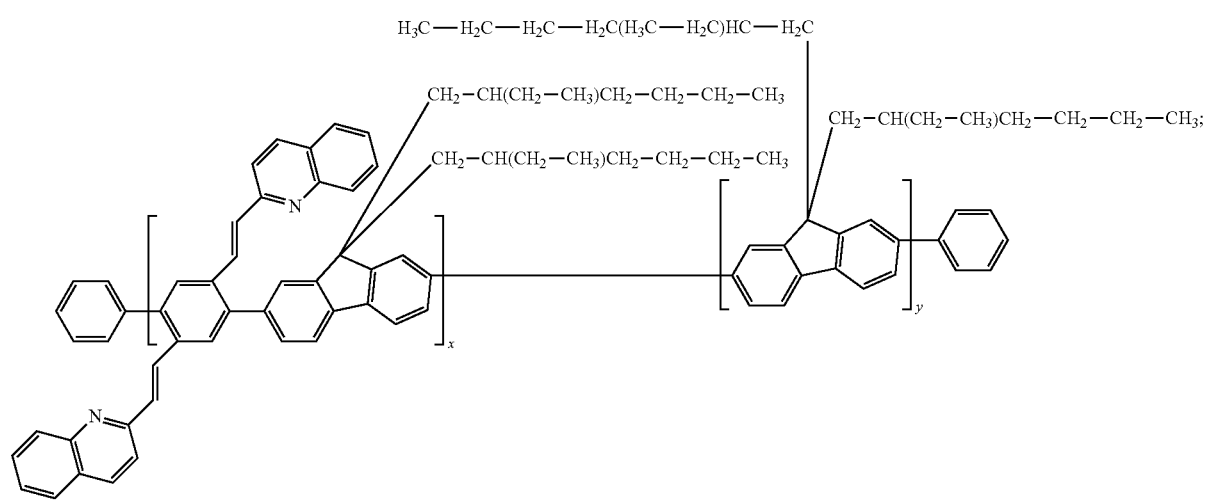
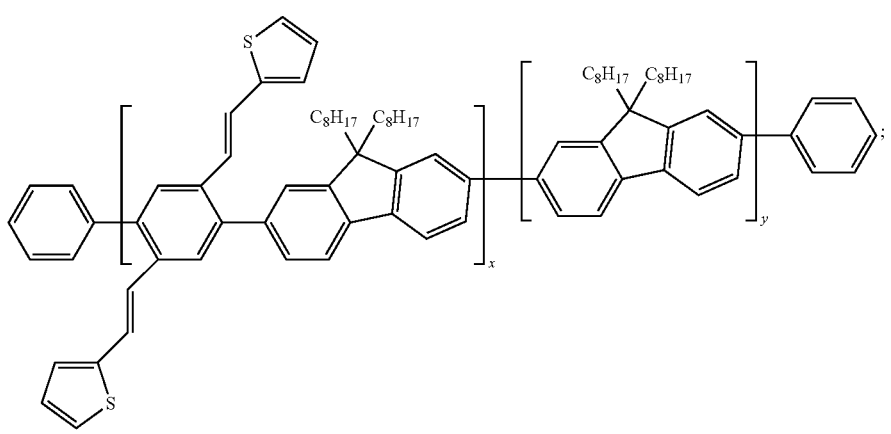

-continued
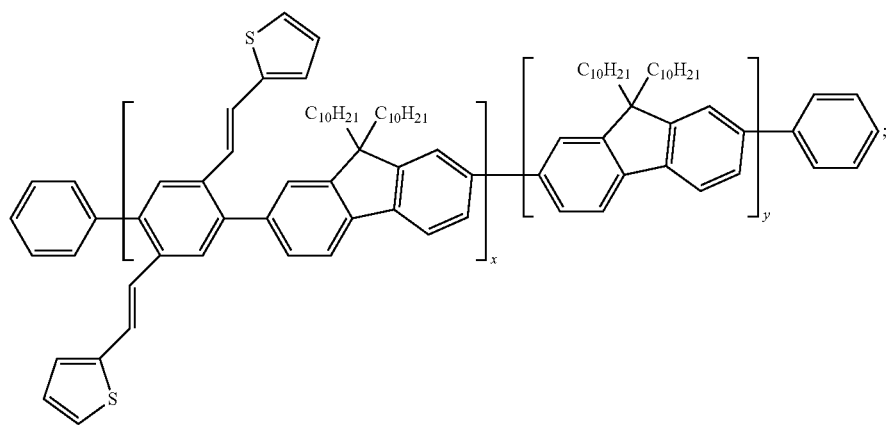
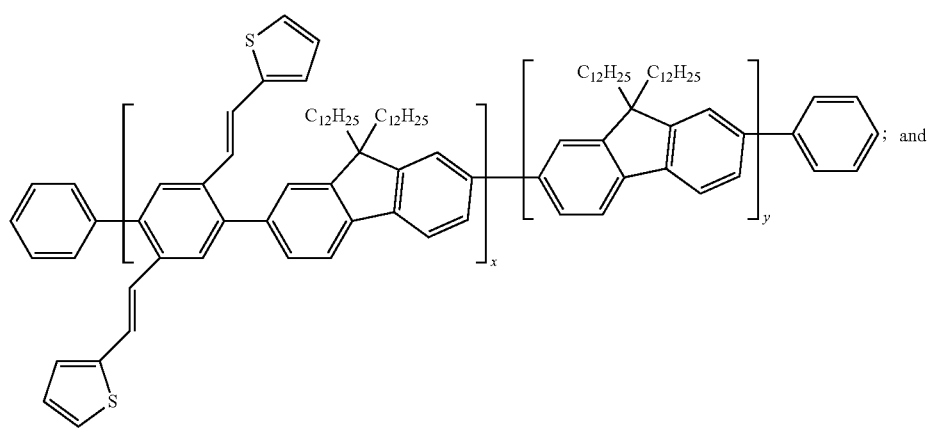
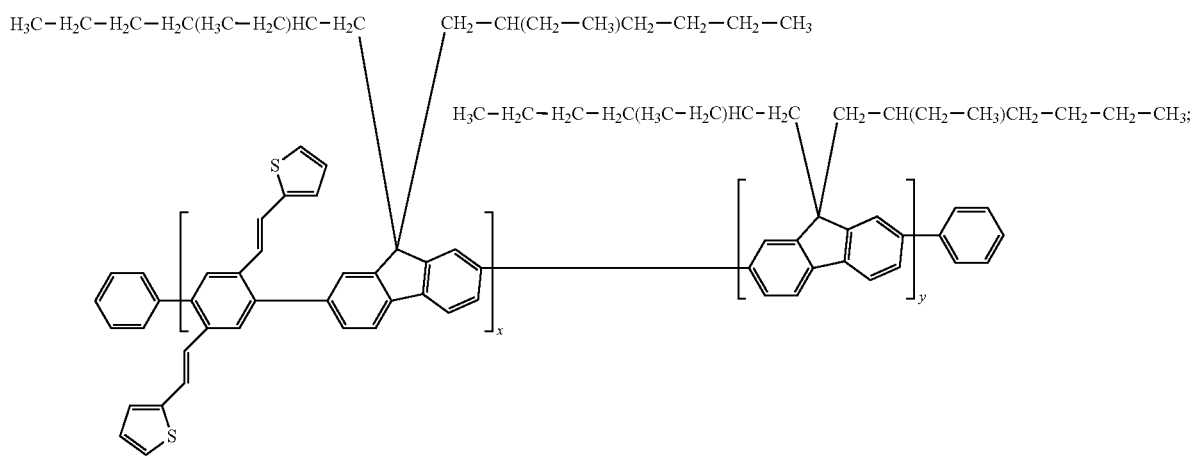

wherein x and y are integers independently ranging from 1 to 10,000.

In some embodiments, a polymer or oligomer described herein comprising repeating units A, B and C is a conjugated polymer or oligomer of Formula (IV):

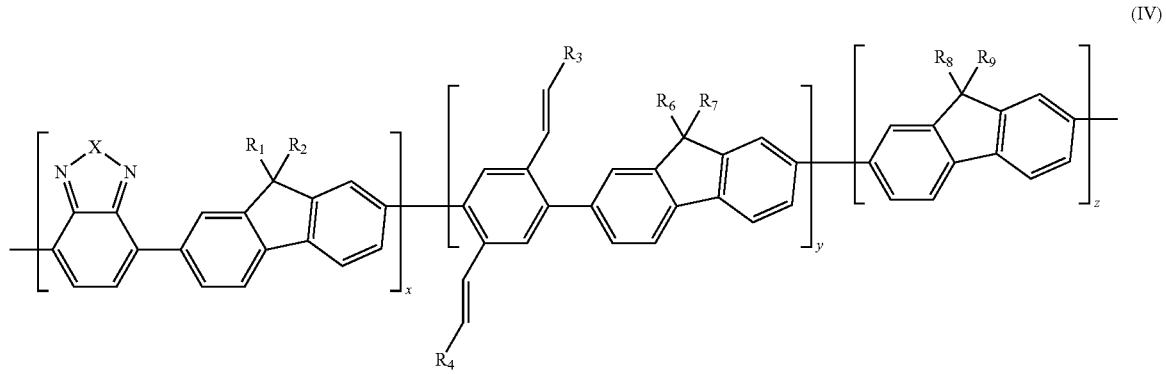

(IV)

wherein X, $R_1$, $R_2$, $R_3$, $R_4$, $R_6$, $R_7$, $R_8$ and $R_9$ are defined above and x, y and z are integers independently ranging from 1 to 10,000. As described herein, in some embodiments, repeating units A, B and C of a conjugated polymer or oligomer of Formula (IV) are arranged to provide an alternating copolymer, a block copolymer, statistical copolymer or a random copolymer.

In some embodiments, a conjugated polymer or oligomer of Formula (IV) has a weight average molecular weight ($M_w$) ranging from about 1,000 to about 1,000,000. In some embodiments, a conjugated polymer or oligomer of Formula (IV) has a number average molecular weight ($M_n$) ranging from about 500 to about 500,000.

In some embodiments, a conjugated polymer of oligomer of Formula (IV) described herein is selected from the group consisting of:

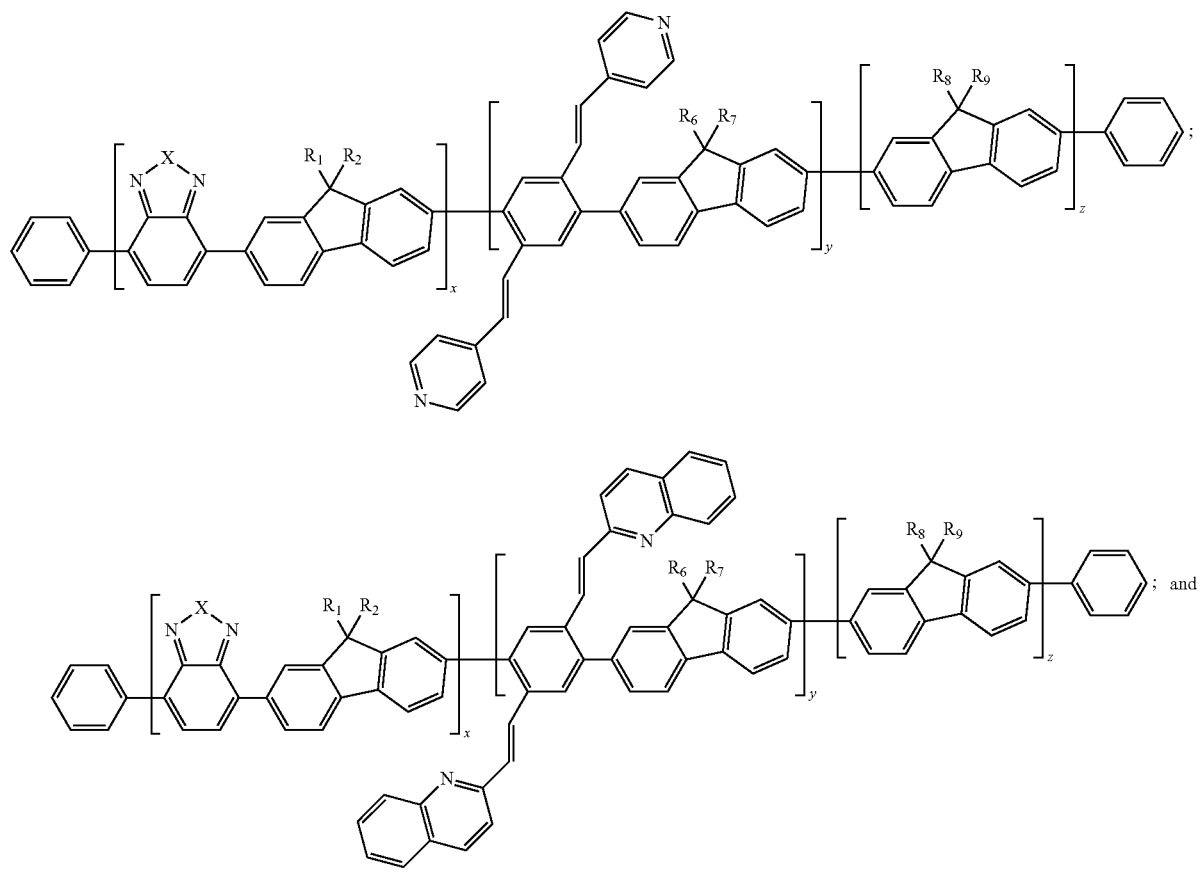

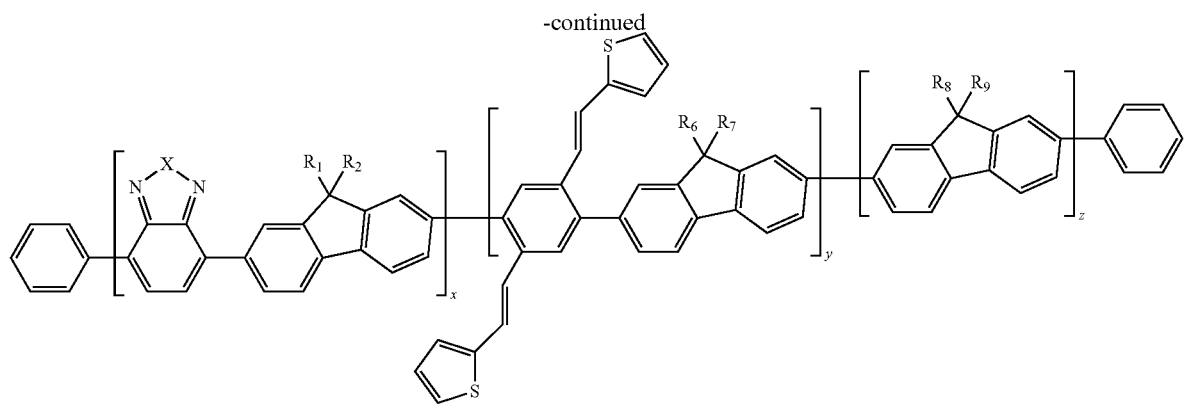
wherein X, $R_1$, $R_2$, $R_6$, $R_7$, $R_8$ and $R_9$ are defined above and x, y and z are integers independently ranging from 1 to 10,000.
In some embodiments, a conjugated polymer or oligomer of Formula (IV) described herein is selected from the group consisting of:
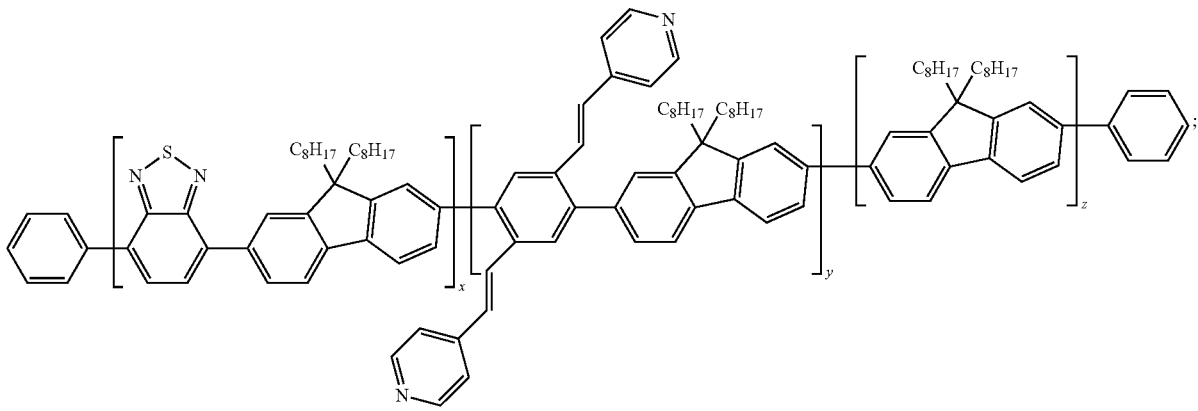
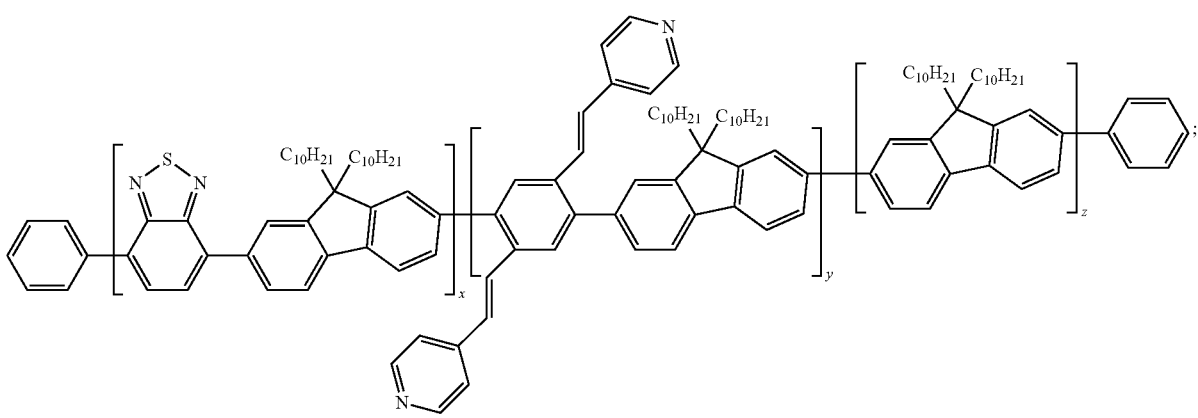

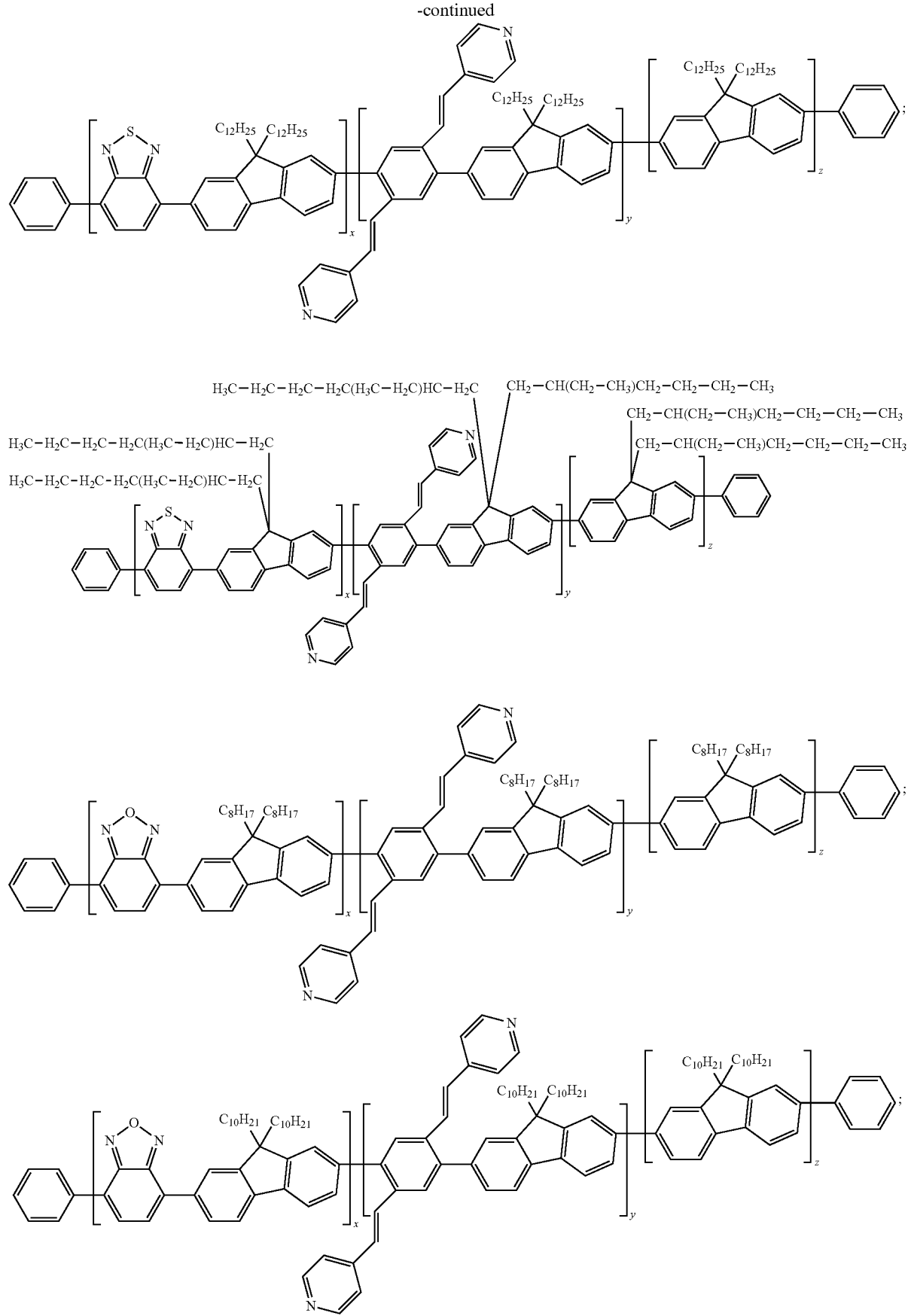

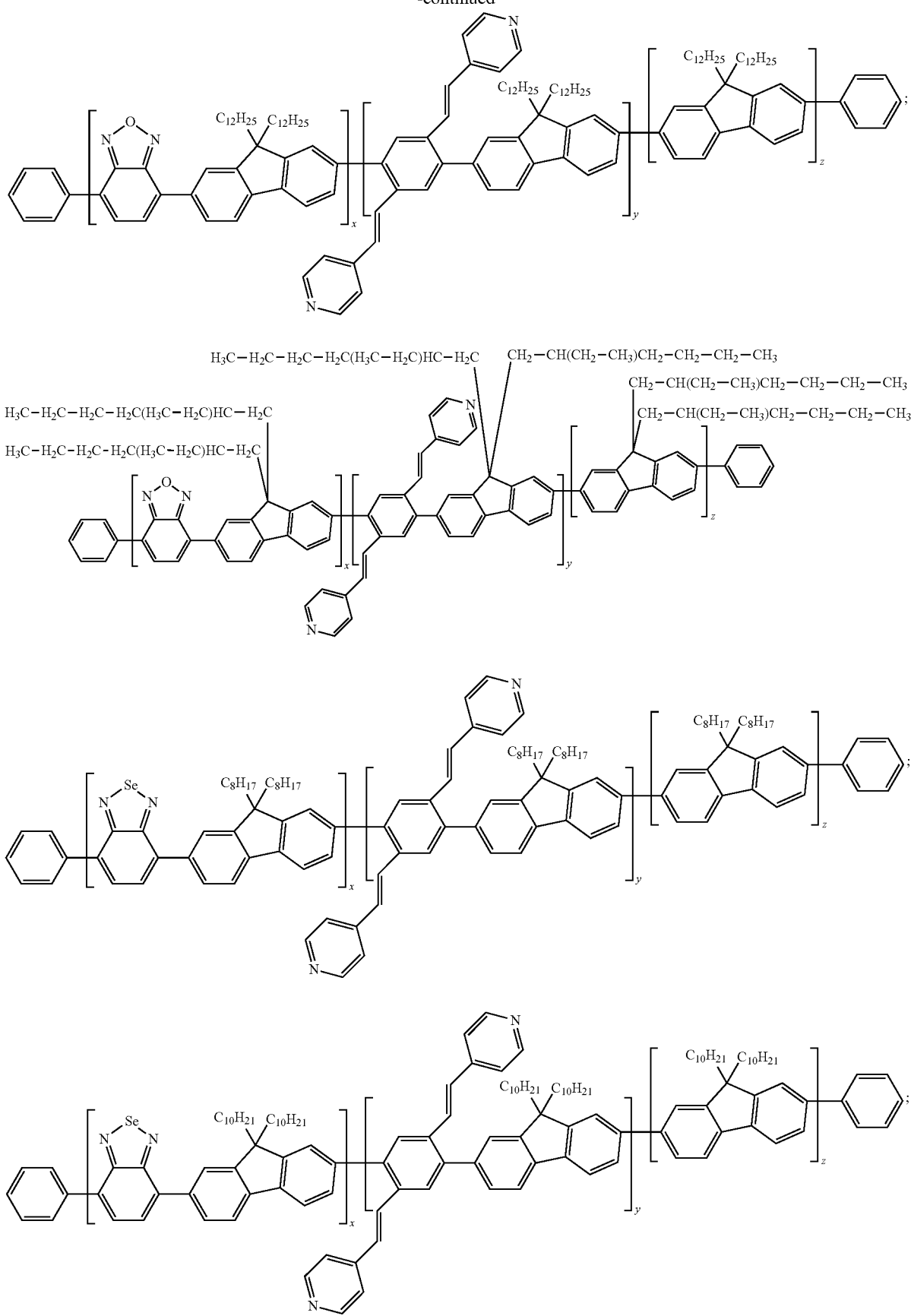

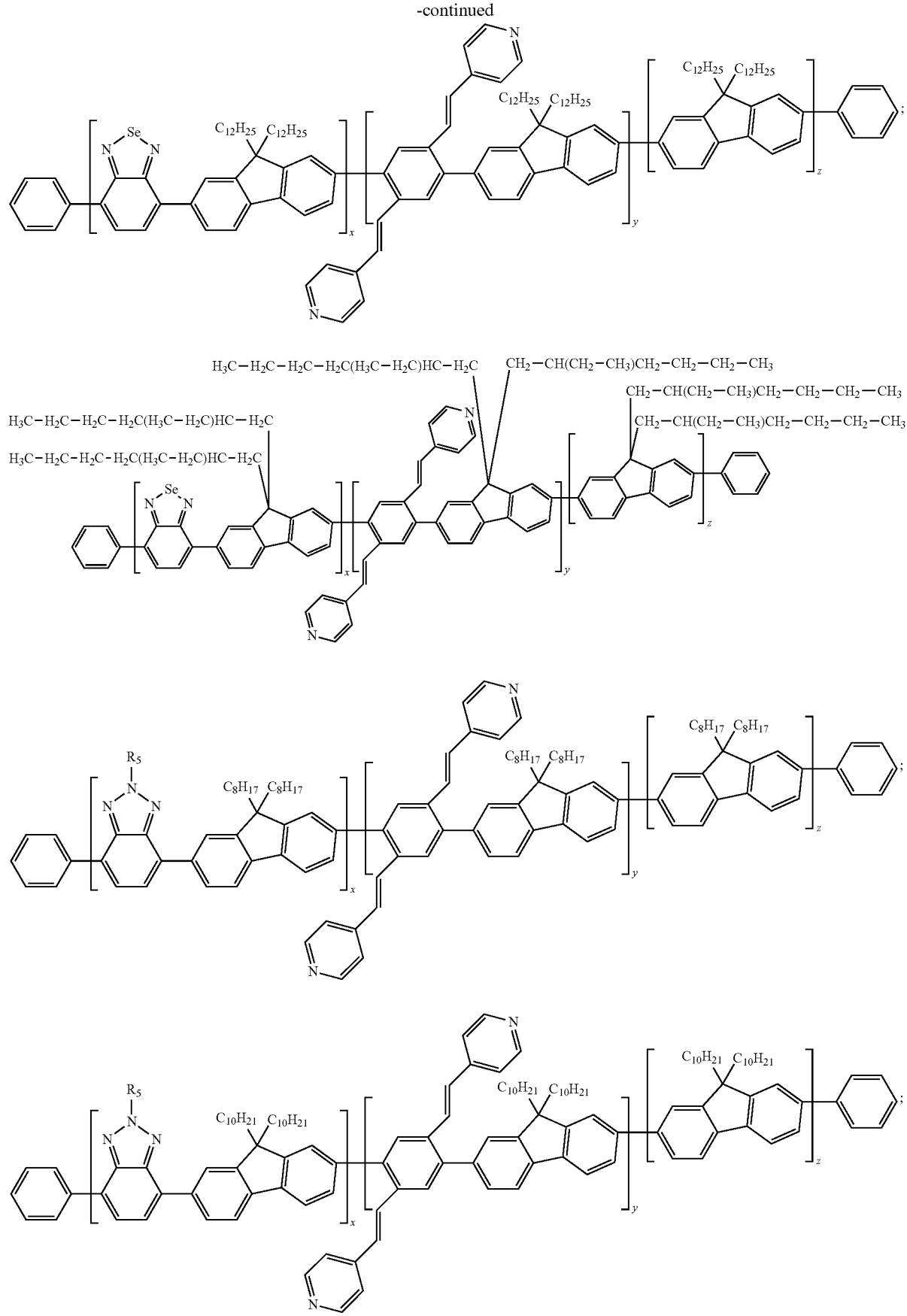

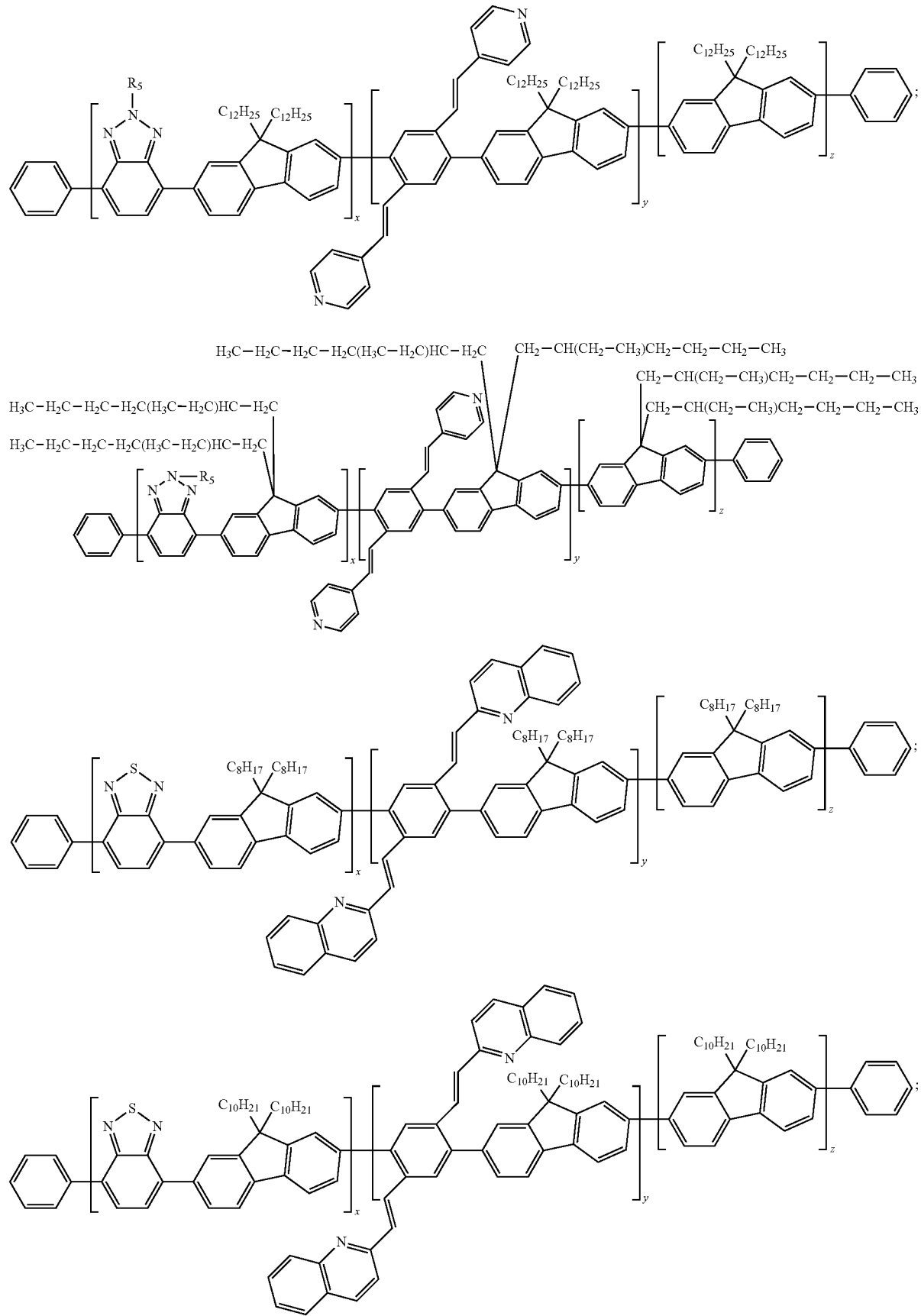
-continued

-continued
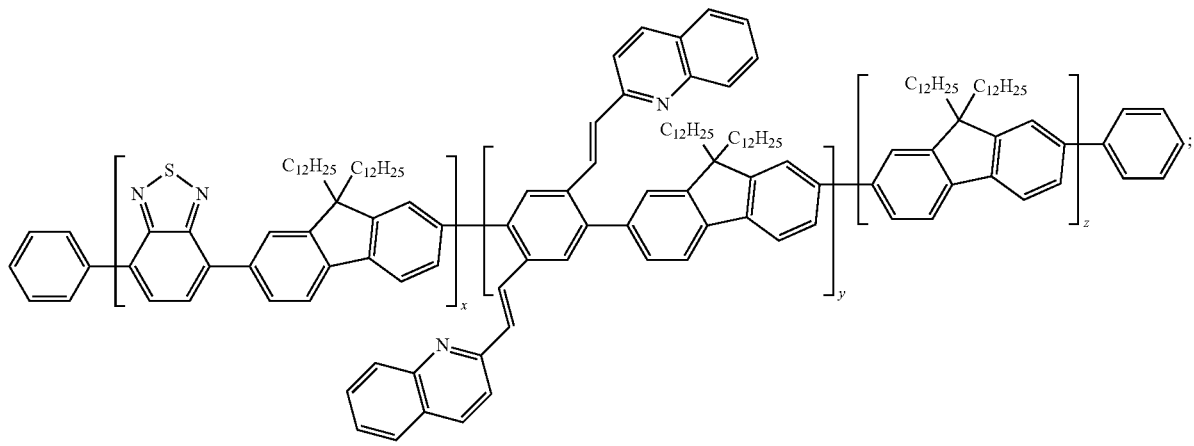
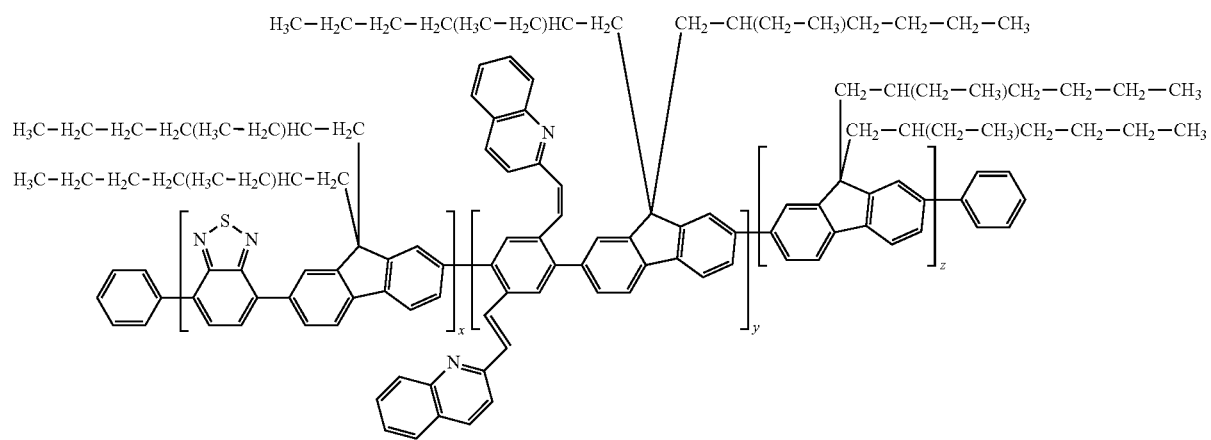
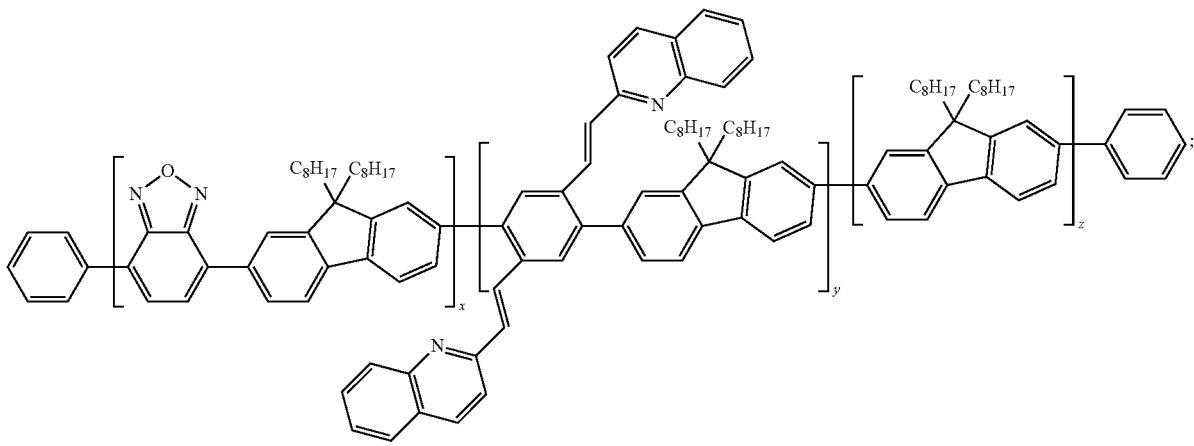

-continued
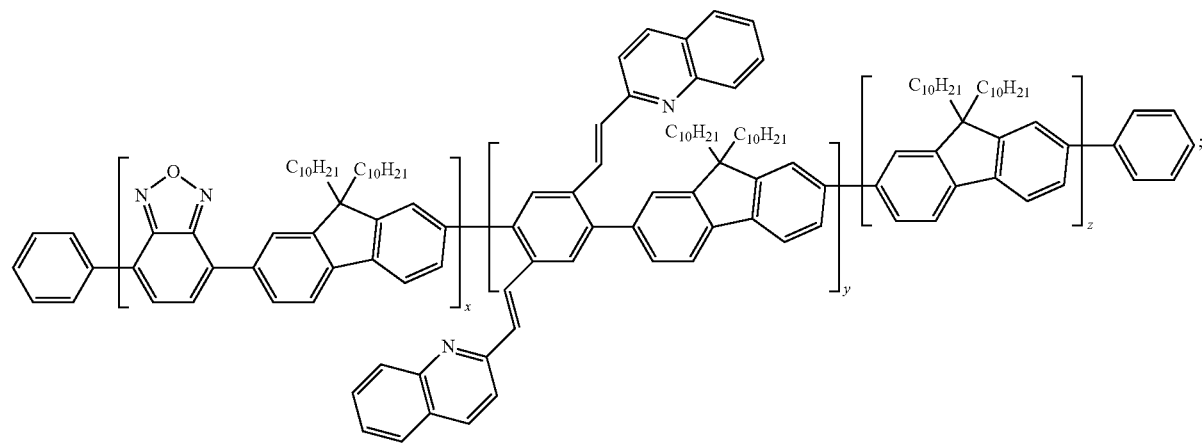
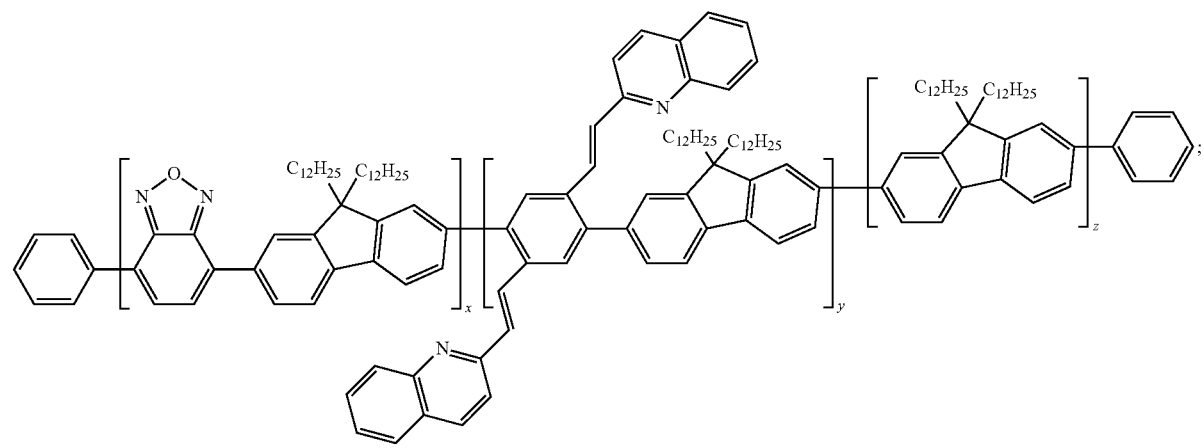
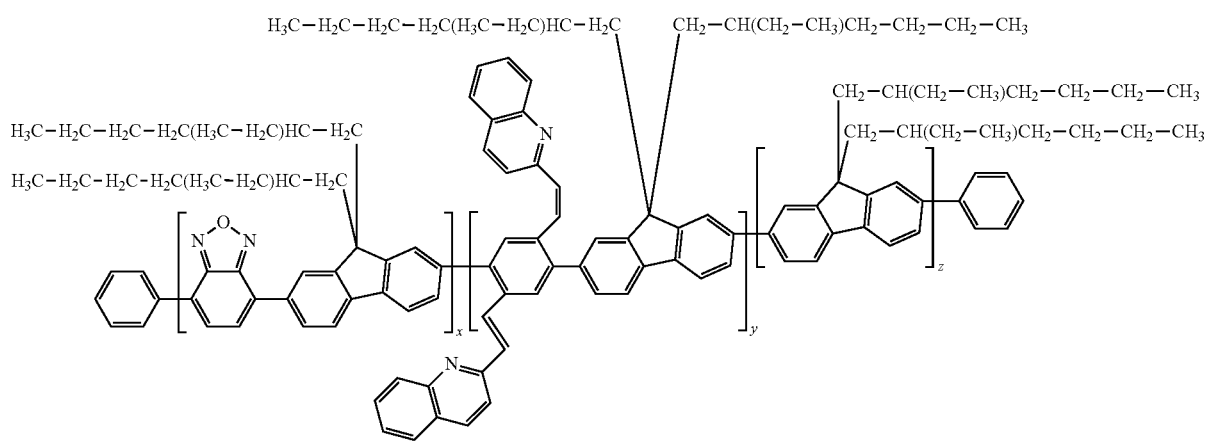

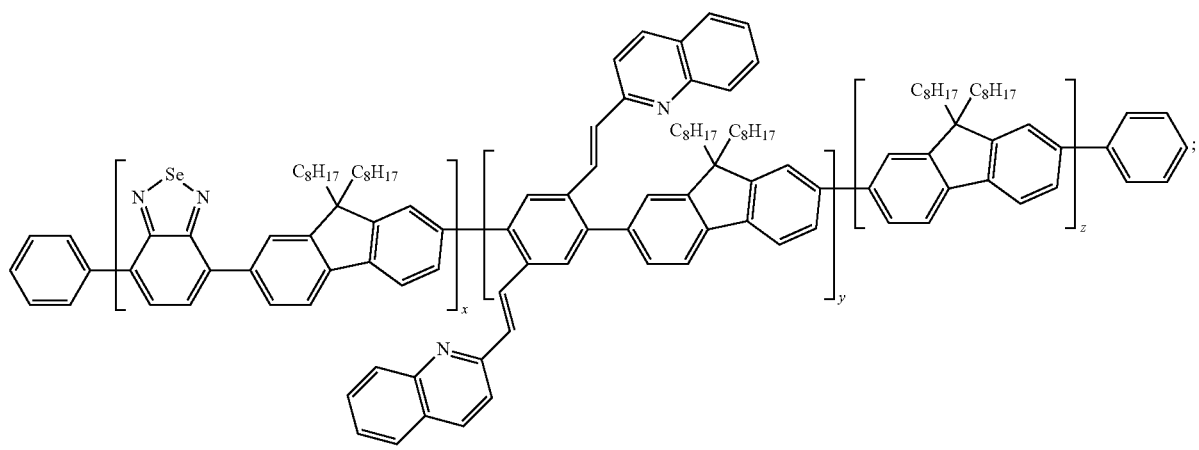
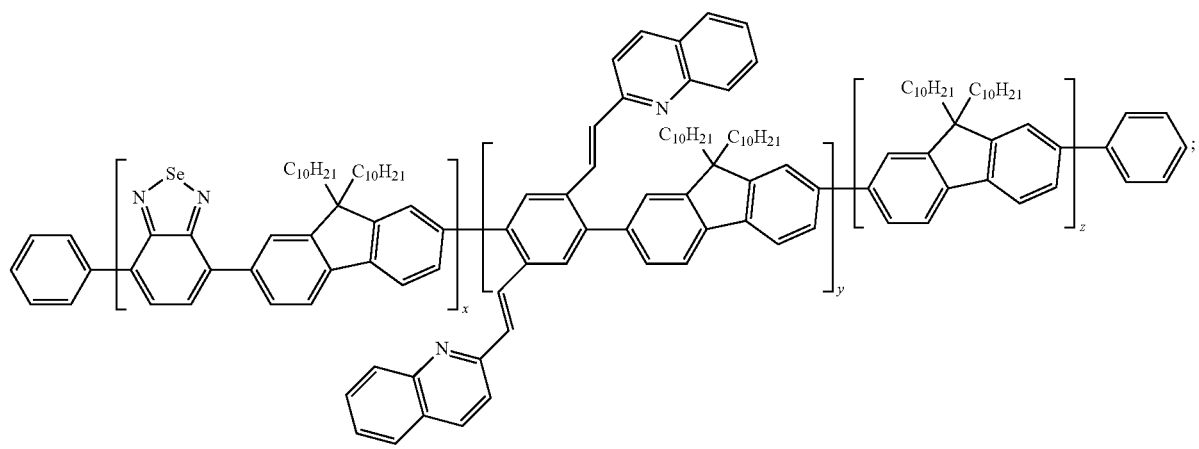
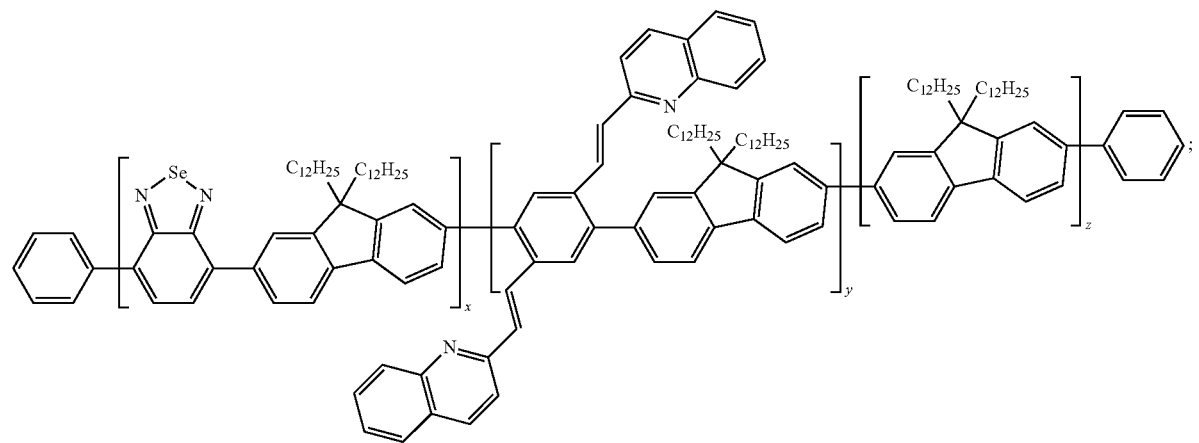

-continued
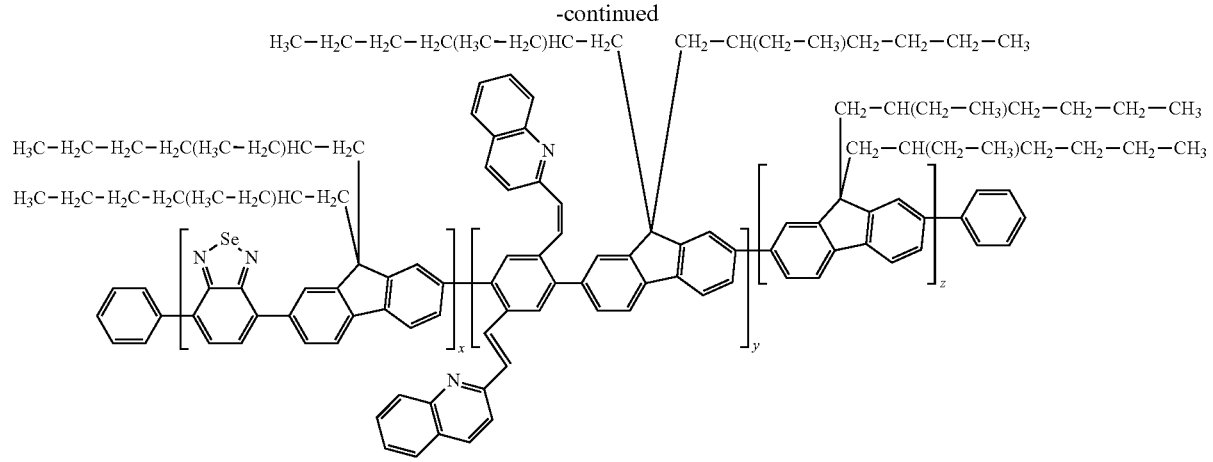
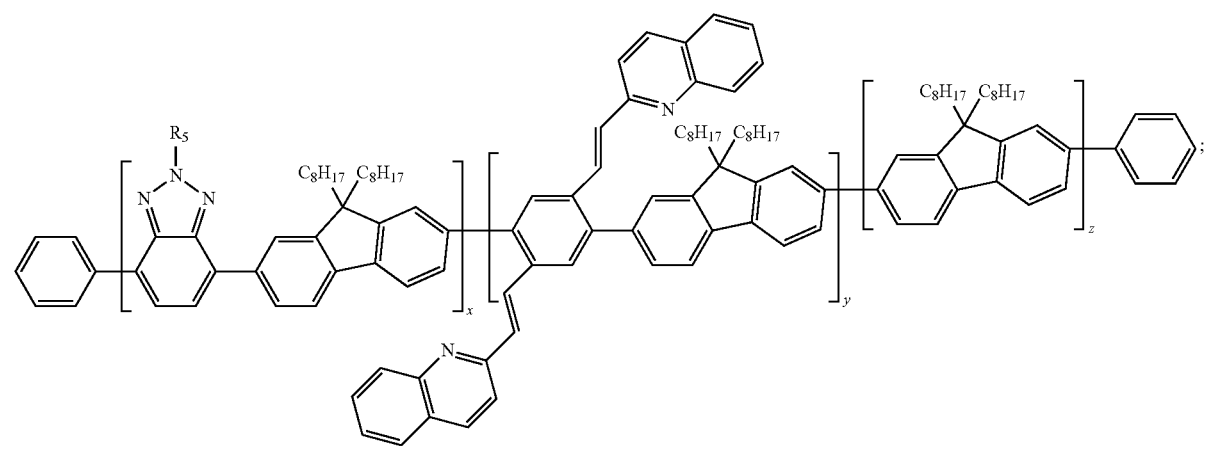
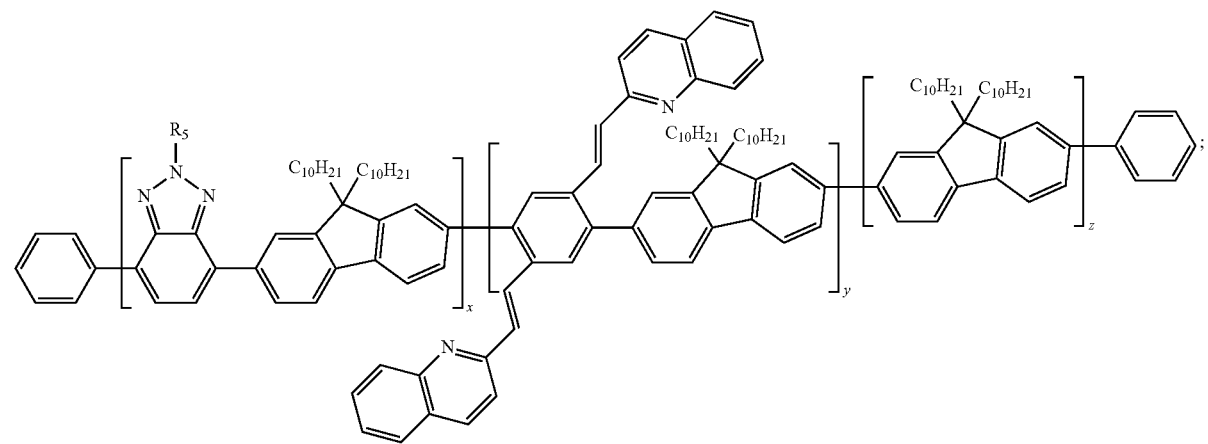

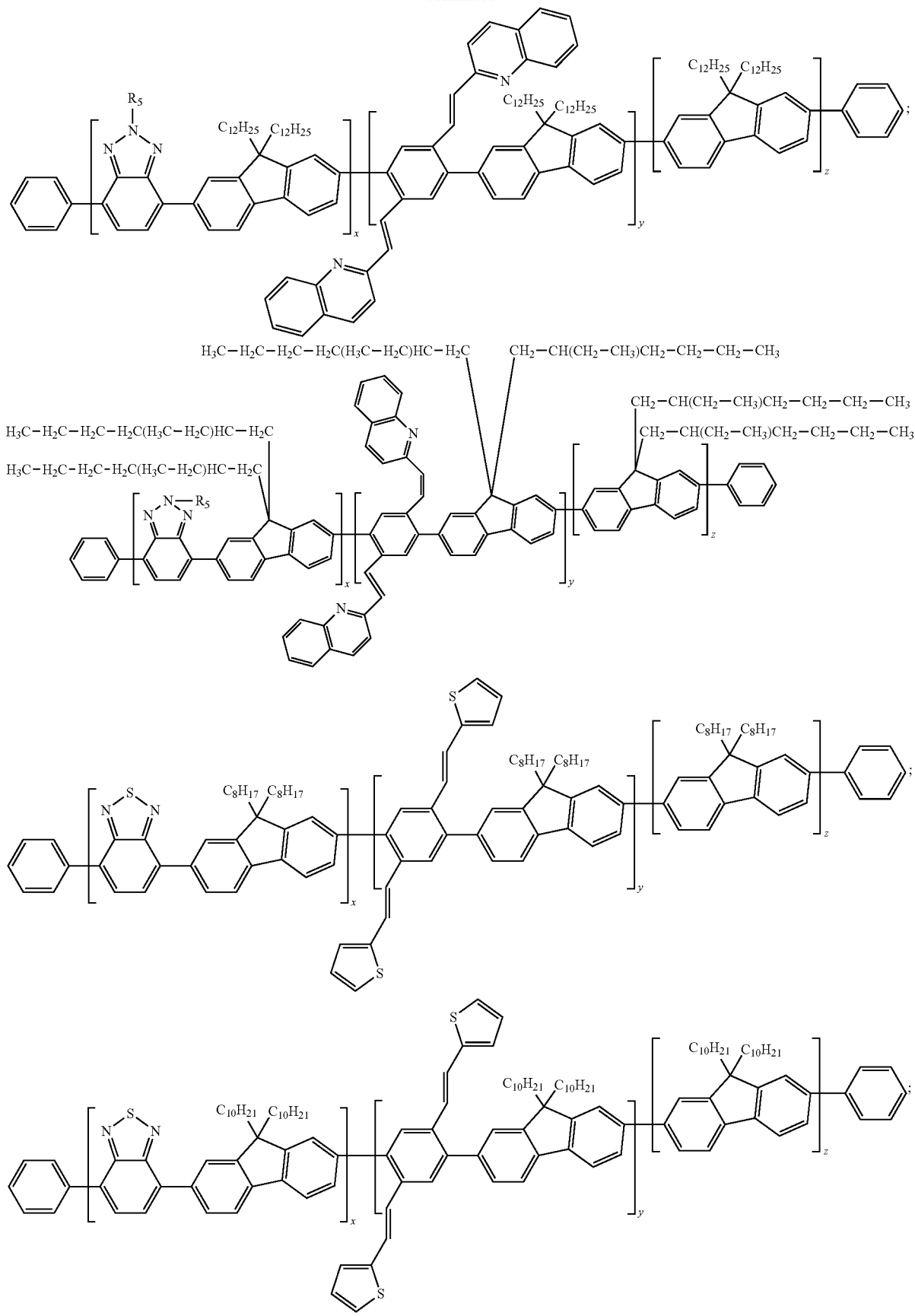

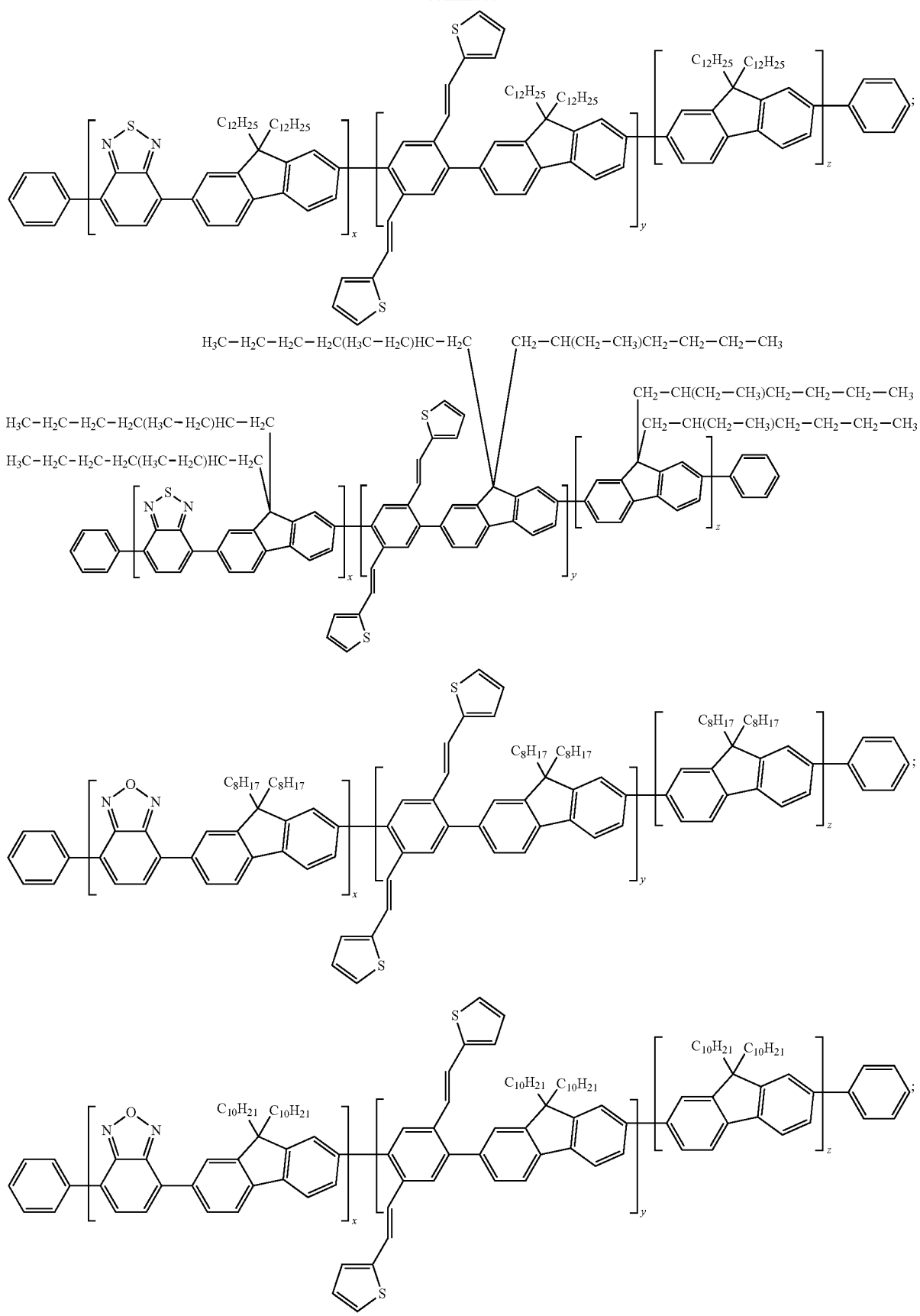

-continued
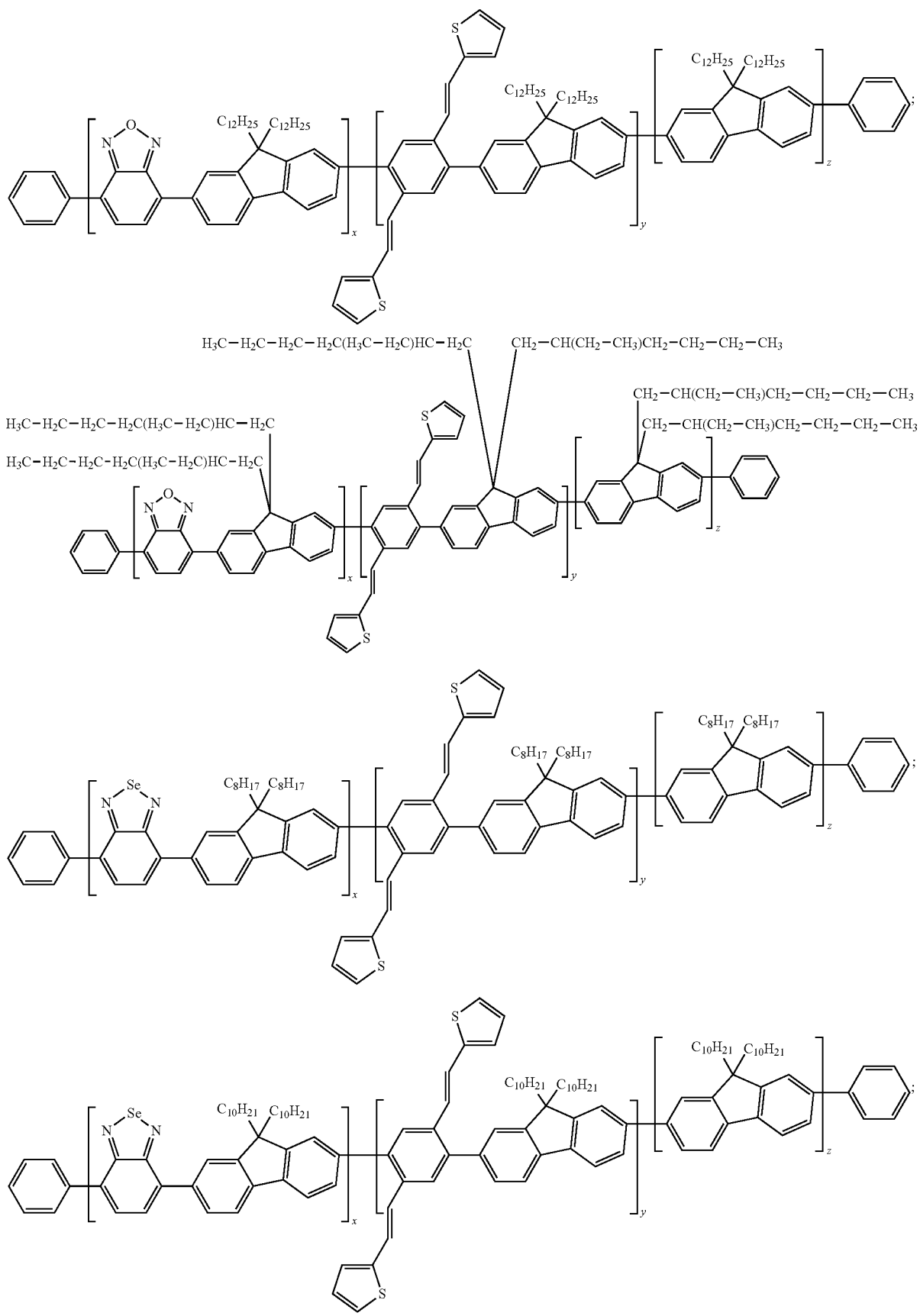

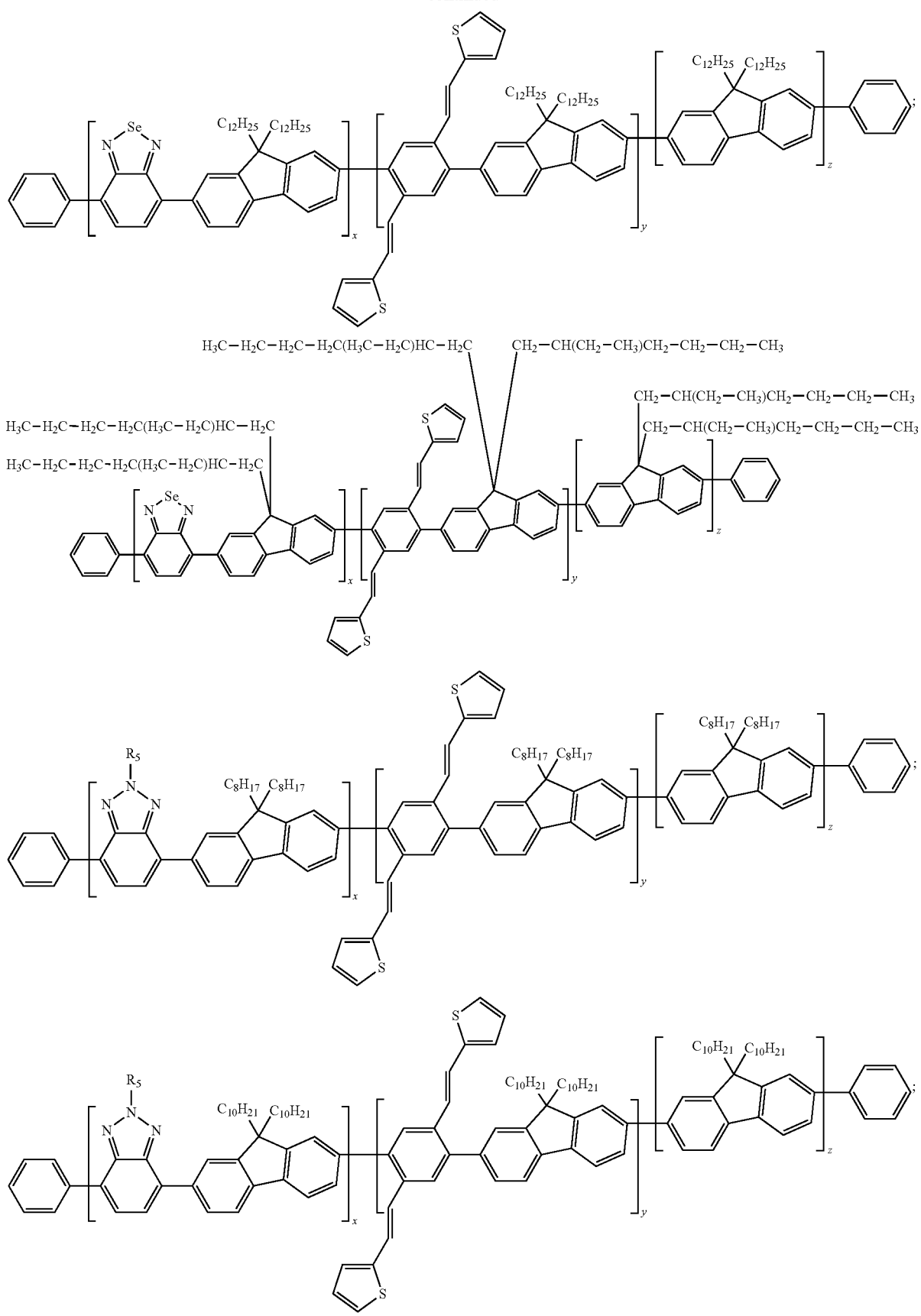

-continued

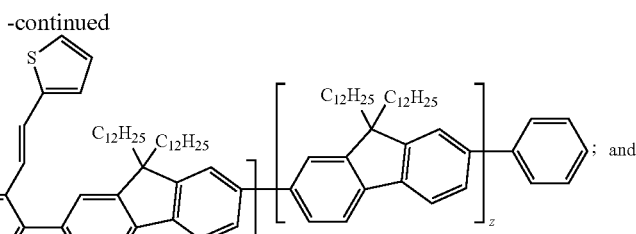
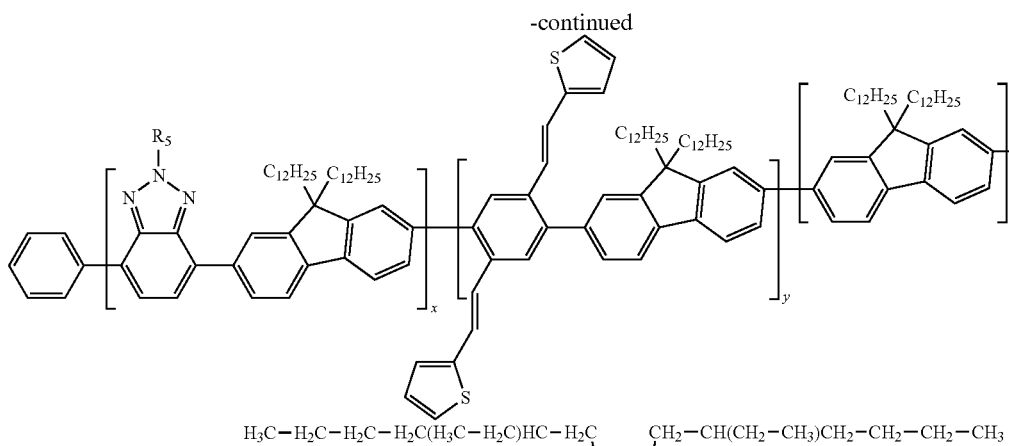
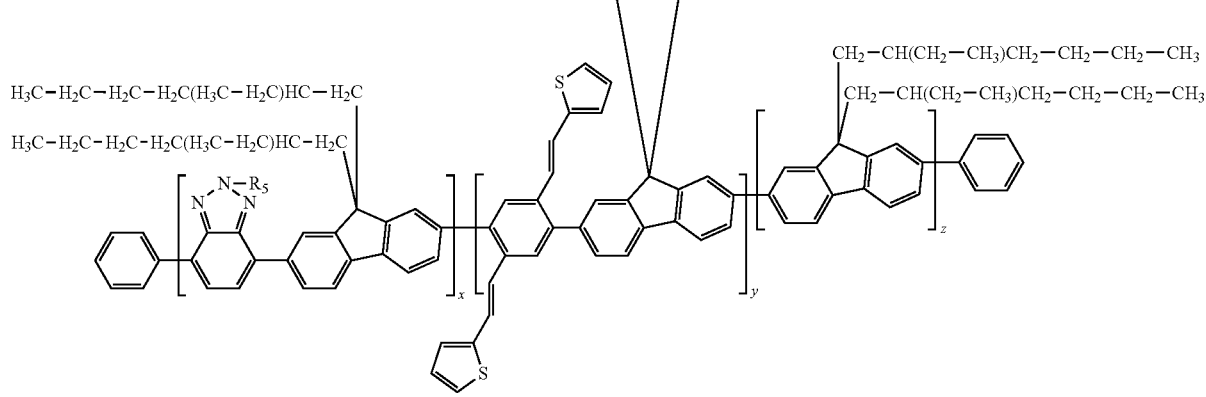

wherein $R_5$ is defined hereinabove and x, y and z are integers independently ranging from 1 to 10,000.

In another aspect, light emitting devices comprising conjugated polymers or oligomers are described herein. In some embodiments, a light emitting device comprises a radiation transmissive first electrode, a second electrode and a light emitting layer disposed between the first electrode and the second electrode, the light emitting layer comprising a conjugated polymer or oligomer comprising at least two repeating units selected from the group consisting of repeating units A, B and C:

(A)

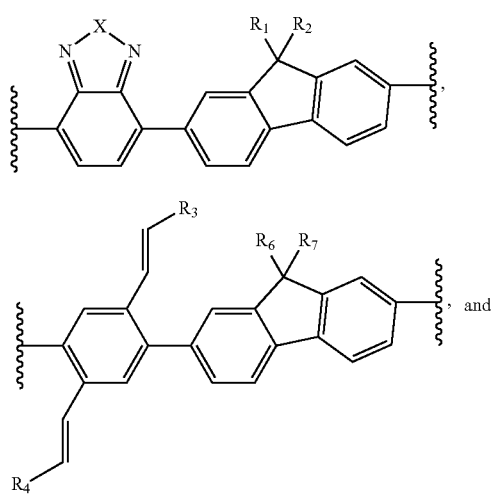

(B)

-continued (C)

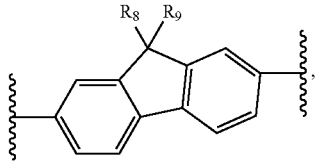

wherein ⸹ represents points of attachment in the polymer chain or oligomer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In some embodiments, a polymer or oligomer of a light emitting layer comprising at least two repeating units selected from the group consisting of repeating units A, B and C is a polymer or oligomer of Formula (I), Formula (II), Formula (III) or Formula (IV) described hereinabove. In some embodiments, for example, a polymer or oligomer of a light emitting layer can comprise any specific example or species of a polymer or oligomer of Formula (I), Formula (II), Formula (III) or Formula (IV) described or illustrated herein. In some embodiments, a light emitting layer of a light emitting device comprises a mixture of at least two polymers or oligomers selected from the group consisting of polymers or oligomers of Formula (I), Formula (II), Formula (III) and Formula (IV). In some embodiments, conjugated polymers or oligomers described herein can be mixed into a single layer. In some embodiments, conjugated polymers or oligomers of varying structure described herein can be separated into individual layers to provide a light emitting layer of a light emitting device.

In some embodiments, a light emitting layer can have any thickness not inconsistent with the objectives of the present invention. A light emitting layer, in some embodiments, has a thickness ranging from about 5 nm to about 10 µm. In some embodiments, a light emitting layer has a thickness ranging from about 10 nm to about to about 1 µm. In some embodiments, a light emitting layer has a thickness ranging from about 20 nm to about 750 nm or from about 50 nm to about 500 nm. A light emitting layer, in some embodiments, has a thickness ranging from about 5 nm to about 200 nm. In some embodiments, a light emitting layer has a thickness ranging from about 10 nm to about 150 nm. In some embodiments, a light emitting layer has a thickness ranging from about 20 nm to about 100 nm.

A radiation transmissive first electrode of a light emitting device described herein can comprise any material not inconsistent with the objectives of the present invention. Radiation transmissive, as used herein, refers to the ability to at least partially pass radiation in the visible, infrared and/or ultraviolet region of the electromagnetic spectrum. In some embodiments, radiation transmissive materials can pass visible electromagnetic radiation with minimal absorbance or other interference.

A radiation transmissive first electrode, in some embodiments comprises a radiation transmissive conducting oxide. A radiation transmissive conducting oxide, in some embodiments, comprises indium tin oxide (ITO), gallium indium tin oxide (GITO) or zinc indium tin oxide (ZITO).

In some embodiments, a radiation transmissive first electrode of a light emitting device comprises a radiation transmissive polymeric material. A radiation transmissive polymeric material, in some embodiments, comprises polyanaline (PAn) and/or its chemical relatives. In some embodiments, a radiation transmissive polymeric material comprises 3,4-polyethylenedioxythiophene (PEDOT). In some embodiments, a radiation transmissive first electrode comprises a metal or carbon nanotube layer having a thickness operable to at least partially pass visible electromagnetic radiation.

A radiation transmissive first electrode can have any thickness not inconsistent with the objectives of the present invention. In some embodiments, a radiation transmissive first electrode has a thickness of at least about 10 nm. In some embodiments, a radiation transmissive first electrode has a thickness ranging from about 10 nm to about 1 µm. A radiation transmissive first electrode, in some embodiments, has a thickness ranging from about 20 nm to about 750 nm. In some embodiments, a radiation transmissive first electrode has a thickness ranging from about 50 nm to about 500 nm. In some embodiments, a radiation transmissive first electrode has a thickness ranging from about 30 nm to about 200 nm or from about 50 nm to about 150 nm.

As described herein, a light emitting device comprises a second electrode. A second electrode can comprise any material not inconsistent with the objectives of the present invention. In some embodiments, a second electrode is non-radiation transmissive. In some embodiments, a second electrode comprises a metal. In some embodiments, a metal comprises elementally pure metals as well as metal alloys. In some embodiments, a second electrode comprises aluminum, copper, gold, silver, platinum, palladium or other transition metals or alloys thereof. In some embodiments, a second electrode is radiation transmissive. In some embodiments wherein a second electrode is radiation transmissive, the second electrode comprises any radiation transmissive material described herein for the radiation transmissive first electrode.

A second electrode can have any thickness not inconsistent with the objectives of the present invention. In some embodiments, a second electrode has a thickness ranging from about 10 nm to about 10 µm. In some embodiments, a second electrode has a thickness ranging from about 50 nm about 750 nm. A second electrode, in some embodiments, has a thickness ranging from about 100 nm to about 500 nm.

A layer comprising lithium fluoride (LiF), in some embodiments, is disposed between the light emitting layer and the second electrode. The LiF layer, in some embodiments, has a thickness ranging from about 5 Angstroms to about 3 nm. In some embodiments, the LiF layer has a thickness ranging from about 1 nm to about 2 nm.

The light emitting layer of a light emitting device described herein, in some embodiments, is electrically connected to the radiation transmissive first electrode and the second electrode. Electrically connected, in some embodiments, refers to the ability of the light emitting layer to receive charge carriers, including electrons and holes, from the radiation transmissive first electrode and second electrode.

In some embodiments, a hole transport layer is disposed between the radiation transmissive first electrode and the light emitting layer. In some embodiments, a hole transport layer is disposed between the second electrode and the light emitting layer. In some embodiments, a hole transport layer comprises polethylenedioxythiophene:polystyrenesulfonate (PEDOT:PSS).

In some embodiments, an electron transport layer is disposed between the second electrode and the light emitting layer. In some embodiments, an electron transport layer is disposed between the radiation transmissive first electrode and the light emitting layer. In some embodiments, an electron transport layer comprises tris(8-hydroxyquinolinato)aluminum ($Alq_3$).

In some embodiments, an electrically insulating layer or dielectric layer is disposed between the first electrode and the light emitting layer. In some embodiments, an electrically insulating layer or dielectric layer is disposed between the second electrode and the light emitting layer. In some embodiments, a first dielectric layer is disposed between the first electrode and the light emitting layer, and a second dielectric layer is disposed between the second electrode and the light emitting layer. In some embodiments, a dielectric layer disposed between the light emitting layer and the radiation transmissive first electrode and/or second electrode is radiation transmissive. In some embodiments, an electrically insulating layer or dielectric layer comprises one or more inorganic oxides. In some embodiments, an inorganic oxide comprises a transition metal oxide, alumina ($Al_2O_3$), silica ($SiO_2$) or mixtures thereof.

In some embodiments, an electrically insulating layer or dielectric layer comprises one or more polymeric materials. In some embodiments, suitable polymers for use in an electrically insulating or dielectric layers comprise fluorinated polymers such as polyvinylidene fluoride (PVDF), poly(vinyl fluoride) (PVF), polytetrafluoroethylene (PTFE), perfluoropropylene, polychlorotrifluoroethylene (PCTFE), or copolymers and combinations thereof. In some embodiments, an electrically insulating or dielectric polymeric material comprises polyacrylates including polyacrylic acid (PAA), poly(methacrylate) (PMA), poly(methylmethacrylate) (PMMA), or copolymers and combinations thereof. In some embodiments, an electrically insulating or dielectric polymeric material comprises polyethylenes, polypropylenes, polystyrenes, poly(vinylchloride), polycarbonates, polyamides, polyimides, or copolymers and combinations thereof. Polymeric dielectric materials, according to some embodiments described herein, contemplate any suitable molecular weight ($M_w$) and polydispersity as understood by one of skill in the art.

FIG. 1 illustrates a light emitting device according to one embodiment described herein. The light emitting device of FIG. 1 comprises a radiation transmissive first electrode (11) and a second electrode (12). A light emitting layer (13) comprising one or more conjugated polymers or oligomers described herein is disposed between the radiation transmissive first electrode (11) and the second electrode (12) and electrically connected to the radiation transmissive first electrode (11) and the second electrode (12).

Figure 2:
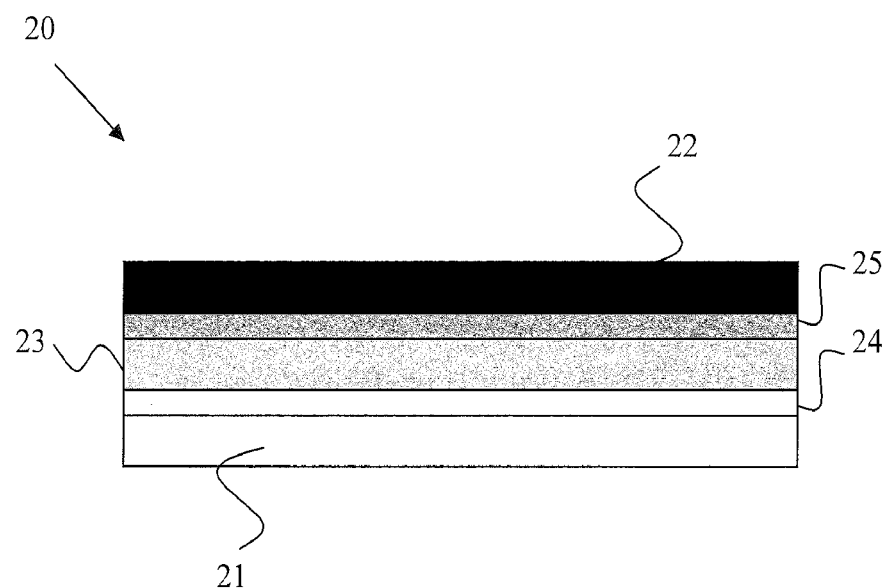
FIG. 2 illustrates a light emitting device according to one embodiment described herein.

FIG. 2 illustrates a light emitting device according to one embodiment described herein. The light emitting device (20) of FIG. 2 comprises a radiation transmissive first electrode (21) and a second electrode (22). A light emitting layer (23) comprising one or more conjugated polymers or oligomers described herein is disposed between the radiation transmissive first electrode (21) and the second electrode (22) and electrically connected to the radiation transmissive first electrode (21) and the second electrode (22). A hole transport layer (24) is disposed between the radiation transmissive first electrode (21) and the light emitting layer (23), and a LiF layer (25) is disposed between the second electrode (22) and the light emitting layer (23).

In some embodiments, a light emitting layer of a light emitting device described herein emits light having coordinates in the white light region or substantially in the white light region of the 1931 CIE Chromaticity Diagram. In some embodiments, a light emitting layer of a light emitting device described herein emits light having coordinates in any desired region of the 1931 CIE Chromaticity Diagram including, but not limited to, the green, blue, purple or red regions.

In another aspect, composite organic layers are described herein. In some embodiments, a composite organic layer comprises a nanoparticle phase disposed in a polymeric phase or oligomeric phase, the polymeric phase or oligomeric phase comprising a polymer or oligomer comprising at least two repeating units selected from the group consisting of repeating units A, B and C:

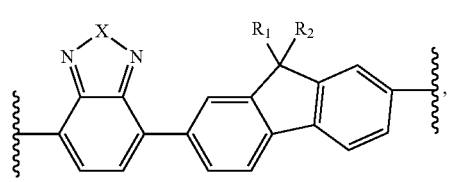 (A)

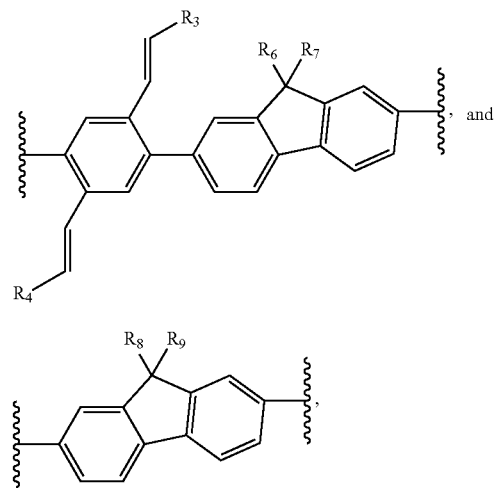

wherein ⸾ represents points of attachment in the polymer chain or oligomer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In some embodiments, a polymer or oligomer of a composite organic layer comprising at least two repeating units selected from the group consisting of repeating units A, B and C is a polymer or oligomer of Formula (I), Formula (II), Formula (III) or Formula (IV) described hereinabove. In some embodiments, for example, a polymer or oligomer of a composite organic layer can comprise any specific example or species of a polymer or oligomer of Formula (I), Formula (II), Formula (III) or Formula (IV) described or illustrated herein. In some embodiments, the polymeric or oligomeric phase of a composite organic layer comprises a mixture of at least two polymers or oligomers selected from the group consisting of polymers or oligomers of Formula (I), Formula (II), Formula (III) and Formula (IV) described herein.

In some embodiments, a polymeric phase or oligomeric phase of a composite organic layer described herein further comprises one or more conjugated or semiconducting polymers in addition to at least one polymer or oligomer selected from Formula (I), Formula (II), Formula (III) and Formula (IV). In some embodiments, a polymeric phase or oligomeric phase of a composite organic layer further comprises poly(2-vinylpyridine) (P2VP), poly(N-vinylcarbazole) (PVCZ), polypyrrole (PPy), polyaniline (PAn), polythiophenes including, but not limited to, poly(3-hexylthiophene) (P3HT), poly(3-octylthiophene) (P3OT), polythiophene (PTh) and polyphenylene vinlylenes including, but not limited to, poly(phenylene vinylene), poly(p-phenylene vinylene) (PPV) or mixtures thereof. In some embodiments, a polymeric phase or oligomeric phase further comprises poly[2-(3-thienyl)-ethoxy-4-butylsulphonate] (PTEBS), 2-methoxy-5-(3',7'-dimethyloctyloxy)-1,4-phenylene-vinylene (MDMO-PPV), poly(styrene-b-paraphenylene], poly[2-methoxy-5-(2'-ethylhexyloxy)-p-phenylene-vinylene] (MEH-PPV) or mixtures thereof.

In some embodiments, a nanoparticle phase is dispersed throughout the polymeric phase or oligomeric phase of a composite organic layer described herein. In some embodiments, for example, nanoparticles are uniformly or substantially uniformly distributed throughout the polymeric phase or oligomeric phase of a composite organic layer. In some embodiments, nanoparticles are heterogeneously dispersed in the polymeric phase or oligomeric phase of a composite organic layer.

A nanoparticle phase disposed in a polymeric phase or oligomeric phase of a composite organic layer described herein can comprise any type of nanoparticle not inconsistent with the objectives of the present invention. In some embodiments, nanoparticles of the nanoparticle phase comprise carbon nanoparticles including, but not limited to, fullerenes, carbon nanotubes, carbon quantum dots, grapheme particles or mixtures thereof. Fullerenes suitable for use in the nanoparticle phase, in one embodiment, can comprise 1-(3-methoxycarbonyl)propyl-1-phenyl(6,6)$C_{61}$ (PCBM), higher order fullerenes ($C_{70}$ and higher), and endometallofullerenes (fullerenes having at least one metal atom disposed therein). Carbon nanotubes for use in the nanoparticle phase, according to some embodiments, can comprise single-walled nanotubes (SWNT), multi-walled nanotubes (MWNT), cut nanotubes, nitrogen and/or boron doped carbon nanotubes or mixtures thereof.

In some embodiments wherein the nanoparticle phase comprises carbon nanotubes, the carbon nanotubes have a length ranging from about 5 nm to about 1 µm.

In some embodiments, the carbon nanotubes have a length ranging from about 10 nm to about 600 nm or from about 20 nm to about 500 nm. In some embodiments, the carbon nanotubes have a length ranging from about 50 nm to about 300 nm or from about 100 nm to about 200 nm. In some embodiments, the carbon nanotubes have a length shorter or substantially shorter than the thickness of the composite organic layer.

In some embodiments, nanoparticles of the nanoparticle phase comprise metal nanoparticles such as gold nanoparticles, silver nanoparticles, copper nanoparticles, nickel nanoparticles, and other transition metal nanoparticles. In some embodiments, nanoparticles comprise semiconductor nanoparticles such as III/V and II/VI semiconductor nanoparticles, including cadmium selenide (CdSe) nanoparticles, cadmium telluride (CdTe) nanoparticles, gallium nitride (GaN) nanoparticles, gallium arsenide (GaAs) nanoparticles, indium phosphide (InP) nanoparticles or mixtures thereof. In some embodiments, semiconductor nanoparticles comprise quantum dots including, but not limited to, II/VI and/or III/V quantum dots.

In some embodiments, the nanoparticle phase comprises at least one nanowhisker. Carbon nanoparticles operable to form nanowhiskers, according to some embodiments, can comprise single-walled carbon nanotubes, multi-walled carbon nanotubes, and fullerenes. In one embodiment, nanowhiskers comprise crystalline PCBM.

In some embodiments, a nanoparticle phase of a composite organic layer comprises any combination or mixture of nanoparticle species described herein. In some embodiments, for example, a composite organic layer comprises a mixture of carbon nanotubes (SWNT and/or MWNT) with semiconductor nanocrystals, such as II/VI and/or III/V quantum dots.

In some embodiments, a nanoparticle phase is present in a composite organic layer in an amount up to about 20 weight percent. In some embodiments, a nanoparticle phase is present in a composite organic layer in an amount ranging from about 0.01 weight percent to about 15 weight percent. In some embodiments, a nanoparticle phase is present in a composite organic layer in an amount ranging from about 0.1 weight percent to about 10 weight percent or from about 0.5 weight percent to about 5 weight percent. In some embodiments, a nanoparticle phase is present in a composite organic layer in an amount ranging from about 1 weight percent to about 4 weight percent or from about 0.1 weight percent to about 3 weight percent. In some embodiments, a nanoparticle phase is present in a composite organic layer in an amount ranging from about 0.1 weight percent to about 0.5 weight percent or from about 0.5 weight percent to about 1 weight percent.

A composite organic layer, according to some embodiments, has thickness ranging from about 10 nm to about 1 µm. In some embodiments, a composite organic layer has a thickness ranging from about 80 nm to about 800 nm. In some embodiments, a composite organic layer has a thickness ranging from about 100 nm to about 500 nm or from about 150 nm to about 400 nm. In some embodiments, a composite organic layer has a thickness ranging from about 50 nm to about 300 nm or from about 40 nm to about 200 nm. In one embodiment, a composite organic layer has a thickness ranging from about 80 nm to about 150 nm. In some embodiments, a composite organic layer has a thickness greater than about 1 µm.

In another aspect, methods of making conjugated polymers or oligomers are described herein. In some embodiments, a method of making a conjugated polymer or oligomer comprises reacting at least three types of monomer selected from the group consisting of monomer types $A_1$, $B_1$, $C_1$, $D_1$ and $E_1$:

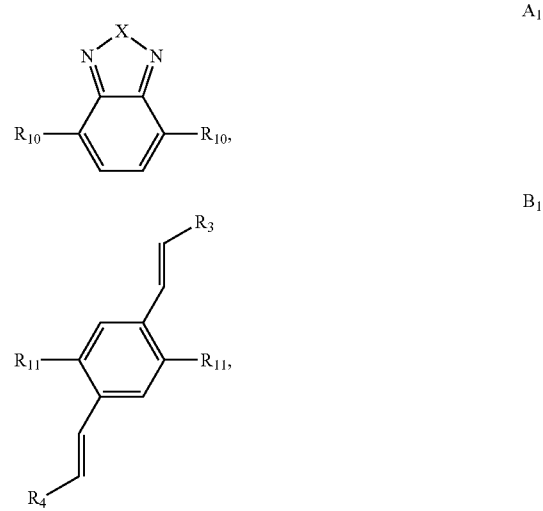

-continued

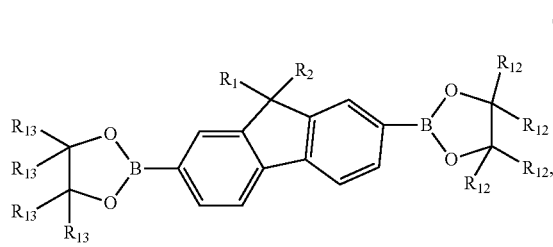

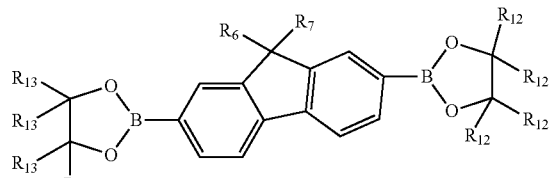

and

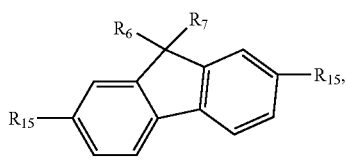

wherein X is selected from the group consisting of S, O, Se and $NR_5$ and $R_1$, $R_2$, $R_5$, $R_6$, $R_7$, $R_8$, and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl and $R_{12}$ and $R_{13}$ are independently selected from the group consisting of hydrogen and $C_{1-6}$ alkyl and wherein the alkyl and alkenyl of $R_1$, $R_2$, $R_5$, $R_6$, $R_7$, $R_8$, $R_9$, $R_{12}$ and $R_{13}$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl and $R_{10}$, $R_{11}$ and $R_{15}$ are leaving groups.

In some embodiments, leaving groups of $R_{10}$, $R_{11}$ and $R_{15}$ are independently selected from the group consisting of halogen, tosyl, azide, thiocyanate and nitro.

In some embodiments, $R_1$ and $R_6$ are selected to be the same and $R_2$ and $R_7$ are selected to be the same, thereby rendering monomers $C_1$ and $D_1$ identical.

In some embodiments of methods described herein, a conjugated polymer or oligomer comprising at least two repeating units selected from the group consisting of repeating units A, B and C:

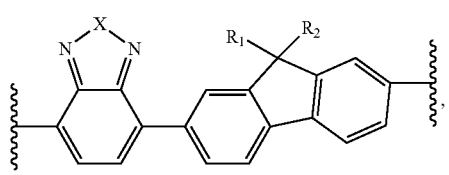

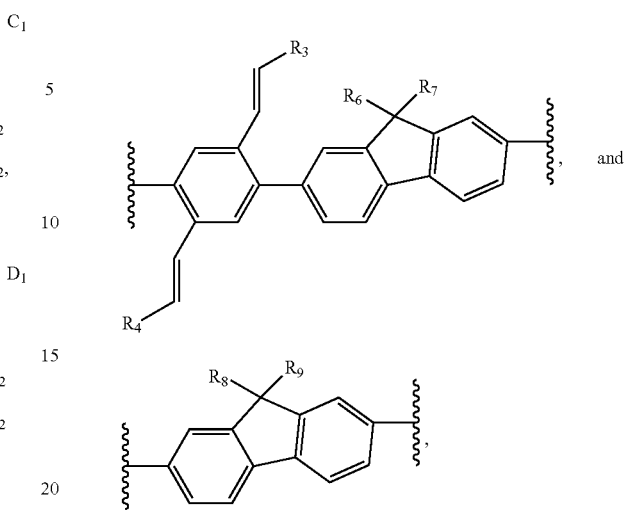

is provided by reacting at least three types of monomer selected from the group consisting of monomer types $A_1$, $B_1$, $C_1$, $D_1$ and $E_1$ defined above, wherein ⌇ represents points of attachment in the polymer chain or oligomer chain and X, $R_1$, $R_2$, $R_3$, $R_4$, $R_6$, $R_7$, $R_8$ and $R_9$ are defined above.

In some embodiments, for example, polymers or oligomers of Formulas (I)-(IV) can be provided by reacting monomers types $A_1$, $B_1$, $C_1$, $D_1$ and $E_1$ according to Table I.

TABLE I

Monomer Reaction Scheme

| Polymer/Oligomer | Monomers Reacted |
|---|---|
| Formula (I) | $A_1$, $B_1$, $C_1$, $D_1$ |
| Formula (II) | $A_1$, $C_1$, $E_1$ |
| Formula (III) | $B_1$, $D_1$, $E_1$ |
| Formula (IV) | $A_1$, $B_1$, $C_1$, $D_1$, $E_1$ |

In some embodiments wherein monomers $C_1$ and $D_1$ have the same structure, polymers or oligomers of Formulas (I)-(IV) can be provided by reacting monomer types $A_1$, $B_1$, $C_1$, $E_1$ according to Table I(A).

TABLE I(A)

Monomer Reaction Scheme

| Polymer/Oligomer | Monomers Reacted |
|---|---|
| Formula (I) | $A_1$, $B_1$, $C_1$ |
| Formula (II) | $A_1$, $C_1$, $E_1$ |
| Formula (III) | $B_1$, $C_1$, $E_1$ |
| Formula (IV) | $A_1$, $B_1$, $C_1$, $E_1$ |

Figure 3:
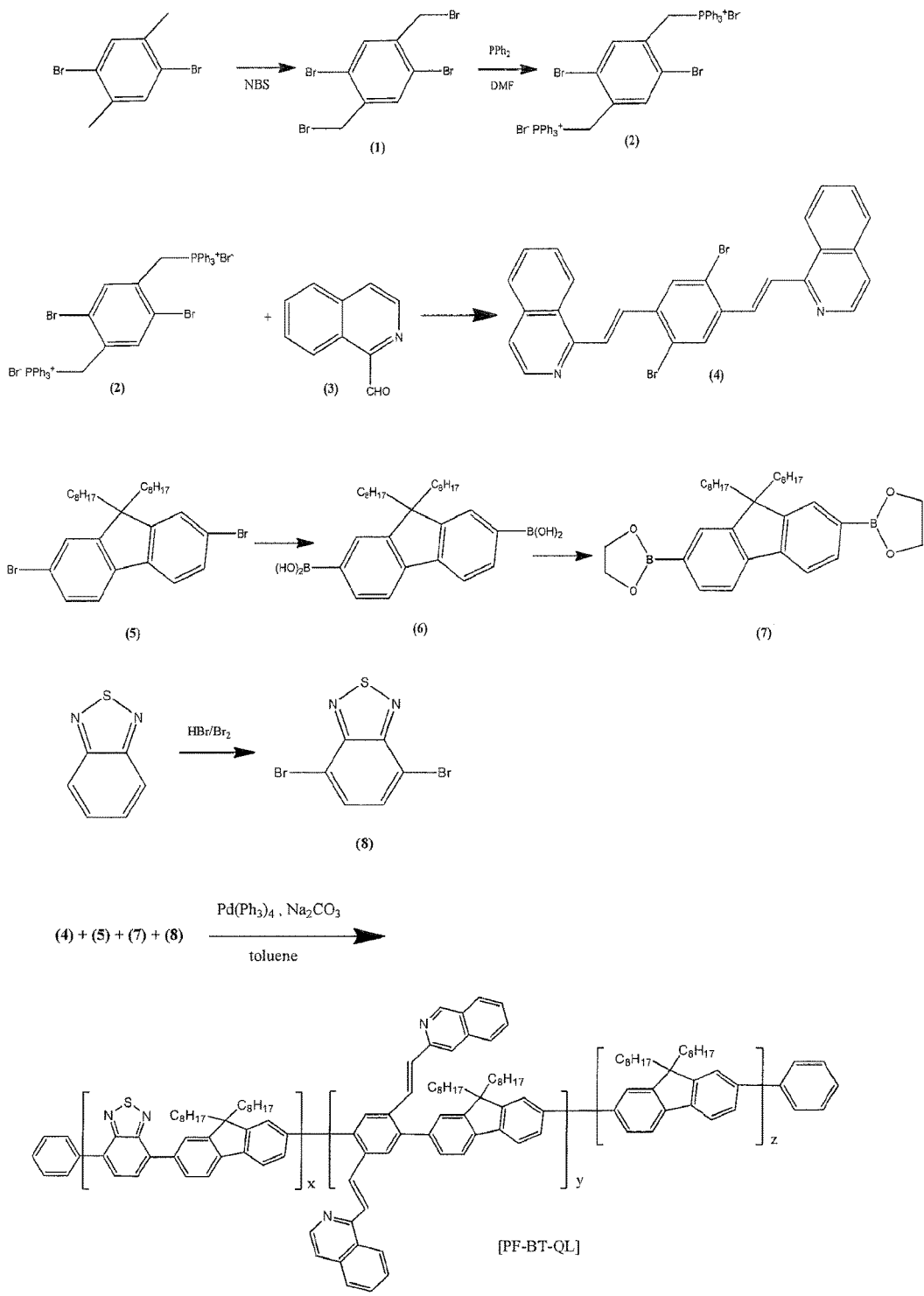
FIG. 3 illustrates a method of producing a conjugated polymer or oligomer according to one embodiment described herein.

In some embodiments of methods of making a conjugated polymer or oligomer, combinations of monomers $A_1$, $B_1$, $C_1$, $D_1$ and $E_1$ as provided in Table I are polymerized according to palladium catalyzed cross-coupling of organic halides with organoboron derivatives. In some embodiments, combinations of monomers of $A_1$, $B_1$, $C_1$, $D_1$ and $E_1$ are polymerized by Suzuki coupling reactions. FIG. 3 illustrates a method of producing a polymer or oligomer of Formula (IV) according to one embodiment described herein.

Moreover, in some embodiments, monomers $A_1$, $B_1$, $C_1$, $D_1$ and $E_1$ can be provided in any desired ratio to provide a conjugated polymer or oligomer described herein. In some embodiments, for example, monomers $A_1$, $B_1$, $C_1$, $D_1$ and $E_1$ can be provided according to the ratios disclosed in Table II for polymers or oligomers of Formulas (I)-(IV).

TABLE II

Monomer Ratios

| Polymer/Oligomer | Monomer Ratio |
|---|---|
| Formula (I) | $0.05 \leq A_1 \leq 0.9$ |
| | $0.05 \leq B_1 \leq 0.9$ |
| | $0.05 \leq C_1 \leq 0.9$ |
| | $0.05 \leq D_1 \leq 0.9$ |
| | wherein $A_1 + B_1 + C_1 + D_1 = 1$ |
| Formula (II) | $0.05 \leq A_1 \leq 0.9$ |
| | $0.05 \leq C_1 \leq 0.9$ |
| | $0.05 \leq E_1 \leq 0.9$ |
| | wherein $A_1 + C_1 + E_1 = 1$ |
| Formula (III) | $0.05 \leq B_1 \leq 0.9$ |
| | $0.05 \leq D_1 \leq 0.9$ |
| | $0.05 \leq E_1 \leq 0.9$ |
| | wherein $B_1 + D_1 + E_1 = 1$ |
| Formula (IV) | $0.05 \leq A_1 \leq 0.9$ |
| | $0.05 \leq B_1 \leq 0.9$ |
| | $0.05 \leq C_1 \leq 0.9$ |
| | $0.05 \leq D_1 \leq 0.9$ |
| | $0.05 \leq E_1 \leq 0.9$ |
| | wherein $A_1 + B_1 + C_1 + D_1 + E_1 = 1$ |

In some embodiments wherein monomers $C_1$ and $D_1$ have the same structure, monomers $A_1$, $B_1$, $C_1$, and $E_1$ can be provided according to the ratios disclosed in Table II(A) for polymers or oligomers of Formulas (I)-(IV).

TABLE II(A)

Monomer Ratios

| Polymer/Oligomer | Monomer Ratio |
|---|---|
| Formula (I) | $0.05 \leq A_1 \leq 0.9$ |
| | $0.05 \leq B_1 \leq 0.9$ |
| | $0.05 \leq C_1 \leq 0.9$ |
| | wherein $A_1 + B_1 + C_1 = 1$ |
| Formula (II) | $0.05 \leq A_1 \leq 0.9$ |
| | $0.05 \leq C_1 \leq 0.9$ |
| | $0.05 \leq E_1 \leq 0.9$ |
| | wherein $A_1 + C_1 + E_1 = 1$ |
| Formula (III) | $0.05 \leq B_1 \leq 0.9$ |
| | $0.05 \leq C_1 \leq 0.9$ |
| | $0.05 \leq E_1 \leq 0.9$ |
| | wherein $B_1 + C_1 + E_1 = 1$ |
| Formula (IV) | $0.05 \leq A_1 \leq 0.9$ |
| | $0.05 \leq B_1 \leq 0.9$ |
| | $0.05 \leq C_1 \leq 0.9$ |
| | $0.05 \leq E_1 \leq 0.9$ |
| | wherein $A_1 + B_1 + C_1 + E_1 = 1$ |

In another aspect, methods of making a light emitting device are described herein. In some embodiments, a method of making a light emitting device comprises providing a radiation transmissive first electrode, providing a second electrode and disposing a light emitting layer comprising conjugated polymer or oligomer between the first electrode and the second electrode, the conjugated polymer or oligomer comprising at least two repeating units selected from the group consisting of repeating units A, B and C:

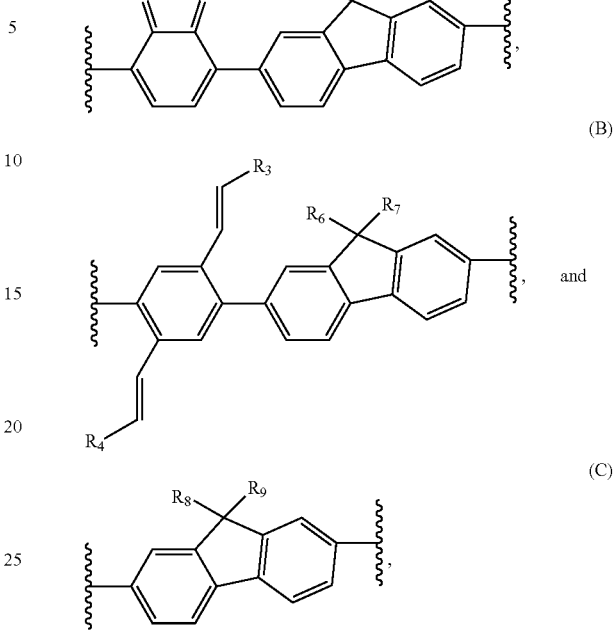

wherein ⸹ represents points of attachment in the polymer chain or oligomer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In some embodiments, a polymer or oligomer of a light emitting layer comprising at least two repeating units selected from the group consisting of repeating units A, B and C is a polymer or oligomer of Formula (I), Formula (II), Formula (III) or Formula (IV) described hereinabove. In some embodiments, a light emitting layer of a light emitting device comprises a mixture of at least two polymers or oligomers selected from the group consisting of polymers or oligomers of Formula (I), Formula (II), Formula (III) and Formula (IV) described herein. In some embodiments, a conjugated polymer or oligomer of a light emitting device has an electroluminescent emission having coordinates in the white light region or substantially in the white light region of the 1931 CIE Chromaticity Diagram.

In another aspect, methods of altering the electroluminescent emission spectra of conjugated polymers and oligomers are described herein. In some embodiments, a method of altering the electroluminescent emission spectrum of a conjugated polymer or oligomer comprises varying the ratio of repeating units forming the conjugated polymer or oligomer, wherein at least two repeating units of the conjugated polymer or oligomer are selected from the group consisting of repeating units A, B and C:

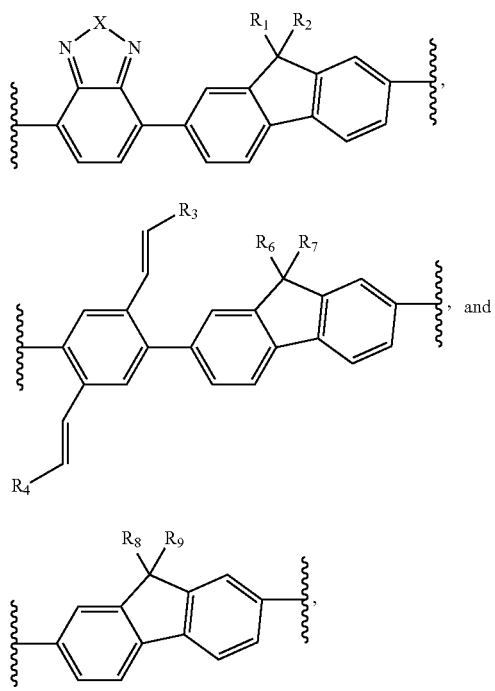

wherein ⌇ represents points of attachment in the polymer chain or oligomer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In another aspect, methods of producing a composite organic layer are described herein. In some embodiments, a method of producing a composite organic layer comprises providing a nanoparticle phase comprising a plurality of nanoparticles, providing a polymeric phase or an oligomeric phase and disposing the nanoparticle phase in the polymeric phase or the oligomeric phase, the polymeric phase or oligomeric phase comprising a polymer or oligomer comprising at least two repeating units selected from the group consisting of repeating units A, B and C:

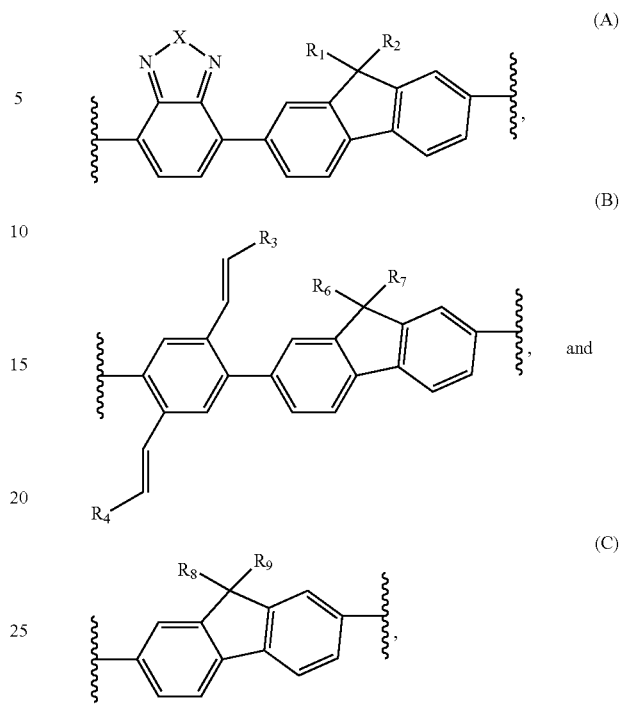

wherein ⌇ represents points of attachment in the polymer chain or oligomer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In some embodiments, a polymer or oligomer of a composite layer comprising at least two repeating units selected from the group consisting of repeating units A, B and C is a polymer or oligomer of Formula (I), Formula (II), Formula (III) or Formula (IV) described hereinabove. In some embodiments, a composite organic layer comprises a mixture of at least two polymers or oligomers selected from the group consisting of polymers or oligomers of Formula (I), Formula (II), Formula (III) and Formula (IV) described herein. In some embodiments, a conjugated polymer or oligomer of a composite layer has an electroluminescent emission having coordinates in the white light region or substantially in the white light region of the 1931 CIE Chromaticity Diagram.

These and other embodiments are further illustrated by the following non-limiting examples.

Example 1

Conjugated Oligomer of Formula (IV)

A conjugated oligomer of Formula (IV):

(I)

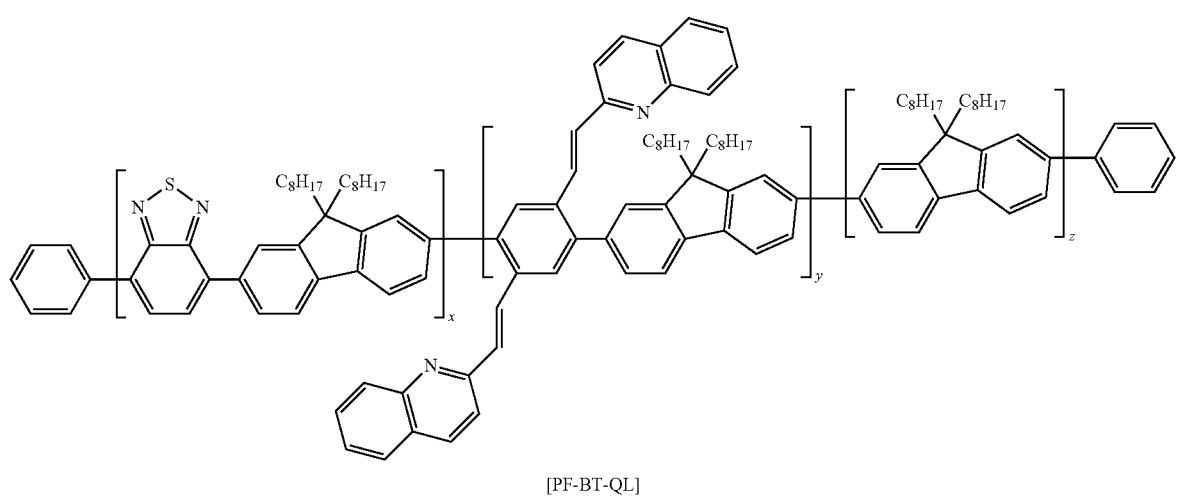

[PF-BT-QL]

was synthesized according to the reaction scheme provided in FIG. 3, wherein 1,4-dibromo-2,5-bis(2-quinolinyl)benzene (4), 2,7-dibromo-9,9-di-n-octylfluorene (5), 2,7-bis(4,4,5,5-tetramethyl-1,3,2-dioxaborolan-2-yl)-9,9-dioctylfluorene (7), 4,7-dibromo-2,1,3-benzothiadiazole (8) were synthesized. Suzuki coupling polymerization reactions with (4), (5), (7) and (8) were conducted in biphasic system (toluene/aqueous $Na_2CO_3$) with $Pd(PPh_3)_4$ as a catalyst precursor. The reactions were kept stirring at reflux temperature for 3 days. Phenyl boronic was subsequently added to reduce the heavy atom affecting which quenched fluorescence. Polyfluorene [PF] was additionally synthesized according to known Suzuki coupling methods for comparison with the PF-BT-QL oligomer.

The synthesized PF-BT-QL oligomer and PF polymer were soluble in common organic solvents, such as chloroform, toluene and tetrahydrofuran (THF). Crude PF-BT-QL oligomer was dissolved in THF, which was added dropwise to methanol so as to precipitate the high molar mass oligomers. The fractioned high molar mass oligomers were separated by filtration and dried in a vacuum oven. The weight average molecular weight ($M_w$) and number average molecular weight ($M_n$) of the PF-BT-QL oligomer and polyfluorene polymer were determined by gel permeation chromatography (GPC) and are summarized in Table III.

TABLE III

Conjugated Oligomer and Polymer Properties

| Polymer | $M_w$ | $M_n$ | Polydispersity (PDI) |
|---|---|---|---|
| PF-BT-QL | 1600 | 1100 | 1.4 |
| PF | 40000 | 20000 | 2.0 |

Figure 4:
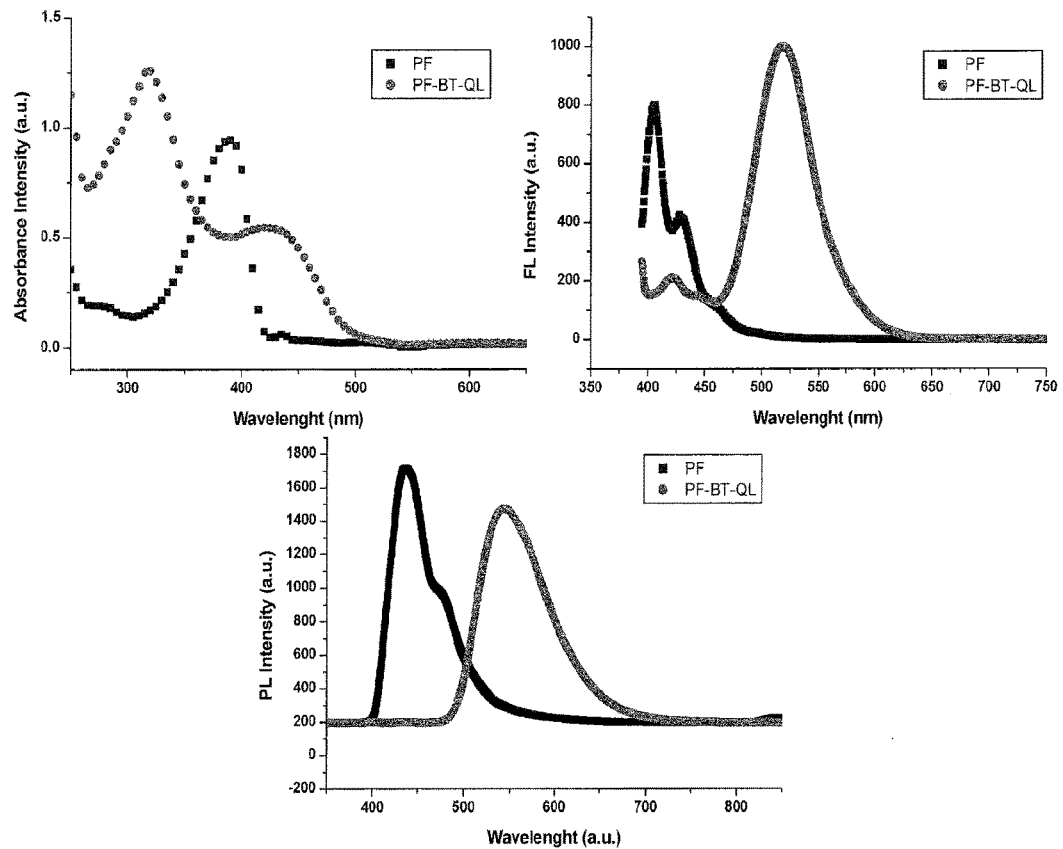
FIG. 4 illustrates absorbance and emission spectra of a conjugated oligomer according to one embodiment described herein relative to polyfluorene.

The optical properties of absorption (UV-Vis), fluorescence (FL) and photoluminescence (PL) for PF-BT-QL oligomer and PF polymer are illustrated in FIG. 4. The optical band gaps were 2.95, and 2.50 eV corresponding to PF, and PF-BT-QL, respectively, which were calculated from the onset of UV-vis spectra.

From the FL spectra obtained upon excitation at 390 nm of the polymer, the PF displayed a strong emission band at 404 nm and flat after 430 nm. It is possible that the shoulder in the PF spectrum arises earlier due to the coupling reaction between the fluorene and vinylene units to form a new electronic state with a lower energy, while PF-BT-QL exhibited a broad peak at about 520 nm.

From the PL spectra, the major emission band of PF appeared at 436 nm with a strong shoulder at a slightly longer wavelength (+30 nm). Again, the shoulder likely arose from electronic coupling between the fluorene and vinylene moieties, while PF-BT-QL exhibited a broad peak at about 540 nm showing red-shifted emission in comparison to the homopolymer.

Figure 5:
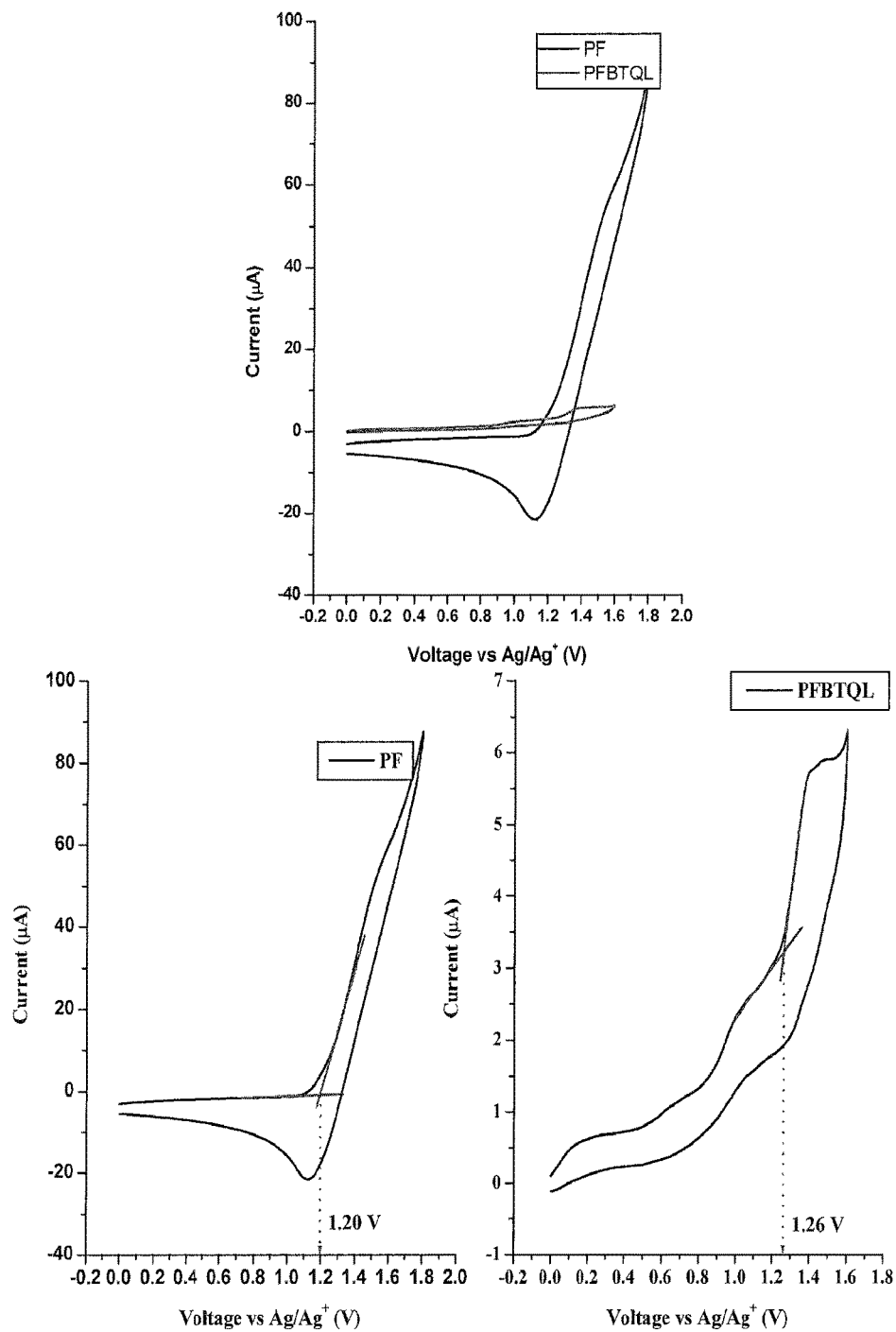
FIG. 5 illustrates a cyclic voltammogram of a conjugated oligomer according to one embodiment described herein relative to a cyclic voltammogram of polyfluorene.

The electrochemical properties and HOMO and LUMO energy levels of PF and PF-BT-QL were investigated using cyclic voltammetry (CV). The measurements were performed in a solution of n-$Bu_4NPF_6$ (0.1 M), polymer (20 mg) [PF], [PF-BT-QL] and dried $CH_2Cl_2$ at a scan rate of 50 mV/s at room temperature under the protection of argon. A glassy carbon electrode, a platinum electrode and an Ag/$Ag^+$ electrode were used as the working electrode, the counter electrode and the quasi-reference electrode respectively. As shown in FIG. 5, PF and PF-BT-QL exhibit quasi-irreversible oxidation processes. The $E_{HOMO}$ was calculated according to an empirical equation as follows:

$$E_{HOMO} = -(4.44 + E_{onset})(eV)$$

and the $E_{gap}$ was estimated from absorption onset of the polymers, thus, $E_{LUMO}$ was calculated using the equation, $$E_{LUMO} = E_{HOMO} + E_{gap}$$

The onset oxidation potential ($E_{onset}$), $E_{HOMO}$, band gap energy ($E_{gap}$), and $E_{LUMO}$ are summarized in Table IV. The oxidation process at about 1.21 V corresponds to the removal of electrons from the fluorene core thereby generating radical dications. $E_{HOMO}$ decreased and $E_{LUMO}$ increased for PF-BT-QL, which indicated more difficulty in hole or electron (charge) injection.

TABLE IV

Polymer Electrochemical Properties

| Polymer | $E_{onset}$ (V) | $E_{HOMO}$ (eV) | $E_{gap}$ (eV) | $E_{LUMO}$ (eV) |
|---|---|---|---|---|
| PF-BT-QL | 1.26 | 5.70 | 2.50 | 3.20 |
| PF | 1.20 | 5.64 | 2.95 | 2.69 |

Example 2

Light Emitting Devices

A light emitting device comprising a light emitting layer comprising the PF-BT-QL conjugated oligomer of Example 1 was fabricated. The overall construction of the light emitting device was ITO/PEDOT:PSS/PF-BT-QL/LiF/Al.

Indium tin oxide (ITO)-coated glass was ultrasonically cleaned sequentially for 15 min in 2% sonicating solution, water, acetone, and 2-propanol. The ITO had a thickness of about 150 nm. A hole-transporting PEDOT:PSS layer of 40 nm was spin-coated onto the ITO anode. PF-BT-QL oligomer solution was then spin-coated onto the PEDOT:PSS layer at a thickness of 80 nm. The PF-BT-QL polymer solution for spin-coating was prepared by dissolving the oligomer (5 wt %) in tetrahydrofuran. LiF (0.5 nm) and aluminum (150 nm) contacts were formed by vacuum deposition at pressures below $10^{-6}$ Torr. The active section of the light emitting device was subsequently covered with an epoxy resin and allowed to dry so that the active regions were shielded from oxygen exposure during device testing. The light emitting device was tested using photospectrometer to a Keithley 238 and Minolta LS-100 as the luminance detector.

A light emitting device comprising the PF conjugated polymer of Example 1 was also constructed according to the foregoing procedure for comparison purposes.

Figure 6:
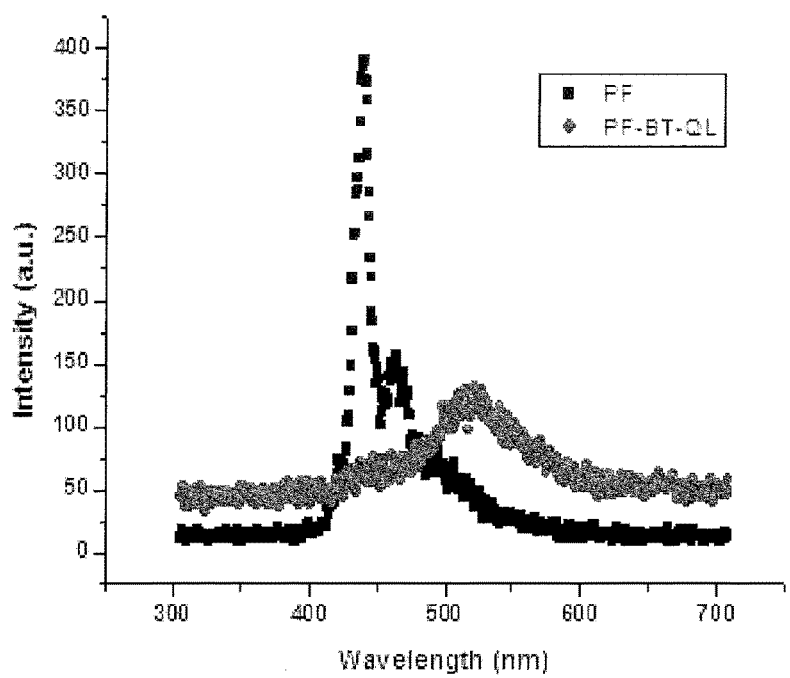
FIG. 6 illustrates an electroluminescent emission spectrum of a light emitting device comprising a conjugated oligomer according to one embodiment described herein in comparison with an electroluminescent emission spectrum of a light emitting device comprising polyfluorene.

FIG. 6 shows EL spectra of the PF-BT-QL and PF light emitting devices. The EL spectrum of PF device exhibited blue peaks at 440 nm and extra peaks at about 465 nm. This indicated a radiative decay process of singlet excitons in PF molecules providing the 440 nm emission.

The EL spectrum of PF-BT-QL was similar to its photoluminescent (PL) spectrum, which indicated that the same energy transfer was involved in EL and PL. The EL intensity of PF was higher than that of PF-BT-QL at the same applied voltage. The lower luminance in PF-BT-QL was probably due to the efficient energy transfer from PF to quinoline and benzothiadiazole unit.

Figure 7:
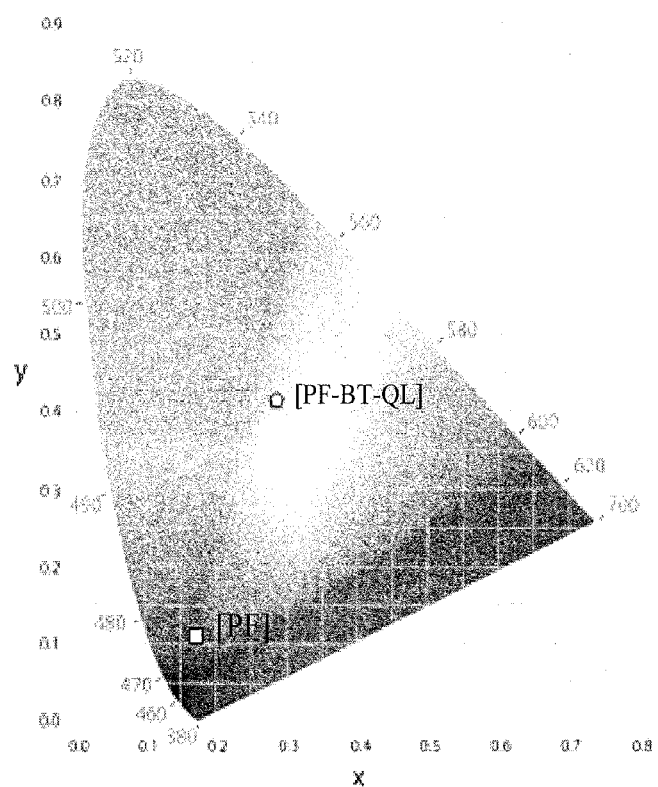
FIG. 7 illustrates the coordinates of light emission from electroluminescent devices on the 1931 CIE Chromaticity Diagram according to one embodiment described herein.

The performance parameters of the light emitting devices are provided in Table V. Moreover, the CIE coordinates of devices and their respective emission colors are illustrated in FIG. 7. By changing the molar ratios of the repeating units as described herein, the electroluminescence spectra can be adjusted to white-light emission.

TABLE V

Light Emitting Device Performance Characteristics

| Device | EL Emission Wavelength | CIE of EL Emission (x, y) | Turn on Voltage (V) |
|---|---|---|---|
| PF | 440, 465 | 0.17, 0.11 | 10 |
| PF-BT-QL | 517 | 0.28, 0.44 | 5 |

Figure 8:
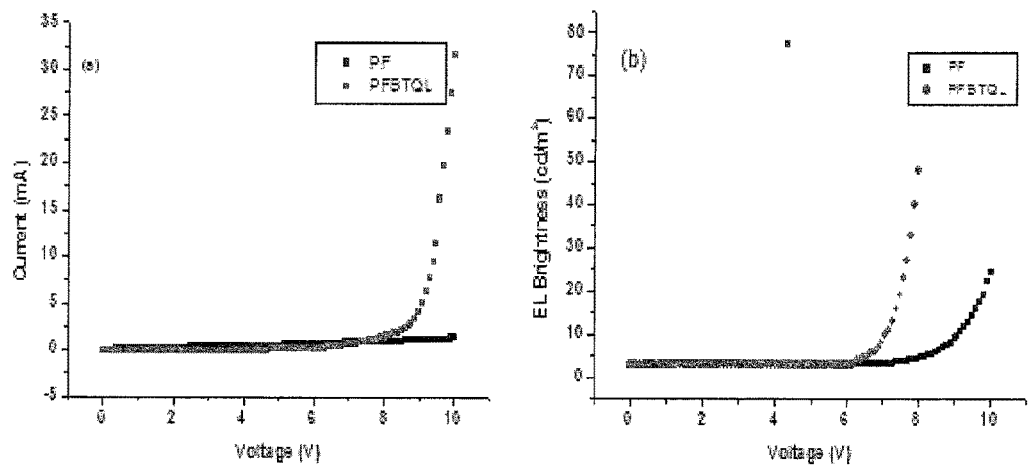
FIG. 8 illustrates current-voltage (I-V) and luminance-voltage (L-V) characteristics of a light emitting device comprising a conjugated oligomer according to one embodiment described herein in comparison with the I-V and L-V characteristics of a light emitting device comprising polyfluorene.

Current-voltage (I-V) and luminance-voltage (L-V) curves for the PF-BT-QL and PF light emitting devices are provided in FIG. 8. These are indicative of the rates at which the current and brightness are increasing. FIGS. 8(a) and 8(b), both current and electroluminescence versus voltage data exhibited readily observable increases in the slopes of PF-BT-QL from PF. A higher slope indicates either efficient charge injection, higher charge mobility, or a combination of both. The threshold voltage of PF-BT-QL was lower than that of PF.

Example 3

Conjugated Polymers of Formula (IV) and Light Emitting Devices Comprising the Same Conjugated oligomers of Formula (IV):

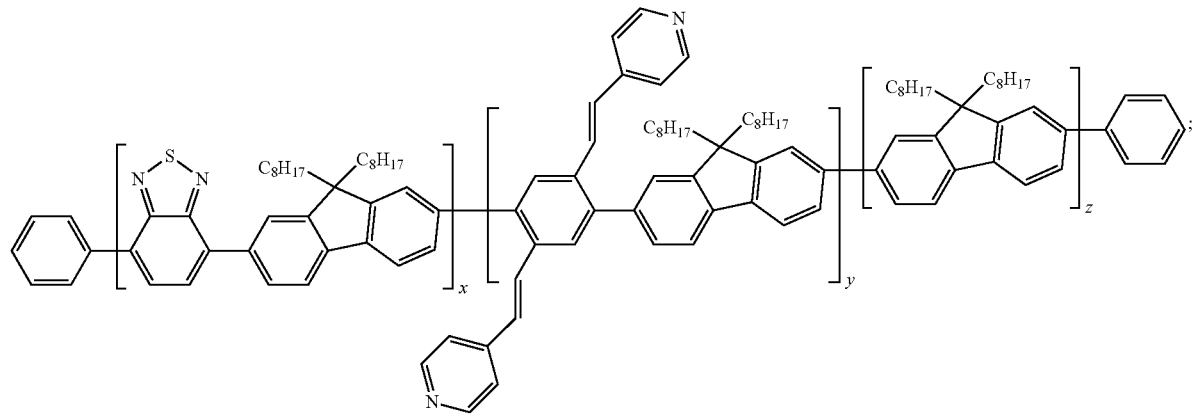

[PF-BT-PD]

and

-continued

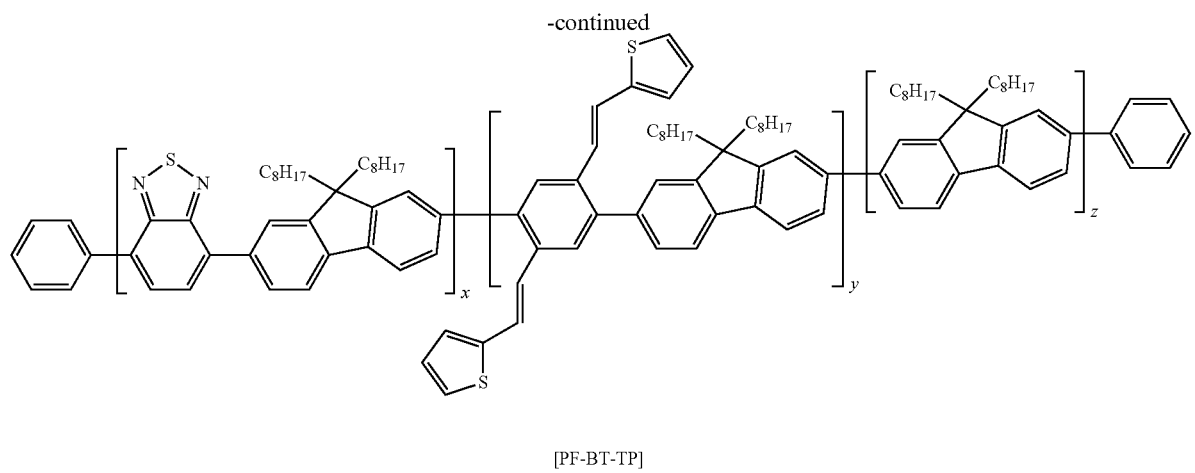

[PF-BT-TP]

were synthesized according to the scheme provided in Example 1 above. The weight average molecular weight ($M_w$) and number average molecular weight ($M_n$) of the oligomers were determined by gel permeation chromatography (GPC) and are summarized in Table VI.

TABLE VI

Conjugated Polymer Properties

| Polymer | $M_w$ | $M_n$ | Polydispersity (PDI) |
| --- | --- | --- | --- |
| PF-BT-PD | 3300 | 2200 | 1.5 |
| PF-BT-TP | 1900 | 1600 | 1.2 |

Figure 9:
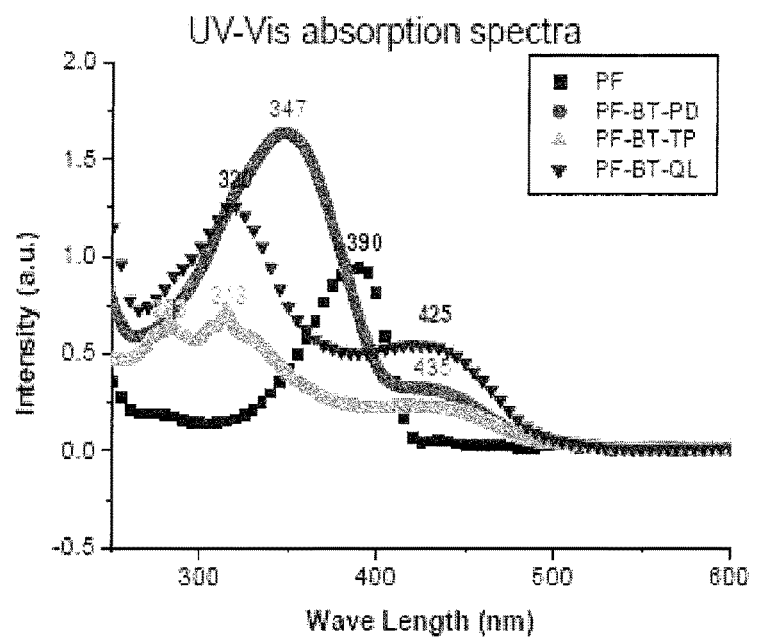
FIG. 9 illustrates absorbance and emission spectra of conjugated oligomers according to one embodiment described herein relative to polyfluorene.
Figure 9:
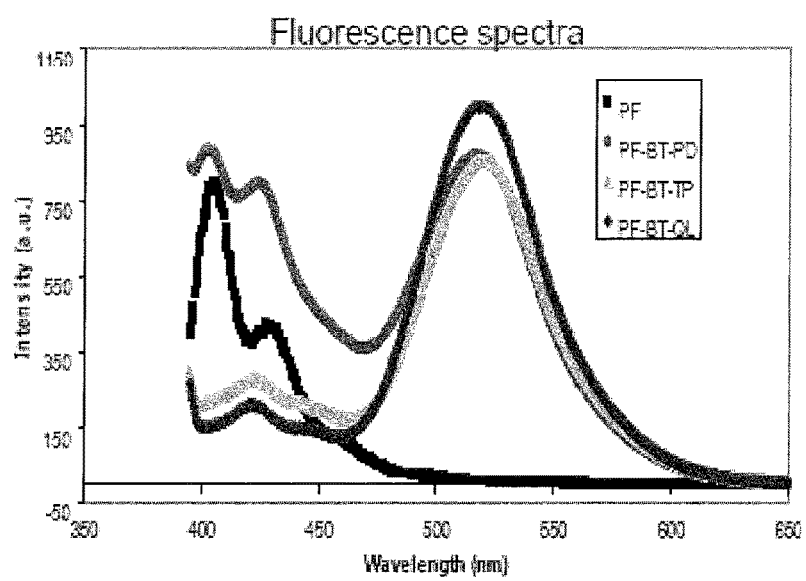

The absorption and emission spectra of PF-BT-PD and PF-BT-TP in comparison to PF and PF-BT-QL of Example 1 are illustrated in FIG. 9. As illustrated in FIG. 9, the absorption/emission spectra of PF-BT-PD and PF-BT-TP are similar to the absorption/emission spectrum of PF-BT-QL.

Figure 10:
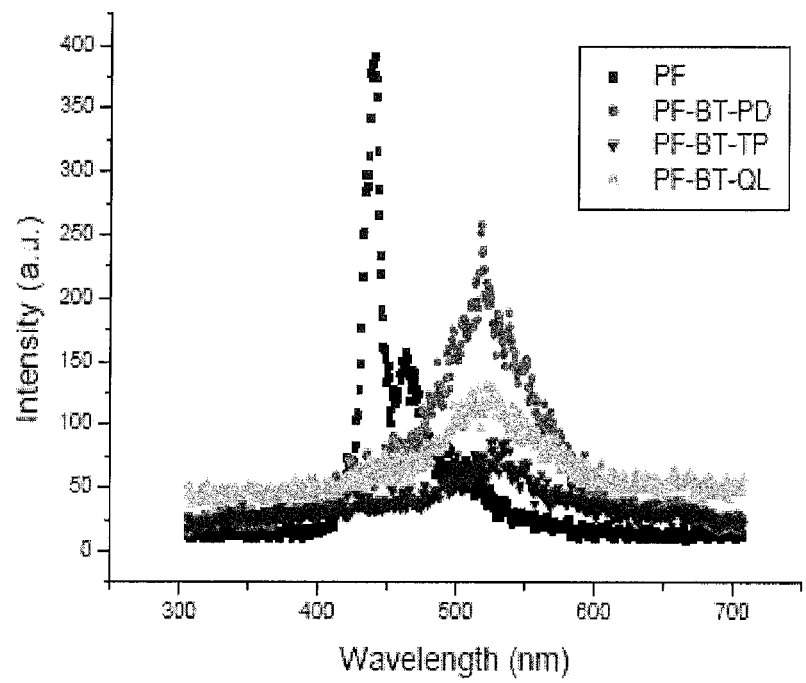
FIG. 10 illustrates electroluminescent emission spectra of light emitting devices comprising conjugated oligomers according to one embodiment described herein in comparison with an electroluminescent spectrum of a light emitting device comprising polyfluorene.

Moreover, light emitting devices comprising PF-BT-PD and PF-BT-TP respectively were constructed in accordance with the light emitting device of Example 2, FIG. 10 illustrates the electroluminescence emission spectra of the light emitting device comprising PF-BT-PD and the light emitting device comprising PF-BT-TP in comparison to the light emitting devices of Example 2 comprising PF-BT-QL and PF. As illustrated in FIG. 10, the EL spectra of PF-BT-PD and PF-BT-TP are similar to the EL spectrum of PF-BT-QL.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A white light emitting device comprising:
(i) a radiation transmissive first electrode;
(ii) a second electrode;
(iii) a light emitting layer disposed between the first electrode and the second electrode, the light emitting layer comprising a conjugated polymer or oligomer capable of white light emission and comprising repeating units A, B and C:

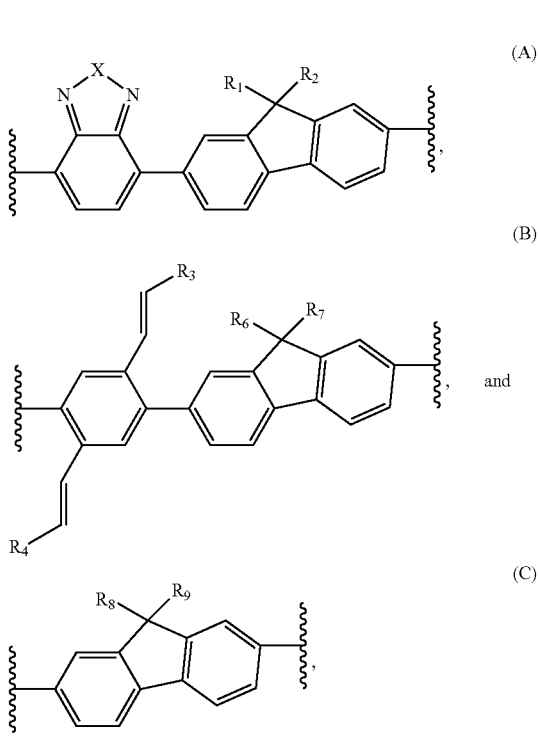

wherein ⁞ represents points of attachment in the polymer chain or oligomer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof, wherein the alkyl and alkenyl of $R_1$, $R_2$, $R_5$, $R_6$, $R_7$, $R_8$ and $R_9$ and aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl; and (iv) a dielectric layer disposed between the light emitting layer and the first electrode and/or the second electrode.

2. The light emitting device of claim 1, wherein $R_3$ and $R_4$ are independently selected from the group consisting of pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

3. The light emitting device of claim 1, wherein $R_3$ and $R_4$ are independently selected from the group consisting of

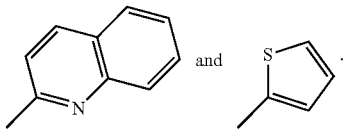

4. The light emitting device of claim 1, wherein the polymer or oligomer of the light emitting layer is of Formula (IV):

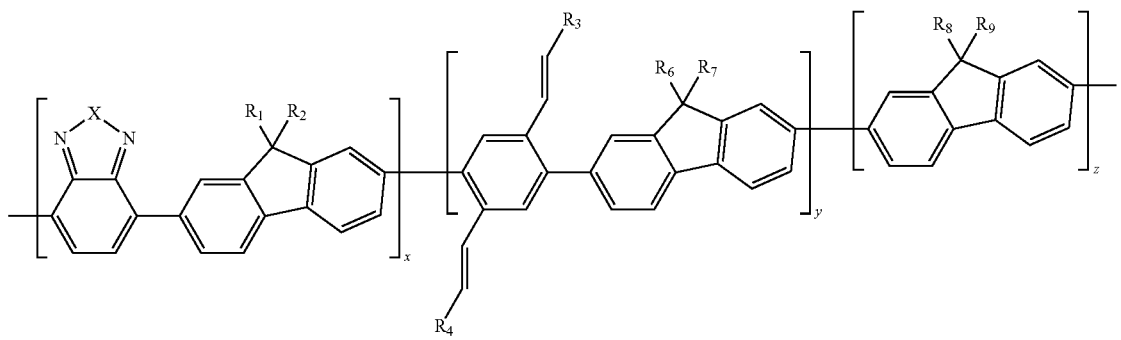

wherein x, y, and z are integers independently ranging from 1 to 10,000.

5. The light emitting device of claim 4, wherein the conjugated polymer or oligomer of the light emitting layer is an alternating copolymer, statistical copolymer or a random copolymer.

6. The light emitting device of claim 4, wherein the conjugated polymer or oligomer of Formula (IV) has a weight average molecular weight ($M_w$) ranging from about 1,000 to about 1,000,000.

7. The light emitting device of claim 4, wherein the conjugated polymer or oligomer of Formula (IV) is:

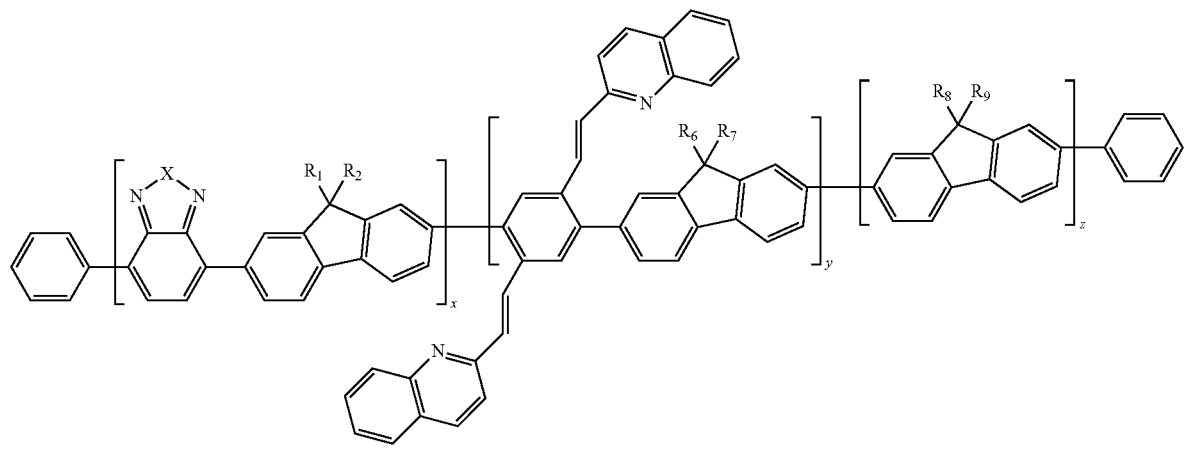

wherein x, y, and z are integers independently ranging from 1 to 10,000.

8. The light emitting device of claim 7, wherein X is S.

9. The light emitting device of claim 8, wherein $R_1$, $R_2$, $R_6$, $R_7$, $R_8$, and $R_9$ are each —$C_8H_{17}$.

10. The light emitting device of claim 4, wherein the conjugated polymer or oligomer of Formula (IV) is:

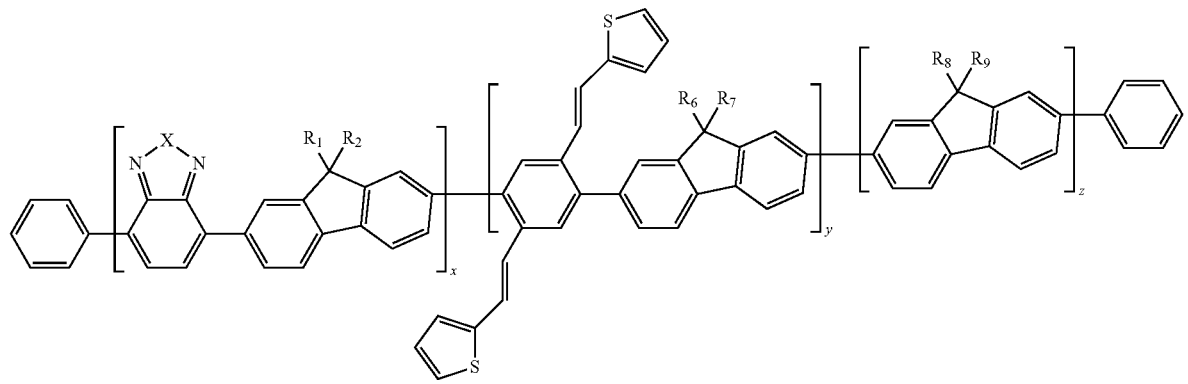

wherein x, y, and z are integers independently ranging from 1 to 10,000.

11. The light emitting device of claim 10, wherein X is S.

12. The light emitting device of claim 11, wherein $R_1$, $R_2$, $R_6$, $R_7$, $R_8$, and $R_9$ are each —$C_8H_{17}$.

13. The light emitting device of claim 1, wherein the dielectric layer is disposed between the light emitting layer and the second electrode.

14. The light emitting device of claim 1, wherein the dielectric layer is disposed between the light emitting layer and the first electrode.

15. The light emitting device of claim 1, wherein the dielectric layer comprises one or more inorganic oxides.

16. The light emitting device of claim 15, wherein the inorganic oxide is silica or alumina.

17. The light emitting device of claim 1, wherein the dielectric layer comprises one or more polymeric materials.

18. The light emitting device of claim 17, wherein the one or more polymeric materials comprise fluorinated polymers or polyacrylates.

19. The light emitting device of claim 17, wherein the one or more polymeric materials comprise polyethylenes, polypropylenes, polystyrenes, poly(vinylchloride), polycarbonates, polyamides, polyimides, or copolymers and combinations thereof.

20. The light emitting device of claim 17, wherein the device has an electroluminescent emission having coordinates in the white light region of the 1931 CIE Chromaticity Diagram.

21. The light emitting device of claim 1 further comprising a hole transport layer disposed between the first electrode and the light emitting layer.

22. The light emitting device of claim 1 further comprising a nanoparticle phase disposed in the conjugated polymer or oligomer of the light emitting layer.

23. The light emitting device of claim 22, wherein the nanoparticle phase comprises carbon nanoparticles.

24. The light emitting device of claim 23, wherein the carbon nanoparticles comprise single-walled carbon nanotubes, multi-walled carbon nanotubes or mixtures thereof.

25. The light emitting device of claim 24, wherein the carbon nanotubes are doped with boron or nitrogen or combinations thereof.

26. The light emitting device of claim 22, wherein the nanoparticle phase is present in the light emitting layer in an amount ranging from about 0.1 weight percent to about 2 weight percent.

* * * * *

UNITED STATES PATENT AND TRADEMARK OFFICE
CERTIFICATE OF CORRECTION

PATENT NO. : 9,728,725 B2  
APPLICATION NO. : 13/809874  
DATED : August 8, 2017  
INVENTOR(S) : David L. Carroll Page 1 of 1

It is certified that error appears in the above-identified patent and that said Letters Patent is hereby corrected as shown below:

On the Title Page

At Item (54) and in the Specification, Column 1, Lines 1-4 in the title, please delete "LIGHT EMITTING DEVICE COMPRISING CONJUGATED TERPOLYMER/TEROLIGOMER CAPABLE OF WHITE LIGHT EMITTION", and insert --CONJUGATED POLYMERIC SYSTEMS AND APPLICATIONS THEREOF--.

Signed and Sealed this  
Tenth Day of October, 2017

Joseph Matal  
*Performing the Functions and Duties of the*  
*Under Secretary of Commerce for Intellectual Property and*  
*Director of the United States Patent and Trademark Office*